United States Patent
Johnson et al.

(10) Patent No.: US 11,837,694 B2
(45) Date of Patent: *Dec. 5, 2023

(54) LITHIUM-BASED BATTERY PACK

(71) Applicant: MILWAUKEE ELECTRIC TOOL CORPORATION, Brookfield, WI (US)

(72) Inventors: Todd W. Johnson, Wauwatosa, WI (US); Dennis J. Grzybowski, New Berlin, WI (US); Mark A. Kubale, West Bend, WI (US); Jay J. Rosenbecker, Menomonee Falls, WI (US); Gary D. Meyer, Waukesha, WI (US); Jeffrey M. Zeiler, Pewaukee, WI (US); Kevin L. Glasgow, Lomira, WI (US); Karl F. Scheucher, Waite Hill, OH (US)

(73) Assignee: Milwaukee Electric Tool Corporation, Brookfield, WI (US)

( * ) Notice: Subject to any disclaimer, the term of this patent is extended or adjusted under 35 U.S.C. 154(b) by 25 days.

This patent is subject to a terminal disclaimer.

(21) Appl. No.: 17/246,921

(22) Filed: May 3, 2021

(65) Prior Publication Data

US 2021/0265676 A1    Aug. 26, 2021

Related U.S. Application Data

(63) Continuation of application No. 16/588,686, filed on Sep. 30, 2019, now Pat. No. 10,998,586, which is a
(Continued)

(51) Int. Cl.
*H01M 10/48* (2006.01)
*H01M 10/0525* (2010.01)
(Continued)

(52) U.S. Cl.
CPC .......... *H01M 10/0525* (2013.01); *B25F 5/00* (2013.01); *H01M 4/505* (2013.01); *H01M 4/525* (2013.01);
(Continued)

(58) Field of Classification Search
CPC .................................................. H01M 10/482
(Continued)

(56) References Cited

U.S. PATENT DOCUMENTS 4,893,067 A    1/1990    Bhagwat et al.
4,973,896 A    11/1990   Shiga et al.
(Continued)

FOREIGN PATENT DOCUMENTS

CA    2231260    6/1999
DE    3637669    5/1988
(Continued)

OTHER PUBLICATIONS

"Hubble Servicing Calls for Dazzling Array of Crew Aids and Tools," Spaceport News, Feb. 14, 1997, p. 1-8.
(Continued)

*Primary Examiner* — Yalkew Fantu
(74) *Attorney, Agent, or Firm* — Michael Best & Friedrich LLP

(57) ABSTRACT

An electrical combination including a power tool and a battery pack. The power tool includes power tool terminals. The battery pack is configured to be interfaced with the power tool. The battery pack includes a battery pack housing, at least three terminals, and a plurality of battery cells. The battery pack terminals include a positive terminal, a negative terminal, and a sense terminal. The at least three terminals are configured to be interfaced with the power tool terminals. The plurality of battery cells are arranged within and supported by the battery pack housing. Each of the
(Continued)

battery cells has a lithium-based chemistry and a respective state of charge, and power is transferable between the battery cells and the power tool. A circuit is configured to monitor the battery cells, detect a charge imbalance among the battery cells, and prevent the battery pack from operating when the charge imbalance is detected.

18 Claims, 71 Drawing Sheets

Related U.S. Application Data continuation of application No. 16/200,171, filed on Nov. 26, 2018, now Pat. No. 10,431,857, which is a continuation of application No. 15/785,396, filed on Oct. 16, 2017, now Pat. No. 10,141,614, which is a continuation of application No. 15/181,108, filed on Jun. 13, 2016, now Pat. No. 9,793,583, which is a continuation of application No. 14/726,140, filed on May 29, 2015, now Pat. No. 9,368,842, which is a continuation of application No. 13/943,237, filed on Jul. 16, 2013, now Pat. No. 9,048,515, which is a continuation of application No. 13/443,694, filed on Apr. 10, 2012, now Pat. No. 8,487,585, which is a continuation of application No. 12/766,965, filed on Apr. 26, 2010, now Pat. No. 8,154,249, which is a continuation of application No. 11/165,615, filed on Jun. 22, 2005, now Pat. No. 7,714,538, which is a continuation-in-part of application No. 11/139,020, filed on May 24, 2005, now Pat. No. 7,425,816, and a continuation-in-part of application No. 11/138,070, filed on May 24, 2005, now Pat. No. 7,589,500, and a continuation-in-part of application No. 10/721,800, filed on Nov. 24, 2003, now Pat. No. 7,253,585, and a continuation-in-part of application No. 10/719,680, filed on Nov. 20, 2003, now Pat. No. 7,176,654, and a continuation-in-part of application No. 10/720,027, filed on Nov. 20, 2003, now Pat. No. 7,157,882.

(60) Provisional application No. 60/643,396, filed on Jan. 12, 2005, provisional application No. 60/626,230, filed on Nov. 9, 2004, provisional application No. 60/626,013, filed on Nov. 5, 2004, provisional application No. 60/612,352, filed on Sep. 22, 2004, provisional application No. 60/582,728, filed on Jun. 24, 2004, provisional application No. 60/582,730, filed on Jun. 24, 2004, provisional application No. 60/582,138, filed on Jun. 22, 2004, provisional application No. 60/574,616, filed on May 25, 2004, provisional application No. 60/574,278, filed on May 24, 2004, provisional application No. 60/523,712, filed on Nov. 19, 2003, provisional application No. 60/523,716, filed on Nov. 19, 2003, provisional application No. 60/440,692, filed on Jan. 17, 2003, provisional application No. 60/440,693, filed on Jan. 17, 2003, provisional application No. 60/428,450, filed on Nov. 22, 2002, provisional application No. 60/428,452, filed on Nov. 22, 2002, provisional application No. 60/428,358, filed on Nov. 22, 2002, provisional application No. 60/428,356, filed on Nov. 22, 2002.

(51) Int. Cl.

| | | |
|---|---|---|
| *B25F 5/00* | (2006.01) | |
| *H01M 4/505* | (2010.01) | |
| *H01M 10/052* | (2010.01) | |
| *H01M 10/42* | (2006.01) | |
| *H01M 10/44* | (2006.01) | |
| *H01M 10/46* | (2006.01) | |
| *H02J 7/00* | (2006.01) | |
| *H01M 50/213* | (2021.01) | |
| *H01M 50/296* | (2021.01) | |
| *H01M 50/247* | (2021.01) | |
| *H01M 4/525* | (2010.01) | |
| *G01R 31/382* | (2019.01) | |
| *H01M 50/262* | (2021.01) | |

(52) U.S. Cl.
CPC ....... *H01M 10/052* (2013.01); *H01M 10/425* (2013.01); *H01M 10/4207* (2013.01); *H01M 10/441* (2013.01); *H01M 10/46* (2013.01); *H01M 10/482* (2013.01); *H01M 50/213* (2021.01); *H01M 50/247* (2021.01); *H01M 50/296* (2021.01); *H02J 7/00* (2013.01); *H02J 7/005* (2020.01); *H02J 7/0016* (2013.01); *H02J 7/0025* (2020.01); *H02J 7/0031* (2013.01); *H02J 7/0045* (2013.01); *H02J 7/0048* (2020.01); *H02J 7/0063* (2013.01); *H02J 7/0071* (2020.01); *H05K 999/99* (2013.01); *G01R 31/382* (2019.01); *H01M 50/262* (2021.01); *H01M 2010/4271* (2013.01); *H01M 2200/00* (2013.01); *H01M 2220/30* (2013.01); *Y02E 60/10* (2013.01); *Y10T 408/65* (2015.01)

(58) Field of Classification Search
USPC .......................................... 320/114
See application file for complete search history.

(56) References Cited

U.S. PATENT DOCUMENTS

| | | |
|---|---|---|
| 5,179,337 A | 1/1993 | Staarman et al. |
| 5,213,913 A | 1/1993 | Anthony, III et al. |
| 5,206,097 A | 4/1993 | Burns et al. |
| 5,225,762 A | 7/1993 | Langford |
| 5,268,630 A | 12/1993 | Bhagwat et al. |
| 5,280,229 A | 1/1994 | Faude et al. |
| 5,350,993 A | 9/1994 | Toya et al. |
| 5,355,073 A | 10/1994 | Nguyen |
| 5,371,453 A | 12/1994 | Fernandez |
| 5,510,690 A | 4/1996 | Tanaka et al. |
| 5,546,317 A | 8/1996 | Andrieu |
| 5,547,775 A | 8/1996 | Eguchi et al. |
| 5,567,542 A | 10/1996 | Bae |
| 5,598,085 A | 1/1997 | Hasler |
| 5,606,242 A | 2/1997 | Hull et al. |
| 5,635,813 A | 6/1997 | Shiga et al. |
| 5,684,387 A | 11/1997 | Patino |
| 5,691,620 A | 11/1997 | Nagai et al. |
| 5,691,623 A | 11/1997 | Tsantilis |
| 5,710,504 A | 1/1998 | Pascual et al. |
| 5,744,937 A | 4/1998 | Cheon |
| 5,757,163 A | 5/1998 | Brotto et al. |
| 5,789,900 A | 8/1998 | Hasegawa et al. |
| 5,818,201 A | 10/1998 | Stockstad et al. |
| 5,835,351 A | 11/1998 | Ulanski et al. |
| 5,844,401 A | 12/1998 | Lee |
| 5,872,444 A | 2/1999 | Nagano et al. |
| 5,894,212 A | 4/1999 | Balogh |
| 5,986,430 A | 11/1999 | Fernandez et al. |
| 5,998,966 A | 12/1999 | Gaza |
| 5,998,967 A | 12/1999 | Umeki et al. |
| 6,002,237 A | 12/1999 | Gaza |
| 6,040,683 A | 3/2000 | Mottier |
| 6,040,684 A | 3/2000 | Mitchell |
| 6,046,757 A | 4/2000 | Kanai |
| 6,084,523 A | 7/2000 | Gelnovatch et al. |

(56) References Cited

U.S. PATENT DOCUMENTS

| | | | |
|---|---|---|---|
| 6,124,698 A | 9/2000 | Sakakibara | |
| 6,132,902 A | 10/2000 | Miyasaka | |
| 6,170,579 B1 | 1/2001 | Wadge | |
| 6,175,211 B1 | 1/2001 | Brotto | |
| 6,204,640 B1 | 3/2001 | Sakakibara | |
| 6,222,343 B1 | 4/2001 | Crisp et al. | |
| 6,228,529 B1 | 5/2001 | Kitoh | |
| 6,229,280 B1 | 5/2001 | Sakoh et al. | |
| 6,268,710 B1* | 7/2001 | Koga | G01R 31/396 320/162 |
| 6,275,004 B1 | 8/2001 | Tamai et al. | |
| 6,296,065 B1 | 10/2001 | Carrier | |
| 6,304,058 B2 | 10/2001 | Watson et al. | |
| 6,313,611 B1 | 11/2001 | Mowry et al. | |
| 6,326,768 B2 | 12/2001 | Nagai et al. | |
| 6,329,788 B1* | 12/2001 | Bailey, Jr. | H02J 7/0045 307/43 |
| 6,337,557 B1 | 1/2002 | Kates et al. | |
| 6,362,600 B2 | 3/2002 | Sakakibara | |
| 6,388,426 B1 | 5/2002 | Yokoo et al. | |
| 6,406,815 B1 | 6/2002 | Sandberg et al. | |
| 6,413,673 B1 | 7/2002 | Kasai et al. | |
| 6,433,510 B1 | 8/2002 | Ribellino et al. | |
| 6,452,362 B1 | 9/2002 | Choo | |
| 6,456,035 B1 | 9/2002 | Crisp et al. | |
| 6,458,488 B1 | 10/2002 | Honbo et al. | |
| 6,489,060 B1 | 12/2002 | Zhang et al. | |
| 6,508,313 B1 | 1/2003 | Carney et al. | |
| 6,509,114 B1 | 1/2003 | Nakai et al. | |
| 6,563,290 B2 | 5/2003 | Sakakibara et al. | |
| 6,621,246 B2 | 9/2003 | Kubale et al. | |
| 6,878,490 B2 | 4/2005 | Gao et al. | |
| 6,924,620 B2 | 8/2005 | Santana, Jr. | |
| 6,948,078 B2 | 9/2005 | Odaohhara | |
| 7,157,882 B2 | 1/2007 | Johnson et al. | |
| 7,176,654 B2 | 2/2007 | Meyer et al. | |
| 7,249,862 B2 | 7/2007 | Shirane | |
| 7,253,585 B2 | 8/2007 | Johnson et al. | |
| 7,273,159 B2 | 9/2007 | Brotto | |
| 7,521,892 B2 | 4/2009 | Funabashi et al. | |
| 7,554,290 B2 | 6/2009 | Johnson et al. | |
| 7,714,538 B2 | 5/2010 | Johnson et al. | |
| 7,944,173 B2 | 5/2011 | Johnson et al. | |
| 7,999,510 B2 | 8/2011 | Johnson et al. | |
| 8,154,249 B2* | 4/2012 | Johnson | H01M 50/572 173/214 |
| 8,269,459 B2 | 9/2012 | Johnson et al. | |
| 8,450,971 B2 | 5/2013 | Johnson et al. | |
| 9,018,903 B2 | 4/2015 | Johnson et al. | |
| 9,048,515 B2 | 6/2015 | Johnson et al. | |
| 9,379,569 B2 | 6/2016 | Johnson et al. | |
| 10,431,857 B2* | 10/2019 | Johnson | H05K 999/99 |
| 10,998,586 B2* | 5/2021 | Johnson | H01M 4/525 |
| 2002/0074973 A1 | 6/2002 | Brotto | |
| 2002/0079867 A1 | 6/2002 | Sakakibara et al. | |
| 2002/0125860 A1 | 9/2002 | Schworm et al. | |
| 2002/0149346 A1 | 10/2002 | Sakakibara | |
| 2002/0157516 A1 | 10/2002 | Judge | |
| 2002/0168568 A1 | 11/2002 | Yamaki et al. | |
| 2003/0096158 A1 | 5/2003 | Takano et al. | |
| 2003/0121682 A1 | 7/2003 | Carrancho | |
| 2003/0134189 A1 | 7/2003 | Kanai et al. | |
| 2004/0005265 A1 | 1/2004 | Chiang et al. | |
| 2004/0257038 A1 | 12/2004 | Johnson et al. | |
| 2005/0127873 A1 | 6/2005 | Yamamoto et al. | |
| 2005/0170250 A1 | 8/2005 | Ohzuku et al. | |
| 2005/0233219 A1 | 10/2005 | Gozdz et al. | |
| 2006/0071643 A1 | 4/2006 | Carrier et al. | |
| 2006/0096771 A1 | 5/2006 | Brotto | |
| 2008/0150481 A1 | 6/2008 | Glauning et al. | |
| 2011/0114350 A1 | 5/2011 | Johnson et al. | |
| 2015/0288038 A1 | 10/2015 | Johnson et al. | |
| 2015/0318733 A1 | 11/2015 | Stock | |

FOREIGN PATENT DOCUMENTS

| | | |
|---|---|---|
| DE | 19617805 | 11/1996 |
| DE | 68927774 | 6/1997 |
| DE | 19705192 | 10/1997 |
| DE | 19835183 | 1/2002 |
| DE | 10153083 | 5/2003 |
| EP | 265144 | 4/1988 |
| EP | 419806 | 4/1991 |
| EP | 621990 | 11/1994 |
| EP | 669692 | 2/1995 |
| EP | 561423 | 2/1997 |
| EP | 767524 | 4/1997 |
| EP | 1039612 | 9/2000 |
| EP | 1076370 | 2/2001 |
| EP | 1017149 | 4/2001 |
| EP | 1191616 | 3/2002 |
| EP | 1217710 | 6/2002 |
| EP | 1266725 | 12/2002 |
| EP | 1363340 | 11/2003 |
| EP | 1049187 | 4/2004 |
| GB | 2289581 | 11/1995 |
| GB | 2293060 | 3/1996 |
| GB | 2336955 | 11/1999 |
| GB | 2354891 | 4/2001 |
| GB | 2354892 | 4/2001 |
| GB | 2396755 | 6/2004 |
| JP | 64006372 | 1/1989 |
| JP | 5161277 | 6/1993 |
| JP | 7023532 | 1/1995 |
| JP | 8196042 | 7/1996 |
| JP | 09074689 | 3/1997 |
| JP | 10112301 | 4/1998 |
| JP | 10304593 | 11/1998 |
| JP | 11126585 | 5/1999 |
| JP | 11283677 | 10/1999 |
| JP | 2000049684 | 2/2000 |
| JP | 2000067825 | 3/2000 |
| JP | 2000082451 | 3/2000 |
| JP | 2000102185 | 4/2000 |
| JP | 2000121446 | 4/2000 |
| JP | 2000270488 | 9/2000 |
| JP | 2001112182 | 4/2001 |
| JP | 2001146425 | 5/2001 |
| JP | 2001218376 | 8/2001 |
| JP | 2002008732 | 1/2002 |
| JP | 2002110254 | 4/2002 |
| JP | 2002141112 | 5/2002 |
| JP | 20022560619 | 9/2002 |
| JP | 2002313294 | 10/2002 |
| JP | 2002315193 | 10/2002 |
| JP | 2002369400 | 12/2002 |
| JP | 2003174720 | 6/2003 |
| JP | 2003189405 | 7/2003 |
| JP | 2003197190 | 7/2003 |
| JP | 2003217687 | 7/2003 |
| JP | 2003317721 | 11/2003 |
| JP | 2003324858 | 11/2003 |
| RO | 116233 | 11/2000 |
| WO | WO9621954 | 7/1996 |
| WO | WO9963613 | 12/1999 |
| WO | WO0049699 | 8/2000 |
| WO | WO0103231 | 1/2001 |
| WO | WO2002003484 | 1/2002 |

OTHER PUBLICATIONS

Craftsman Lithium Revolution Brochure. No Date.

Felder, Jason, "Bosch Introduces Li-Ion 36V Battery Pack," ThomasNet Industrial NewsRoom, at http://news.thomasnet.com/fullstory/801246, Oct. 24, 2006.

Juzkow, Marc, "Development of a BB-2590/U rechargeable lithium-ion battery," Journal of Power Sources, vol. 80 (1999), p. 286-92, Elsevier Science S.A., 1999.

Kim, Heesook P., et al., "Development of High Power Lithium/Thionyl Chloride Reserve Battery," Proceedings of the Electrochemical Society, vol. 97-18, p. 504-11, 1997.

(56) References Cited

OTHER PUBLICATIONS

Richards, Paul W., et al., "A Computer Controlled Power Tool for the Servicing of the Hubble Space Telescope," May 15, 1996, 30th Aerospace Mechanisms Symposium, p. 325-328.
Sack, Thomas T., J. Croydon Tice, and Ran Reynolds, "Segmented Battery Charger for High Energy 28V Lithium Ion Battery," IEEE AESS Systems Magazine, vol. 16, Sep. 2001, p. 15-18, IEEE, 2001.
Smart, M.C., et al., "Lithium-Ion Cell Technology Demonstration for Future NASA Applications," 37th Intersociety Energy Conversion Engineering Conference, Smart-IECEC Paper 2002-20134, p. 297-304, IEEE, 2002.
Smart, M.C., et al., "Performance Characteristics of Yardney Lithium-Ion Cells for the Mars 2001 Lander Application," AIAA-2000-2914, vol. 1, p. 629-37, Society of Automotive Engineers, Inc., 2000.
Stassen, I., and G. Hambitzer, "Metallic lithium batteries for high power applications," Journal of Power Sources, vol. 105 (2002), p. 145-50, Elsevier Science B.V., 2002.
Tailor, Devin, "Pistol Grip Tool Technician Manual," Sep. 1997, p. 42-46.
ThomasNet Industrial NewsRoom, "DeWalt Launches Nano Technology Driving Lines of Cordless Tools," Feb. 9, 2007, at http://news.thomasnet.com/companystory/508841.
High Power Lithium Ion APR18650M1, 123Systems, Inc., Watertown, MA, 2006 (1 page).
Hironaka et al., "Manganese-based lithium-ion batteries for electric vehicles," Hitachi Research Laboratory, Hitachi, Ltd., Shin-Kobe Technical Report No. 10, Feb. 2000 (Translation—23 pages).
Kohler et al., High performance nickel-metal hydride and lithium-ion batteries, Journal of Power Sources, 2002, pp. 139-144, vol. 105.
McGraw-Hill Handbooks, "Basic Concepts," Handbook of Batteries, Third Edition, 2001, Chapter 1, 16 pages.
McGraw-Hill Handbooks, "Factors Affecting Battery Performance," Handbook of Batteries, Third Edition, 2001, Chapter 3, 24 pages.
McGraw-Hill Handbooks, "Lithium-Ion Batteries," Handbook of Batteries, Third Edition, 2001, Chapter 35, 94 pages.
PowerStream Technology, "High Current Rechargeable Lithium Batteries," retrieved Jun. 22, 2010, at http://web.archive.org/web/20020812023423/http://www.powerstream.com/LL.h-tm.

* cited by examiner

FIG. 28A
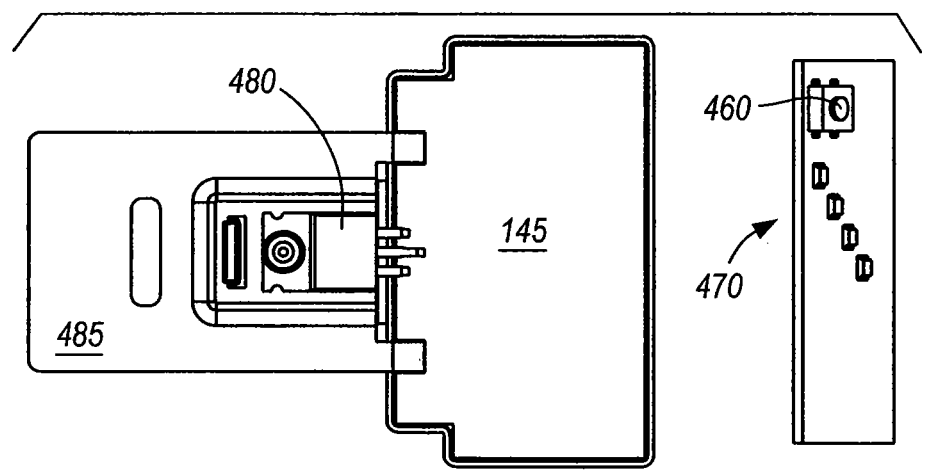
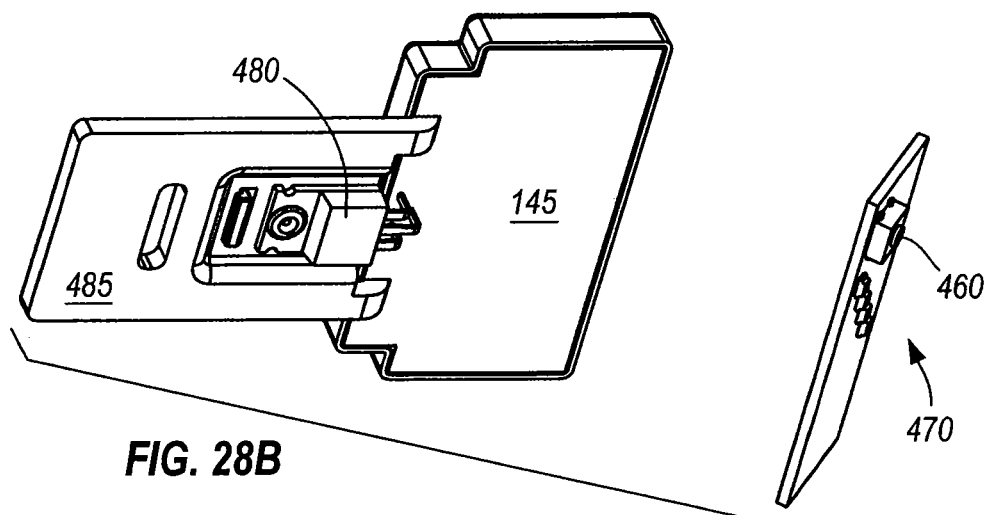
FIG. 28B

LITHIUM-BASED BATTERY PACK

RELATED APPLICATIONS

This application is a continuation of U.S. patent application Ser. No. 16/588,686, filed Sep. 30, 2019, which is a continuation of U.S. patent application Ser. No. 16/200,171, filed Nov. 26, 2018, now U.S. Pat. No. 10,431,857, which is a continuation of U.S. patent application Ser. No. 15/785, 396, filed Oct. 16, 2017, now U.S. Pat. No. 10,141,614, which is a continuation of U.S. patent application Ser. No. 15/181,108, filed Jun. 13, 2016, now U.S. Pat. No. 9,793, 583, which is a continuation of U.S. patent application Ser. No. 14/726,140, filed May 29, 2015, now U.S. Pat. No. 9,368,842, which is a continuation of U.S. patent application Ser. No. 13/943,237, filed Jul. 16, 2013, now U.S. Pat. No. 9,048,515, which is a continuation of U.S. patent application Ser. No. 13/443,694, filed Apr. 10, 2012, now U.S. Pat. No. 8,487,585, which is a continuation of U.S. patent application Ser. No. 12/766,965, filed on Apr. 26, 2010, now U.S. Pat. No. 8,154,249, which is a continuation of U.S. patent application Ser. No. 11/165,615, filed on Jun. 22, 2005, now U.S. Pat. No. 7,714,538, the entire contents of all of which are hereby incorporated by reference.

This application also claims the benefits, through U.S. patent application Ser. No. 11/165,615, filed on Jun. 22, 2005, now U.S. Pat. No. 7,714,538, of prior filed U.S. Provisional Patent Application No. 60/582,138, filed on Jun. 22, 2004; Application No. 60/582,728, filed on Jun. 24, 2004; Application No. 60/582,730, filed on Jun. 24, 2004; Application No. 60/612,352, filed on Sep. 22, 2004; Application No. 60/626,013, filed on Nov. 5, 2004; Application No. 60/626,230, filed on Nov. 9, 2004 and Application No. 60/643,396, filed on Jan. 12, 2005, the entire contents of all of which are hereby incorporated by reference.

This application also claims the benefits, through U.S. patent application Ser. No. 11/165,615, filed on Jun. 22, 2005, now U.S. Pat. No. 7,714,538, of prior filed U.S. patent application Ser. No. 10/720,027, filed on Nov. 20, 2003, now U.S. Pat. No. 7,157,882, which claims the benefits of prior filed U.S. Provisional Patent Application No. 60/428,358, filed on Nov. 22, 2002; Application No. 60/428,450, filed on Nov. 22, 2002; Application No. 60/428,452, filed on Nov. 22, 2002; Application No. 60/440,692, filed on Jan. 17, 2003; Application No. 60/440,693, filed on Jan. 17, 2003; Application No. 60/523,716, filed on Nov. 19, 2003; and Application No. 60/523,712, filed on Nov. 19, 2003, the entire contents of all of which are hereby incorporated by reference.

This application also claims the benefits, through U.S. patent application Ser. No. 11/165,615, filed on Jun. 22, 2005, now U.S. Pat. No. 7,714,538, of prior filed U.S. patent application Ser. No. 10/719,680, filed on Nov. 20, 2003, now U.S. Pat. No. 7,176,654, which claims the benefits of prior filed U.S. Provisional Patent Application No. 60/428,358, filed on Nov. 22, 2002; Application No. 60/428,450, filed on Nov. 22, 2002; Application No. 60/428,452, filed on Nov. 22, 2002; Application No. 60/440,692, filed on Jan. 17, 2003; Application No. 60/440,693, filed on Jan. 17, 2003; Application No. 60/523,716, filed on Nov. 19, 2003; and Application No. 60/523,712, filed on Nov. 19, 2003, the entire contents of all of which are hereby incorporated by reference.

This application also claims the benefits, through U.S. patent application Ser. No. 11/165,615, filed on Jun. 22, 2005, now U.S. Pat. No. 7,714,538, of prior filed U.S. patent application Ser. No. 10/721,800, filed on Nov. 24, 2003, now U.S. Pat. No. 7,253,585, which claims the benefits of prior filed U.S. Provisional Patent Application No. 60/428,356, filed on Nov. 22, 2002; Application No. 60/428,358, filed on Nov. 22, 2002; Application No. 60/428,450, filed on Nov. 22, 2002; Application No. 60/428,452, filed on Nov. 22, 2002; Application No. 60/440,692, filed on Jan. 17, 2003; Application No. 60/440,693, filed on Jan. 17, 2003; Application No. 60/523,712, filed on Nov. 19, 2003; and Application No. 60/523,716, filed on Nov. 19, 2003, the entire contents of all of which are hereby incorporated by reference.

This application also claims the benefits, through U.S. patent application Ser. No. 11/165,615, filed on Jun. 22, 2005, now U.S. Pat. No. 7,714,538, of prior filed U.S. patent application Ser. No. 11/138,070, filed on May 24, 2005, now U.S. Pat. No. 7,589,500, which claims the benefits of prior filed U.S. Provisional Patent Application No. 60/574,278, filed on May 24, 2004; Application No. 60/574,616, filed on May 25, 2004; Application No. 60/582,138, filed on Jun. 22, 2004; Application No. 60/582,728, filed on Jun. 24, 2004; Application No. 60/582,730, filed on Jun. 24, 2004; Application No. 60/612,352, filed on Sep. 22, 2004; Application No. 60/626,013, filed on Nov. 5, 2004; Application No. 60/626,230, filed on Nov. 9, 2004 and Application No. 60/643,396, filed on Jan. 12, 2005, and prior filed U.S. patent application Ser. No. 10/720,027, filed on Nov. 20, 2003 (which claims the benefits of prior filed U.S. Provisional Patent Application No. 60/428,358, filed on Nov. 22, 2002; Application No. 60/428,450, filed on Nov. 22, 2002; Application No. 60/428,452, filed on Nov. 22, 2002; Application No. 60/440,692, filed on Jan. 17, 2003; Application No. 60/440,693, filed on Jan. 17, 2003; Application No. 60/523,716, filed on Nov. 19, 2003; and Application No. 60/523,712, filed on Nov. 19, 2003); application Ser. No. 10/719,680, filed on Nov. 20, 2003 (which claims the benefits of prior filed U.S. Provisional Patent Application No. 60/428,358, filed on Nov. 22, 2002; Application No. 60/428,450, filed on Nov. 22, 2002; Application No. 60/428, 452, filed on Nov. 22, 2002; Application No. 60/440,692, filed on Jan. 17, 2003; Application No. 60/440,693, filed on Jan. 17, 2003; Application No. 60/523,716, filed on Nov. 19, 2003; and Application No. 60/523,712, filed on Nov. 19, 2003); and application Ser. No. 10/721,800, filed on Nov. 24, 2003 (which claims the benefits of prior filed U.S. Provisional Patent Application No. 60/428,356, filed on Nov. 22, 2002; Application No. 60/428,358, filed on Nov. 22, 2002; Application No. 60/428,450, filed on Nov. 22, 2002; Application No. 60/428,452, filed on Nov. 22, 2002; Application No. 60/440,692, filed on Jan. 17, 2003; Application No. 60/440,693, filed on Jan. 17, 2003; Application No. 60/523,712, filed on Nov. 19, 2003; and Application No. 60/523,716, filed on Nov. 19, 2003), the entire contents of all of which are hereby incorporated by reference.

This application also claims the benefits, through U.S. patent application Ser. No. 11/165,615, filed on Jun. 22, 2005, now U.S. Pat. No. 7,714,538, of prior filed U.S. patent application Ser. No. 11/139,020, filed on May 24, 2005, now U.S. Pat. No. 7,425,816, which claims the benefits of prior filed U.S. Provisional Patent Application No. 60/574,278, filed on May 24, 2004; Application No. 60/574,616, filed on May 25, 2004; Application No. 60/582,138, filed on Jun. 22, 2004; Application No. 60/582,728, filed on Jun. 24, 2004; Application No. 60/582,730, filed on Jun. 24, 2004; Application No. 60/612,352, filed on Sep. 22, 2004; Application No. 60/626,013, filed on Nov. 5, 2004; Application No. 60/626,230, filed on Nov. 9, 2004 and Application No. 60/643,396, filed on Jan. 12, 2005, and prior filed U.S.

patent application Ser. No. 10/720,027, filed on Nov. 20, 2003 (which claims the benefits of prior filed U.S. Provisional Patent Application No. 60/428,358, filed on Nov. 22, 2002; Application No. 60/428,450, filed on Nov. 22, 2002; Application No. 60/428,452, filed on Nov. 22, 2002; Application No. 60/440,692, filed on Jan. 17, 2003; Application No. 60/440,693, filed on Jan. 17, 2003; Application No. 60/523,716, filed on Nov. 19, 2003; and Application No. 60/523,712, filed on Nov. 19, 2003); application Ser. No. 10/719,680, filed on Nov. 20, 2003 (which claims the benefits of prior filed U.S. Provisional Patent Application No. 60/428,358, filed on Nov. 22, 2002; Application No. 60/428,450, filed on Nov. 22, 2002; Application No. 60/428,452, filed on Nov. 22, 2002; Application No. 60/440,692, filed on Jan. 17, 2003; Application No. 60/440,693, filed on Jan. 17, 2003; Application No. 60/523,716, filed on Nov. 19, 2003; and Application No. 60/523,712, filed on Nov. 19, 2003); and application Ser. No. 10/721,800, filed on Nov. 24, 2003 (which claims the benefits of prior filed U.S. Provisional Patent Application No. 60/428,356, filed on Nov. 22, 2002; Application No. 60/428,358, filed on Nov. 22, 2002; Application No. 60/428,450, filed on Nov. 22, 2002; Application No. 60/428,452, filed on Nov. 22, 2002; Application No. 60/440,692, filed on Jan. 17, 2003; Application No. 60/440,693, filed on Jan. 17, 2003; Application No. 60/523,712, filed on Nov. 19, 2003; and Application No. 60/523,716, filed on Nov. 19, 2003), the entire contents of all of which are hereby incorporated by reference.

FIELD OF THE INVENTION

The present invention generally relates to battery packs and, more particularly, to power tool battery packs.

BACKGROUND OF THE INVENTION

Typically, electrical equipment, such as, for example, a cordless power tool, is powered by a rechargeable battery. The battery may be periodically charged in a compatible battery charger.

SUMMARY OF THE INVENTION

FIGS. 36-38 illustrate an existing battery pack 230. The existing battery pack 230 includes a housing 242 and at least one rechargeable battery cell 246 (shown in FIGS. 39-40) supported by the housing 242. In the illustrated construction, the existing battery pack 230 is an 18V battery pack including (see FIGS. 39-40) fifteen approximately 1.2V battery cells 246 connected in series. The battery cells 246 are a rechargeable battery cell chemistry type, such as, for example, NiCd or NiMH.

As shown in FIGS. 39-40, in the existing battery pack 230, each battery cell 246 is generally cylindrical and extends along a cell axis 250 parallel to the cylindrical outer cell wall. In the existing battery pack 230, the cell axes 250 are parallel to one another. Also, in the existing battery pack 230, each battery cell 246 has a cell length 252 which is about two times the cell diameter 254. In the illustrated construction, each battery cell 246 has a length of about forty-six millimeters (46 mm) and a diameter of about twenty-three millimeters (23 mm).

The existing battery pack 230 is connectable to (see FIG. 12) a battery charger 38, and the battery charger 38 is operable to charge the existing battery pack 230. The existing battery pack 230 is connectable to electrical equipment, such as, for example, a power tool 34 (shown in FIG. 11A), to power the power tool 34. As shown in FIGS. 36-38, the housing 242 provides a support portion 250 for supporting the existing battery pack 230 on an electrical device. In the illustrated construction, the support portion 250 provides (see FIG. 36) a C-shaped cross section which is connectable to a complementary T-shaped cross section support portion on the electrical device (the support portion on the power tool 34 (shown in FIG. 11B) and/or the battery support portion on the battery charger 38 (shown in FIG. 12).

The existing battery pack 230 includes (see FIGS. 36-37 and 39-40) a terminal assembly 286 operable to electrically connect battery cells 246 to a circuit in the electrical device. The terminal assembly 286 includes a positive battery terminal 298, a ground terminal 302, and a sense terminal 306. As illustrated in FIGS. 39-40, the terminals 298 and 302 are connected to the opposite ends of the cell or series of cells 246. The sense terminal 306 is connected to (see FIG. 40) an electrical component 314 which is connected in the circuit of the existing battery pack 230. In the illustrated construction, the electrical component 314 is a temperature-sensing device or thermistor to communicate the temperature of the existing battery pack 230 and/or of the battery cells 246.

The present invention provides a battery pack which substantially alleviates one or more independent problems with the above-described and other existing battery packs. In some aspects and in some constructions, the present invention provides a battery pack including two cells which are positioned in non-parallel relation to each other. In some aspects, the two cells are positioned in normal relation to each other.

More particularly, in some aspects and in some constructions, the present invention provides a battery pack including a housing, a first cell extending along a first cell axis, and a second cell extending along a second cell axis, the first cell and the second cell being supported by the housing in an orientation in which the first cell axis is non-parallel to the second cell axis. In some aspects and in some constructions, the first cell axis is normal to the second cell axis.

Also, in some aspects and in some constructions, the present invention provides a method of assembling a battery pack, the method including the acts of providing a battery pack housing, supporting a first cell with the housing, and supporting a second cell with the housing in non-parallel relation to the first cell. In some aspects, the act of supporting the second cell includes supporting the second cell in normal relation to the first cell.

In addition, in some aspects and in some constructions, the present invention provides a battery pack including a plurality of cells, a sensor for sensing the voltage of a first group of the plurality of cells, a sensor for sensing the voltage of a second group of the plurality of cells, and a controller for comparing the voltage of the first group to the voltage of the second group to determine if one of the plurality of cells is at or below a voltage.

Further, in some aspects and in some constructions, the present invention provides a method of determining a voltage of a cell of a battery pack, the battery pack including a plurality of cells, the method including the acts of sensing the voltage of a first group of the plurality of cells, sensing the voltage of a second group of the plurality of cells, and comparing the voltage of the first group to the voltage of the second group to determine if one of the plurality of cells is at or below a voltage.

Also, in some aspects and in some constructions, the present invention provides a battery pack including a housing, a cell supported by the housing, a FET connected to the cell, and a heat sink in heat-transfer relationship with the FET.

In addition, in some aspects and in some constructions, the present invention provides a method of assembling a battery pack, the method including the acts of providing a housing, supporting a cell with the housing, supporting a FET with the housing, connecting the FET to the cell, and supporting a heat sink in heat-transfer relationship with the FET.

Further, in some aspects and in some constructions, the present invention provides a battery including a housing supportable by an electrical device, a cell supported by the housing and connectable to the electrical device and a locking assembly for locking the battery to the electrical device. The locking assembly includes a locking member supported by the housing for movement between a locked position, in which the battery is locked to the electrical device, and an unlocked position, an actuator supported by the housing and operable to move the locking member between the locked position and the unlocked position and a biasing member operable to bias the locking member to the locked position, the biasing member being fixed between the actuator and the housing and retaining the actuator in a position relative to the housing.

Independent features and independent advantages of the invention will become apparent to those skilled in the art upon review of the detailed description and drawings.

BRIEF DESCRIPTION OF THE DRAWINGS

FIGS. 28A-28E include views of portions of the battery pack shown in FIG. 26.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items.

DETAILED DESCRIPTION

Figure 11A:
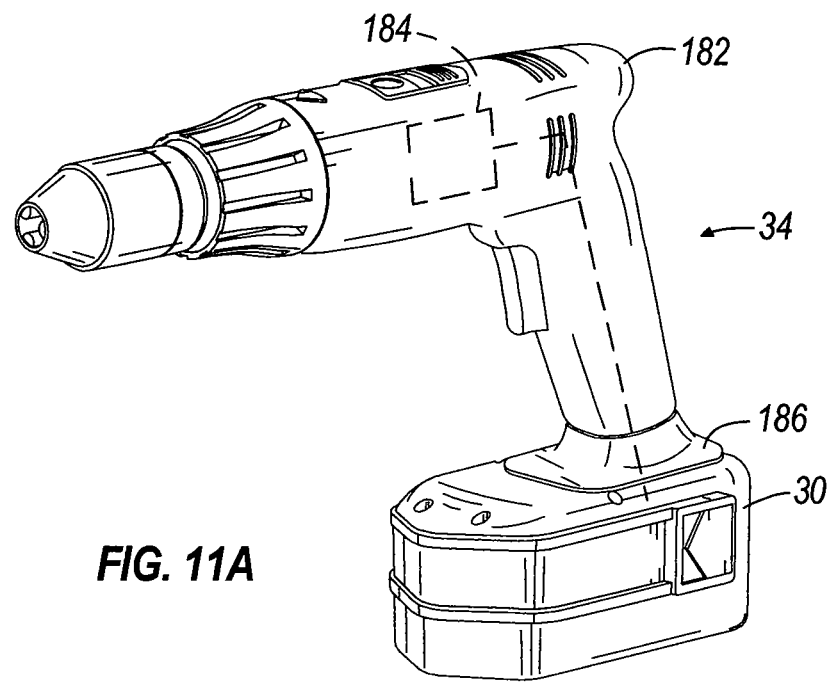
FIG. 11A is a perspective view of an electrical device, such as a power tool, for use with the battery pack shown in FIG. 1.

A battery pack 30 embodying aspects of the invention is illustrated in FIGS. 1-9. The battery pack 30 can be connectable to electrical equipment, such as, for example, a cordless power tool 34 (shown in FIG. 11A) to selectively power the power tool 34. The battery pack 30 can be removable from the power tool 34 and can be rechargeable by a battery charger 38 (shown in FIG. 8).

As shown in FIGS. 1-9, the battery pack 30 includes a housing 42 and at least one rechargeable battery cell 46 (shown in FIGS. 13-19) supported by the housing 42. In the illustrated construction, the battery pack 30 can be a 21V battery pack including five approximately 4.2V battery cells 46a, 46b, 46c, 46d and 46e connected in series. In another construction, the battery pack 30 can be a 28V battery pack including seven approximately 4.2V battery cells 46. In other constructions, the battery pack 30 includes at least six battery cells 46 to have a nominal voltage of approximately 28V. In further constructions (not shown), the battery pack 30 may have another nominal battery voltage, such as, for example, 9.6V, 12V, 14.4V, 24V, 28V, 40V, etc., to power the electrical equipment and be charged by the battery charger 38.

In some constructions, the battery pack 30 may include five to ten battery cells 46. In other constructions, the battery pack 30 may include six to eight battery cells 46. In further constructions, the battery pack 20 may include two to ten battery cells 46. In some constructions, the battery cells 46 can have a nominal voltage of approximately 3.6V. In other embodiments, the battery cells 46 can have a nominal voltage of approximately 4.2V. In further constructions, the battery cells 46 can have another nominal voltage, such as, for example, approximately 3.6V, approximately 4.0 V, and approximately 4.3 V. It should be understood that, in other constructions (not shown), the battery cells 46 may have a different nominal cell voltage and/or may be connected in another configuration, such as, for example, in parallel or in a parallel/series combination.

The battery cells 46 may be any rechargeable battery cell chemistry type, such as, for example, nickel cadmium (NiCd), nickel-metal hydride (NiMH), Lithium (Li), Lithium-ion (Li-ion), other Lithium-based chemistry, other rechargeable battery cell chemistry, etc. In the illustrated construction, the battery cells 46 can be lithium-ion (Li-ion) battery cells. For example, the battery cells 46 can have a chemistry of Lithium-Cobalt (Li—Co), Lithium-Manganese (Li—Mn) Spinel, Li—Mn Nickel, another lithium metal chemistry, or the like.

Figure 70:
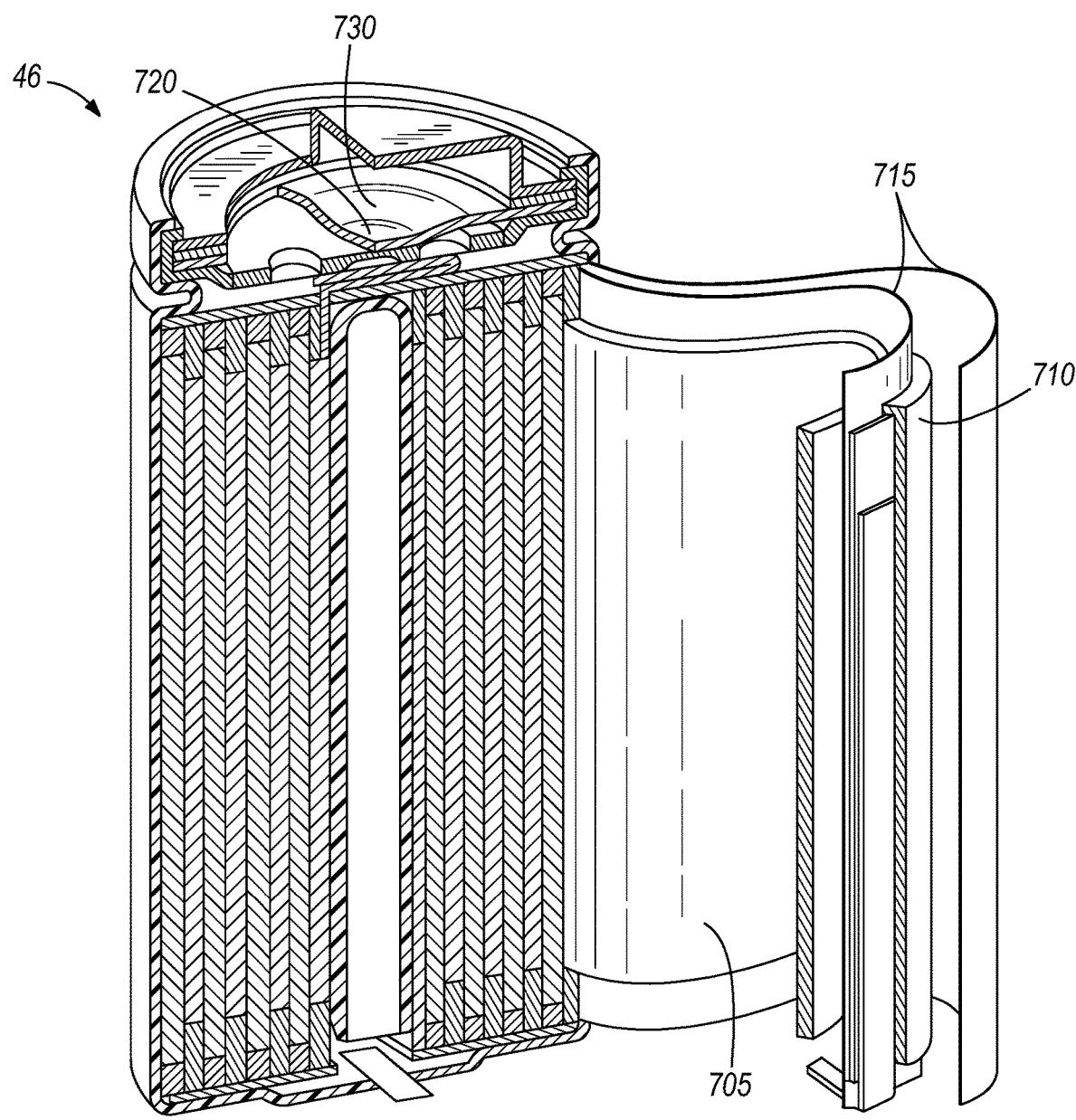
FIG. 70 is a partial cross-section of a battery cell.

In some constructions and in some aspects, such as the construction shown in FIG. 70, the battery cells 46 can have a Li-ion based chemistry, such as, for example, Li—Mn Spinel or Li—Co. As shown in FIG. 70, the battery cell 46 includes cathode material 705 and anode material 710. The cathode material 705 and anode material 710 are separated by a separator 715. In one construction, the cathode material 705 includes Li—Mn Spinel, the anode material 710 includes lithium graphite and the separator 715 includes polyethylene polypropylene laminate. In this construction, the Li—Mn Spinel battery cell 46 is typically more stable than a Li—Co battery cell, which can allow for a larger cell size. A battery cell 46 of this construction can operate at high current discharge rates and does not build large internal resistance during cycle life.

In some constructions, such as the illustrated construction of FIG. 70, the cell 46 includes one or more safety mechanisms. For example, in one construction, the separator 715 can include a plastic porous separator material that melts between approximately 120° C. and approximately 150° C. When the separator 715 begins to melt, the pores close. This causes the cell 46 to be disabled.

Also, the cell 46 can include a disconnect device 720, in some constructions. In these constructions, the disconnect device 720 is pressure activated. If the cell 46 is overcharged, a voltage triggered polymer (not shown) within the cell 46 creates gas and pressure. With enough pressure, the disconnect device 720 will permanently open the electrical connection to the outside, which disables the cell 46.

Also in some constructions, the cell 46 can include a rupture vent 730. In the instance of large internal pressure buildup (under thermal or mechanical abuse situations), the vent 730 can safely release the gas pressure, such that the cell 46 does not explode.

In one construction of the Li-ion battery cell 46, the working temperature range for the Li-ion battery cells 46 is approximately −20° C. to +75° C. As compared to battery cells of other chemistries, the Li-ion battery cells 46 have a wider working temperature range. For example, battery cells of NiCd construction do not deliver power as well as Li-ion cells 46 at higher temperatures, and battery cells of NiMH construction do not deliver power as well as Li-ion cells 46 at lower temperatures. Also, Li-ion battery cells 46 can be lightweight and compact without sacrificing performance due to high energy densities. Gravimetric energy density for Li-ion battery cells 46 is approximately 150 Wh/kg, which can be compared to existing NiCd battery cells. In some constructions, the gravimetric energy density for Li-ion battery cells 46 is approximately 2.5 times as high as existing NiCd battery cells. Volumetric energy density for Li-ion battery cells 46 is approximately 390 Wh/L, which can also be compared to existing NiCd battery cells. In some constructions, the volumetric energy density for Li-ion battery cells 46 is approximately 2.0 times as high as existing NiCd battery cells.

In some constructions and in some aspects, battery cells 46 having a Li-ion based chemistry, such as Li—Co or Li—Mn Spinel, can have higher operating voltages, lower self discharge and also eliminate the use of environmentally hard elements in the construction of the cells 46, when compared to existing Nickel based cells, such as NiCd and NiMEI. In one construction, a Li-ion battery cell has a nominal voltage of approximately 4.0V versus NiCd and NiMEI cells having a nominal voltage of approximately 1.2V.

Also, in this construction, a typical self discharge rate for a Li-ion battery cell 46 is approximately 2% to approximately 5% per month, whereas a typical self discharge rate for a NiCd battery cell is approximately 15% to approximately 20%.

Further, in this construction, the Li-ion battery cells 46 help to eliminate the environmentally hazardous heavy metals, such as lead, nickel, and cadmium, which are present in other battery types. The inclusion of these environmentally hazardous metals in other battery types requires special recycling methods. In the illustrated constructions, the Li-ion battery cells 46 do not contain environmentally hazardous materials. Rather, in these constructions, the Li-ion cells 46 include graphite powder, Li—Mn spinel, carbonate solvents, lithium hexafluorophosphate, copper, aluminum and polyvinylidene fluoride ("PVDF"). The cells 46 also include steel, nickel, and an inert material for the can. In these constructions, a Li-ion battery cell 46 does not require any special recycling.

Figure 71:
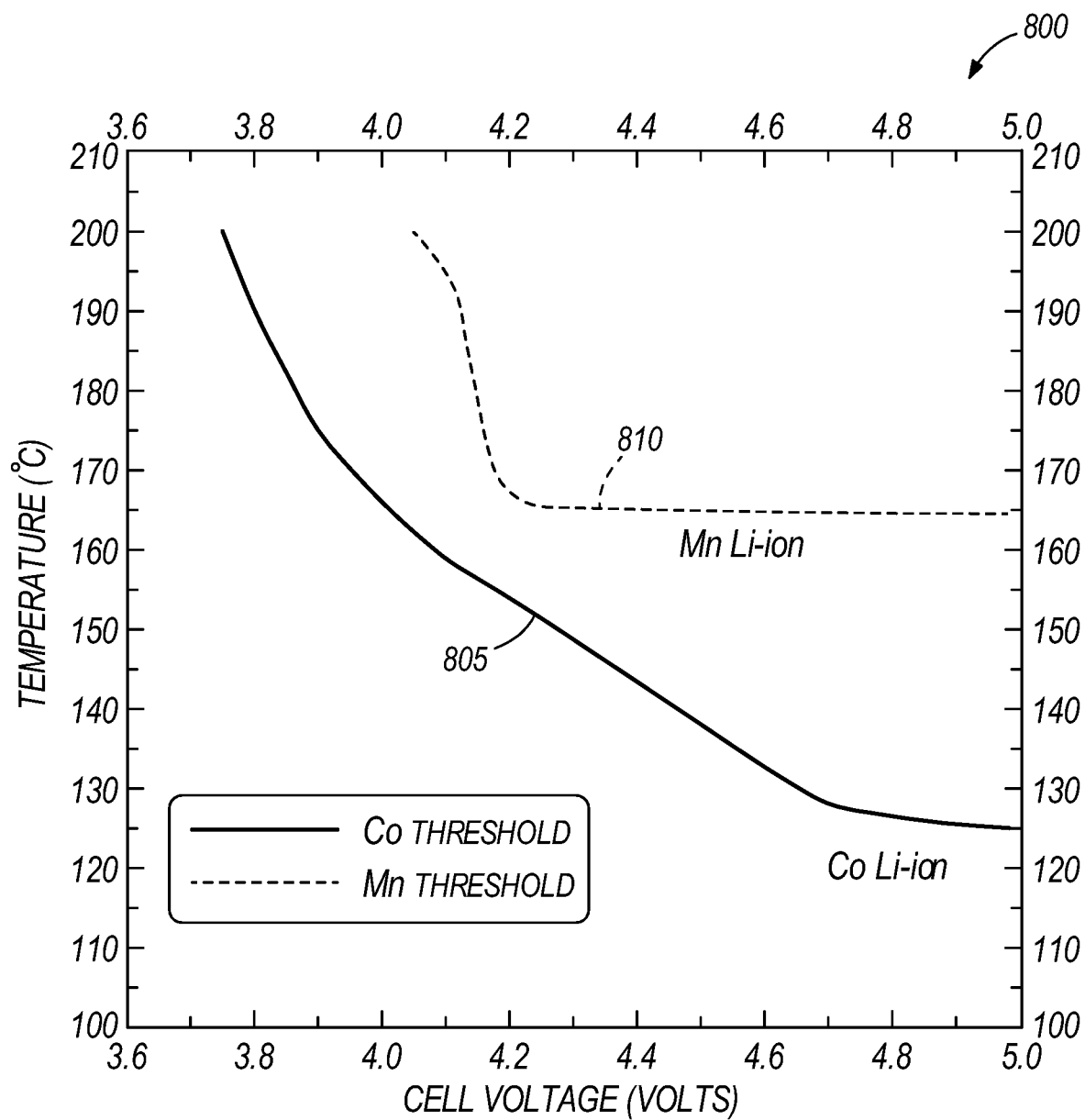
FIG. 71 is a graph illustrating charging thresholds of Li-based battery packs.

In some constructions, the battery cells 46 can have a chemistry of Li—Co. In these constructions, the battery cells 46 can be monitored in order to protect the battery cells 46 from being overdischarged or overcharged, both of which can damage the cells 46 and affect the stability of the cells 46. In some constructions, Li—Co cells 46 may require tighter control during charging and discharging operation than Li—Mn Spinel cells. For example, in some constructions, the Li—Co cells 46 are monitored more closely during charging to prevent overcharging. In these constructions, overcharging of a Li—Co cell 46 may cause lithium metal to plate on the anode of the cell 46, may cause lithium metal to become a powerful reducing agent during plating, may cause the cathode material to become unstable and a strong oxidizing agent, and may cause excessive heating. Also, lithium metal and the destabilization of the cathode material can make the Li—Co cell 46 more sensitive to thermal runaway. The graph 800 shown in FIG. 71 helps illustrate the tighter control needed for charging Li—Co cells compared to Li—Mn cells. The curve 805 illustrates the charging threshold for Li—Co cells based on cell voltage and temperature. The curve 810 illustrates the charging threshold for Li—Mn cells based on cell voltage and temperature. Any point falling above the respective thresholds 805 and 810 represents thermal runaway. Cells having a Li—Mn based chemistry can have an increased voltage capacity and still maintain a high temperature tolerance during charging. Cells having a Li—Co based chemistry should be charged at a lower temperature threshold if the cells increase voltage capacity.

Similarly, for battery cells 46 having a chemistry of Li—Mn, the cells 46 can also be monitored in order to protect the battery cells 46 from being overdischarged or overcharged. Examples of systems and methods to monitor battery cells are described in more detail in U.S. patent application Ser. No. 10/720,027, filed Nov. 20, 2003 and Ser. No. 11/138,070, filed on May 24, 2005, the contents of all of which are hereby incorporated by reference.

As shown in FIGS. 13-20, in the battery pack 30, each battery cell 46a-46e can be generally cylindrical and can extend along a cell axis 50a-50e parallel to the cylindrical outer cell wall. Also, in the battery pack 30, each battery cell 46 can have a cell length 52 which is more than two times and almost three times the cell diameter 54. In the illustrated construction and in some aspects, each battery cell 46 can have a diameter of about twenty-six millimeters (26 mm) and a length of at least about sixty millimeters (60 mm). In some constructions, each battery cell 46 can have a length of about sixty-five millimeters (65 mm). In some constructions, each battery cell 46 can have a length of about seventy millimeters (70 mm). Another example of a battery cell is shown and described in U.S. Pat. No. 6,489,060, the content of which is hereby incorporated by reference.

The battery cells 46 are arranged in a first set 56 of battery cells 46a, 46b and 46c and a second set 58 of battery cells 46d and 46e. In the first set 56, the cell axes 50a, 50b and 50c are parallel to one another. In the second set 58, the cell axes 50d and 50e are parallel to each other. However, the sets 56 and 58 are arranged so that the battery cells 46a, 46b and 46c are non-parallel to the battery cells 46d and 46e. In the illustrated construction, for example, the battery cells 46a, 46b and 46c can be normal to the battery cells 46d and 46e.

The battery cells 46 are arranged to reduce the heat transfer between the battery cells 46 and to improve the collection and removal of heat from the battery cells 46. In this manner, the battery cells 46 may be able to be maintained in an appropriate temperature operating range for longer durations of use. The battery cells 46 are also arranged to provide an efficient use of space and to maintain a relatively small pack size.

As shown in FIGS. 1-4 and 7, the housing 42 can provide a support portion 60 for supporting the battery pack 30 on an electrical device, such as the power tool 34 or the battery charger 38. In the illustrated construction, the support portion 60 provides a C-shaped cross section (see FIG. 7) which is connectable to a complementary T-shaped cross section support portion on the electrical device.

The battery pack 30 also can include (see FIGS. 1-4, 8-9, 21, 24-25 and 30-38) a locking assembly 74 operable to lock the battery pack 30 to an electrical device, such as, for example, to the power tool 34 and/or to a battery charger. The locking assembly 34 includes locking members 78 which are movable between a locked position, in which the locking members 78 engage a corresponding locking member on the electrical device to lock the battery pack 30 to the electrical device, and an unlocked position. The locking assembly 74 also includes actuators 82 for moving the locking members 78 between the locked position and the unlocked position. The actuators 82 have a large surface for engagement by an operator to provide improved ease of unlocking the locking assembly 74. Also, the actuators 82 are supported to reduce the gripping force required to unlock the locking assembly 74.

As shown in FIGS. 30-38, biasing members 83 bias the locking members 78 toward the locked position. In the illustrated construction, each biasing member 83 is a leaf spring positioned between the actuator 82 and the housing 42 to bias the locking member 78 to the locked position.

Each biasing member 83 is fixed between the actuator 82 and the housing 42 and operates to retain the actuator 82 (and the locking member 78) in a position and to limit unwanted movement of the actuator 82 (and the locking member 78) relative to the housing 42. Specifically, the biasing member 83 limits movement of the actuator 82 (and of the locking member 78) in a direction perpendicular to the direction of movement between the locked position and the unlocked position (i.e., upwardly in the cross-sectional views of FIG. 35) to prevent the actuator 82 and/or the locking member 78 from binding on the housing 42 or from being prevented to move in the desired manner to operate the locking assembly 74.

Figure 32:
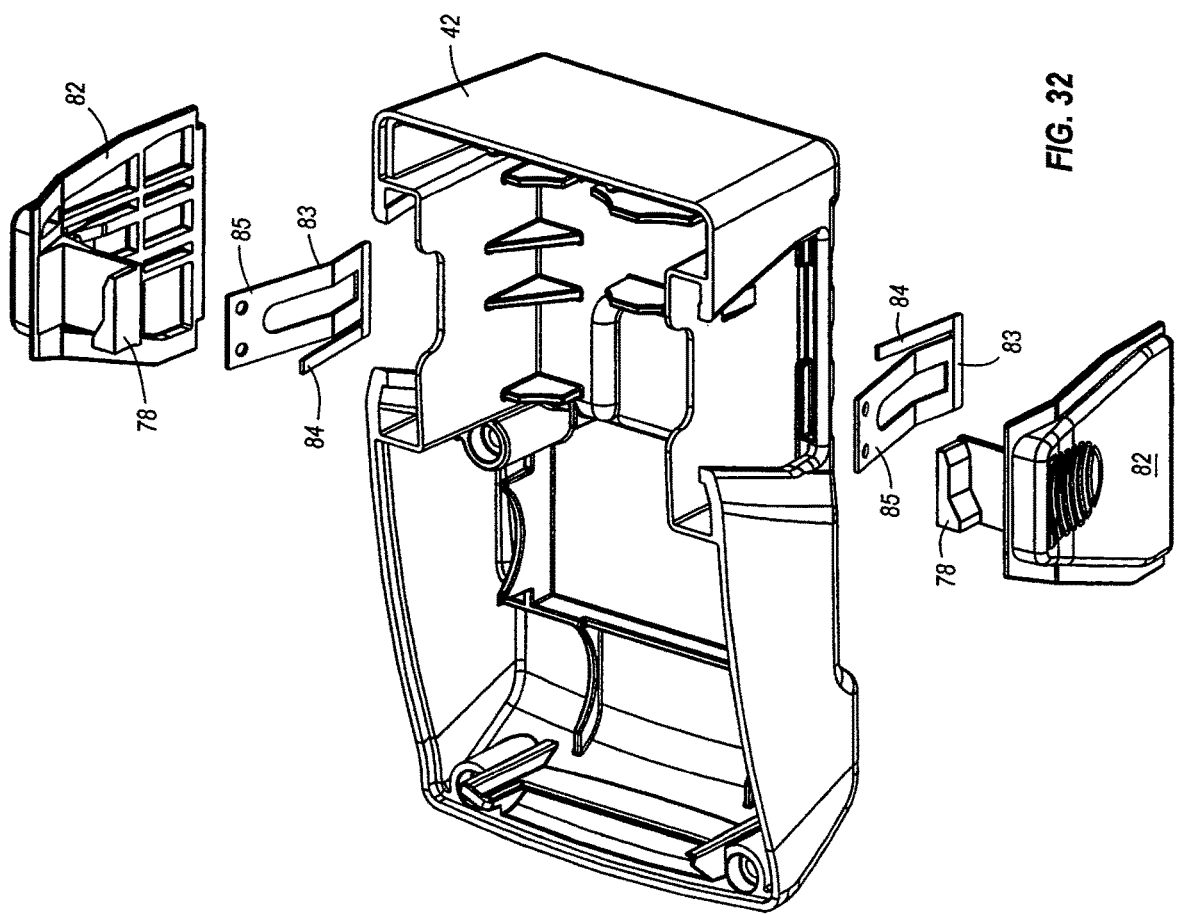
FIG. 32 is an exploded perspective view of a portion of the battery pack shown in FIG. 1 with portions removed.
Figure 33:
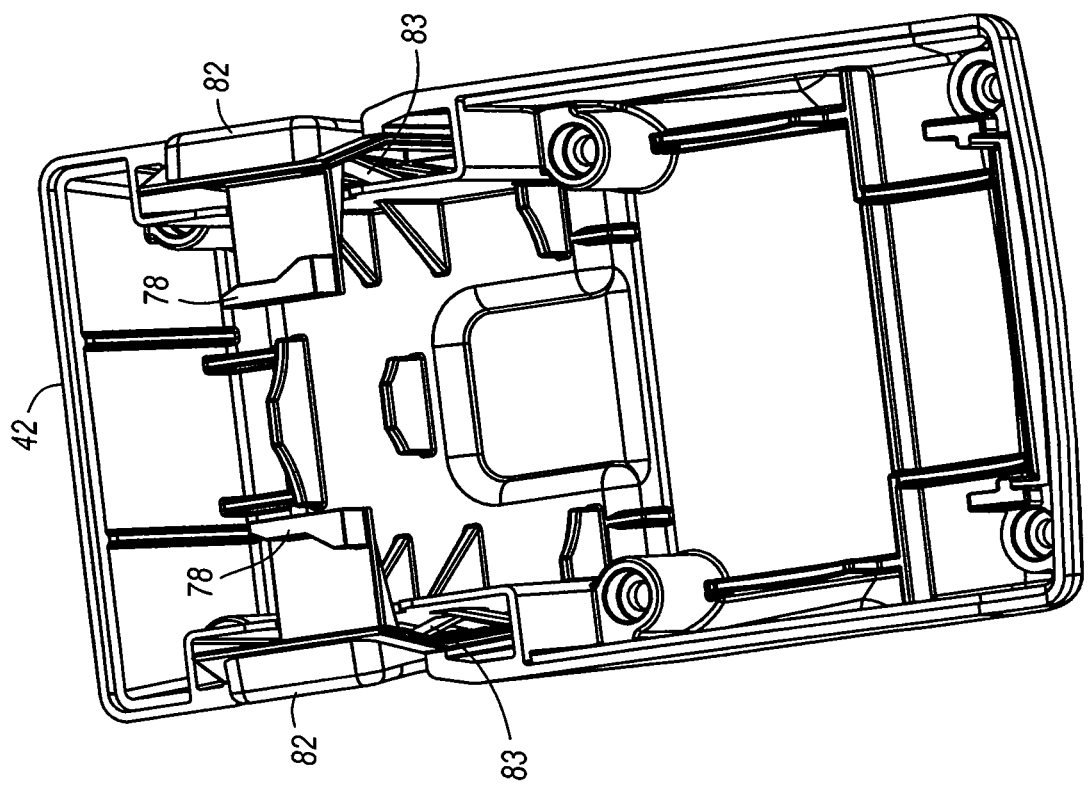
FIG. 33 is a perspective view of the portion of the battery pack shown in FIG. 32.
Figure 34:
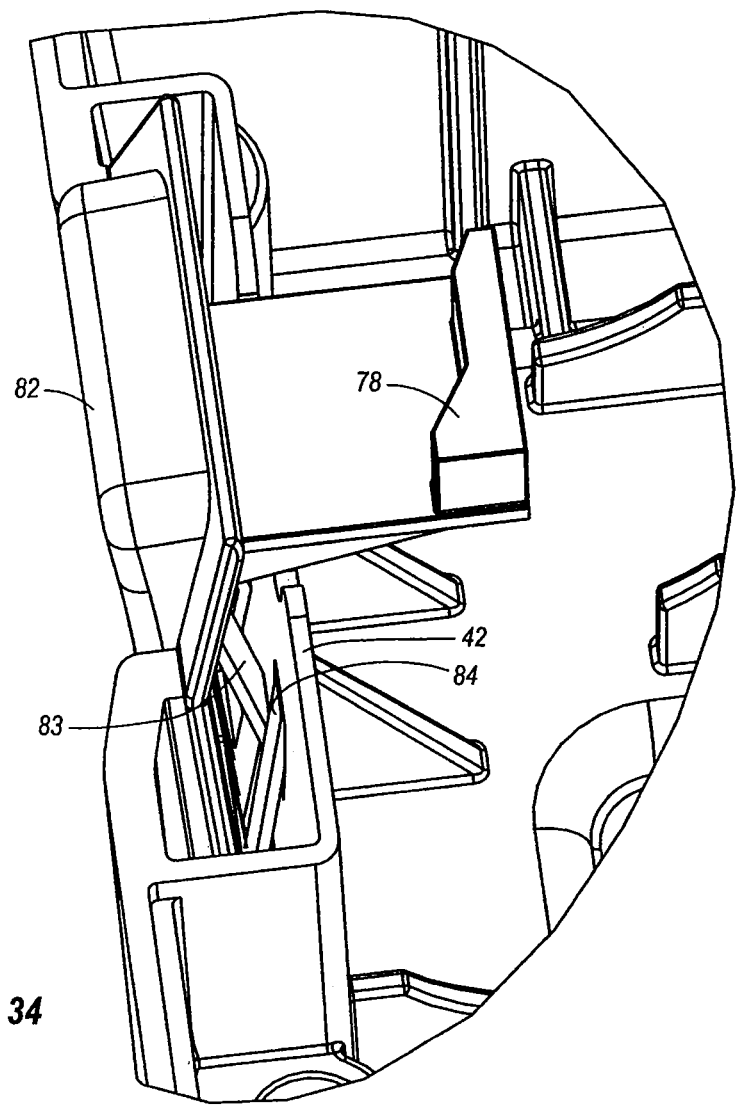
FIG. 34 is an enlarged perspective view of a portion of the battery pack shown in FIG. 33.
Figure 35A:
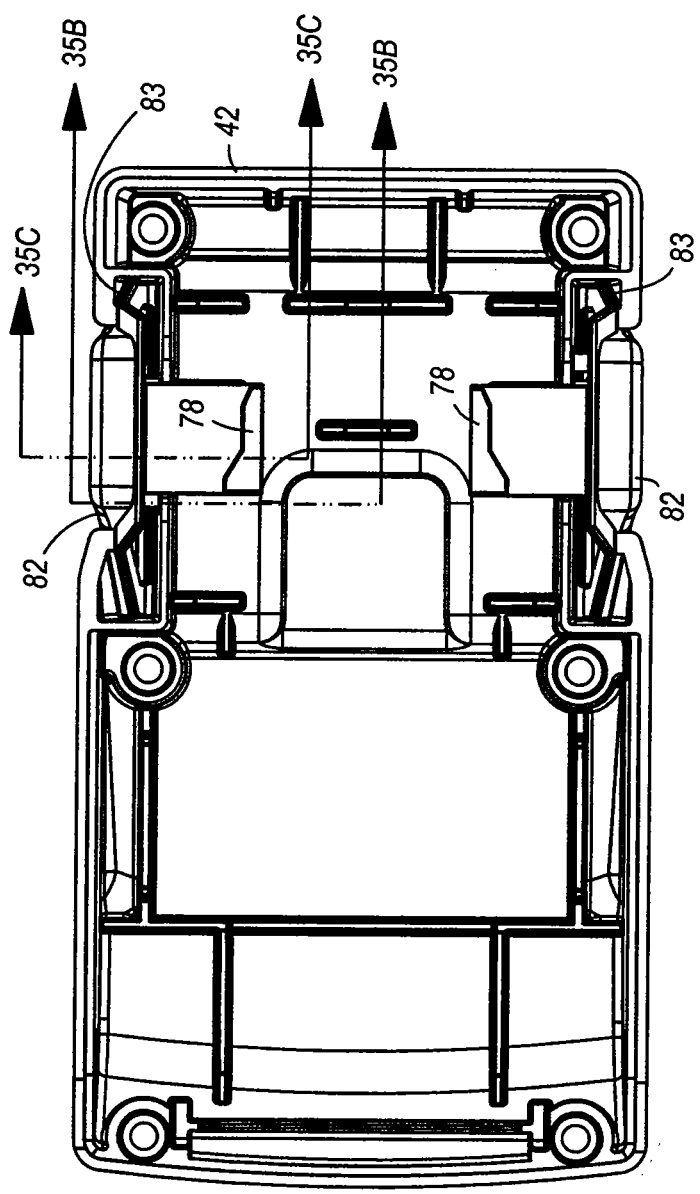
FIGS. 35A-35C include views of portions of the battery pack shown in FIG. 1 with portions removed.
Figure 35B:
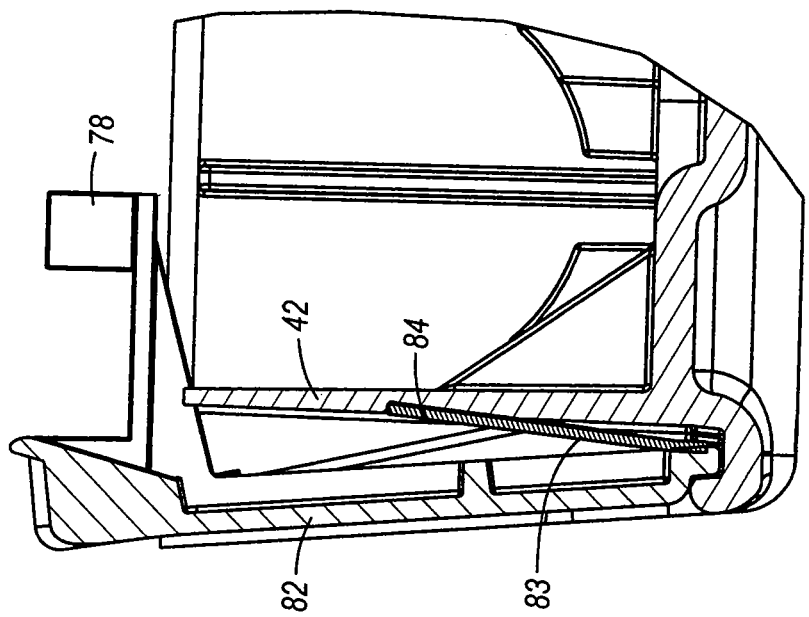
Figure 35C:
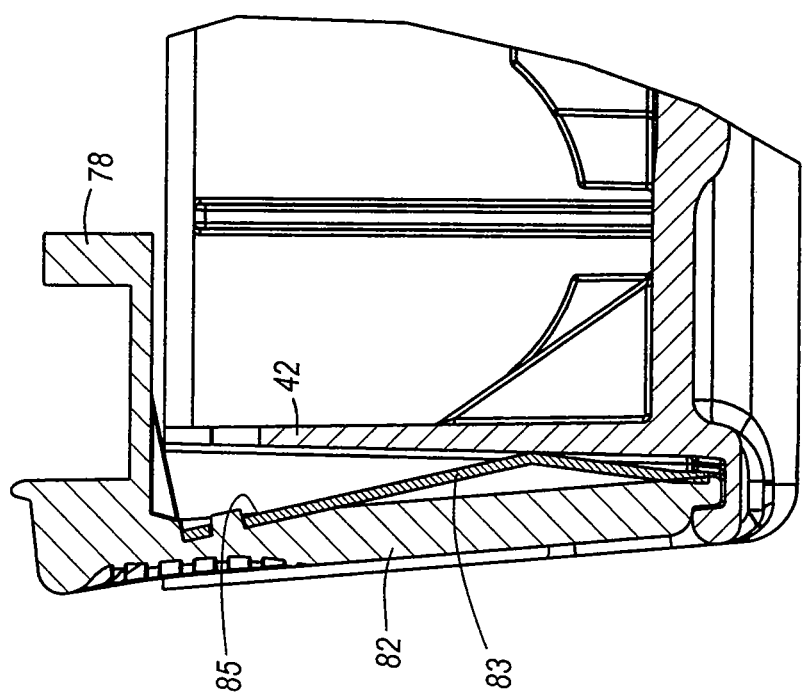
Figure 36:
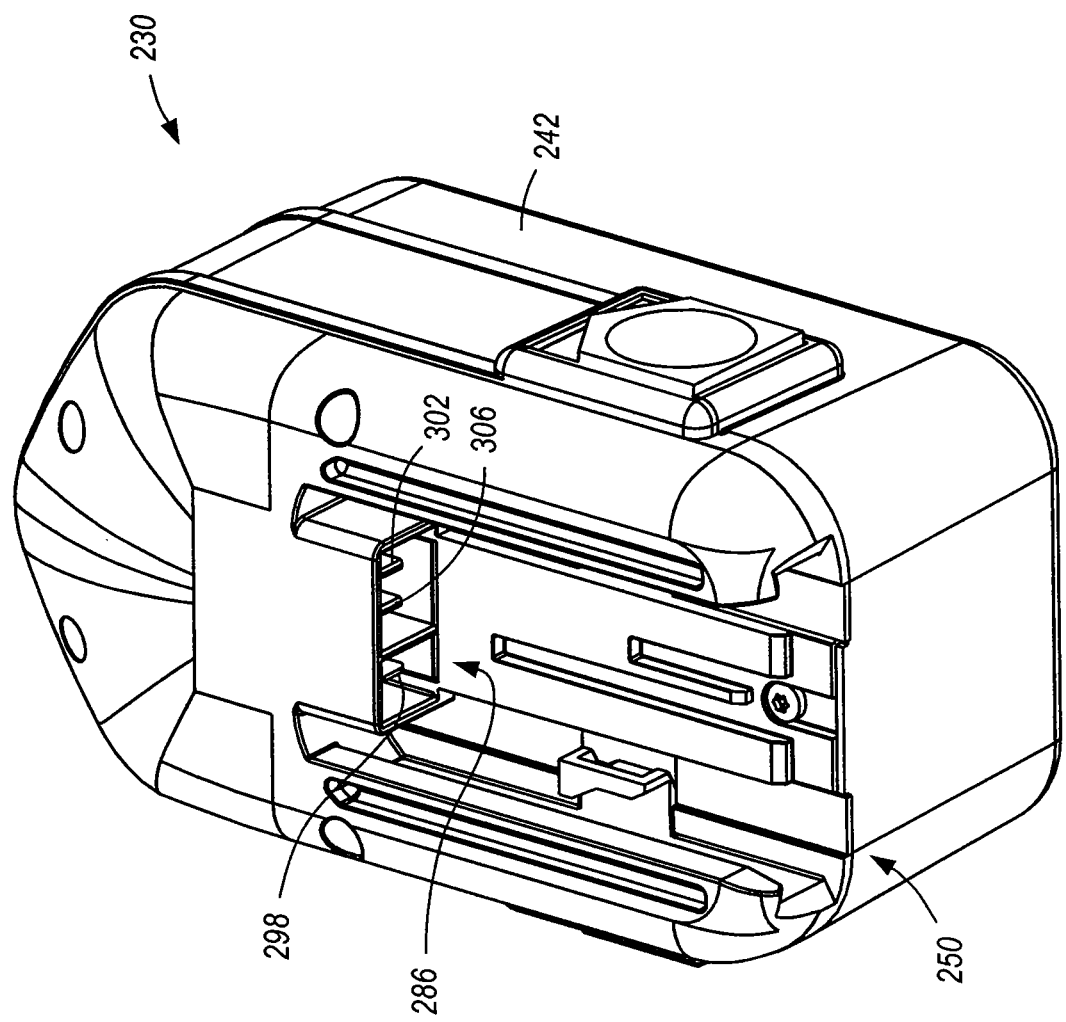
FIG. 36 is a rear perspective view of an existing battery pack.
Figure 37:
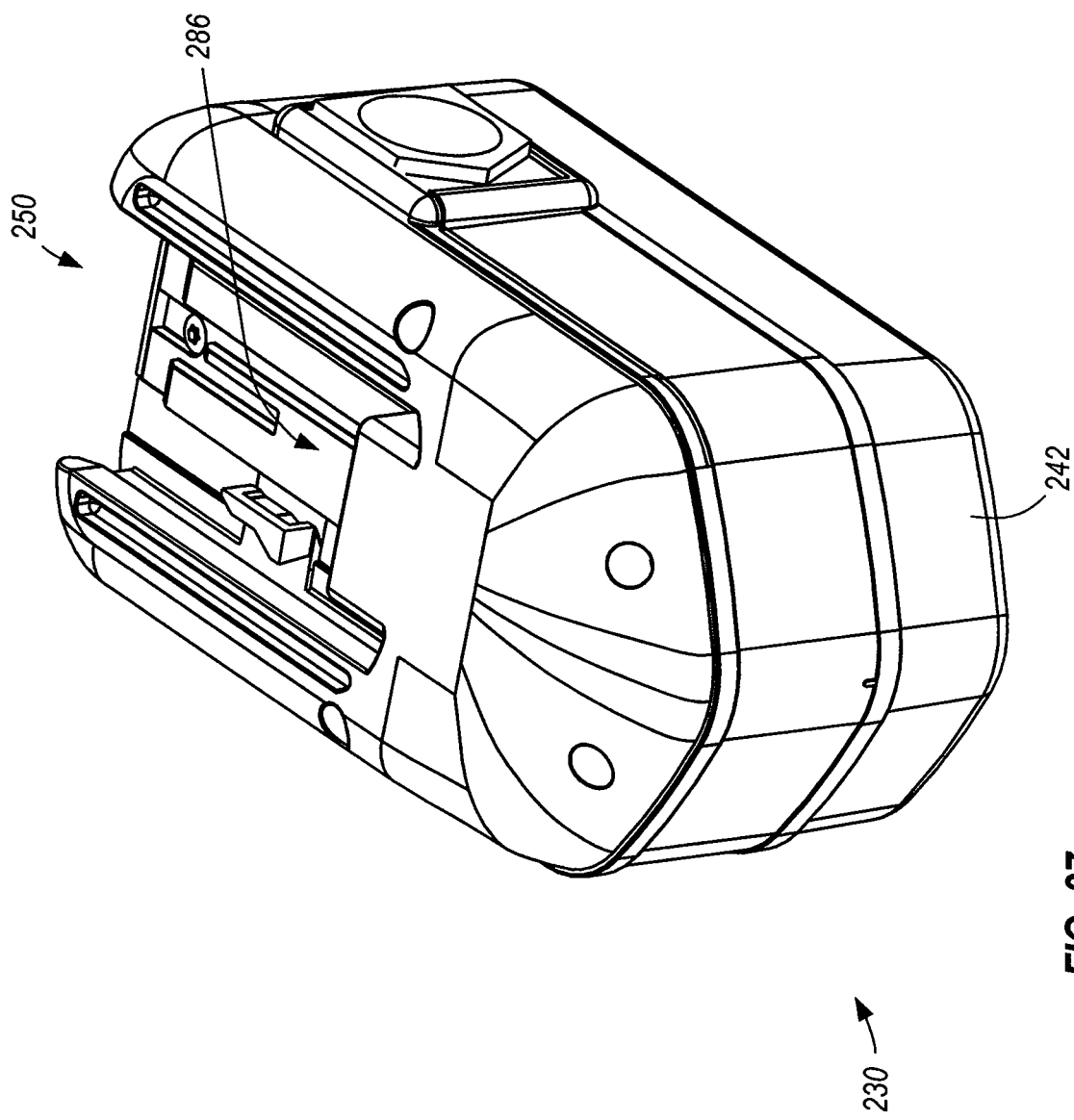
FIG. 37 is a front perspective view of the battery pack shown in FIG. 36.
Figure 38:
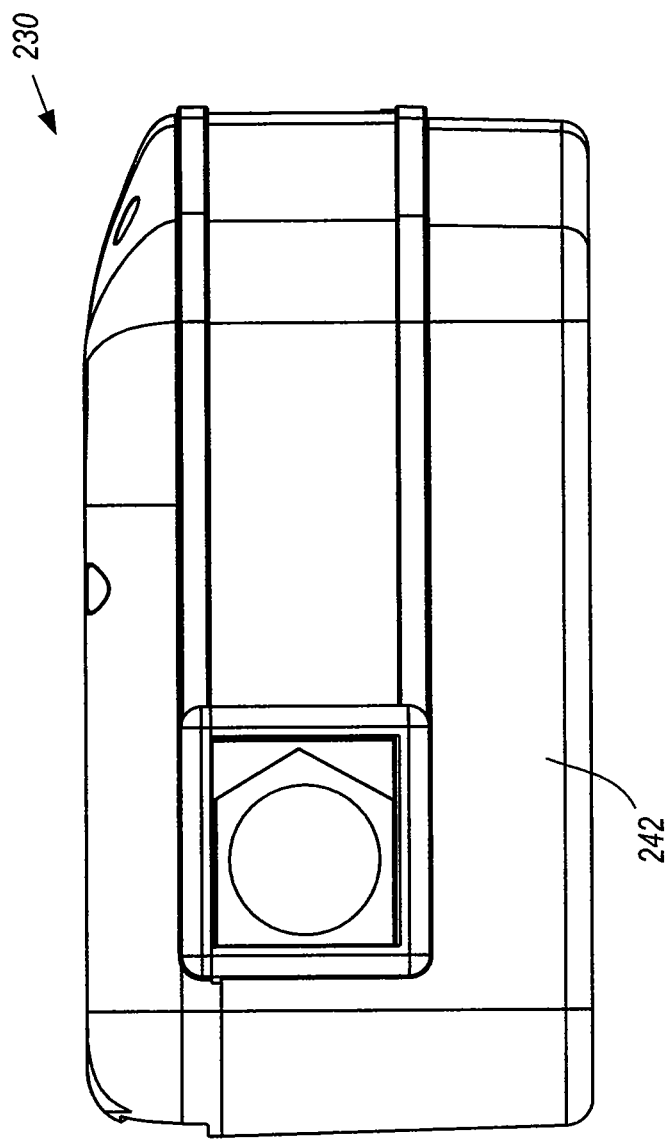
FIG. 38 is a left side view of the battery pack shown in FIG. 36.
Figure 39:
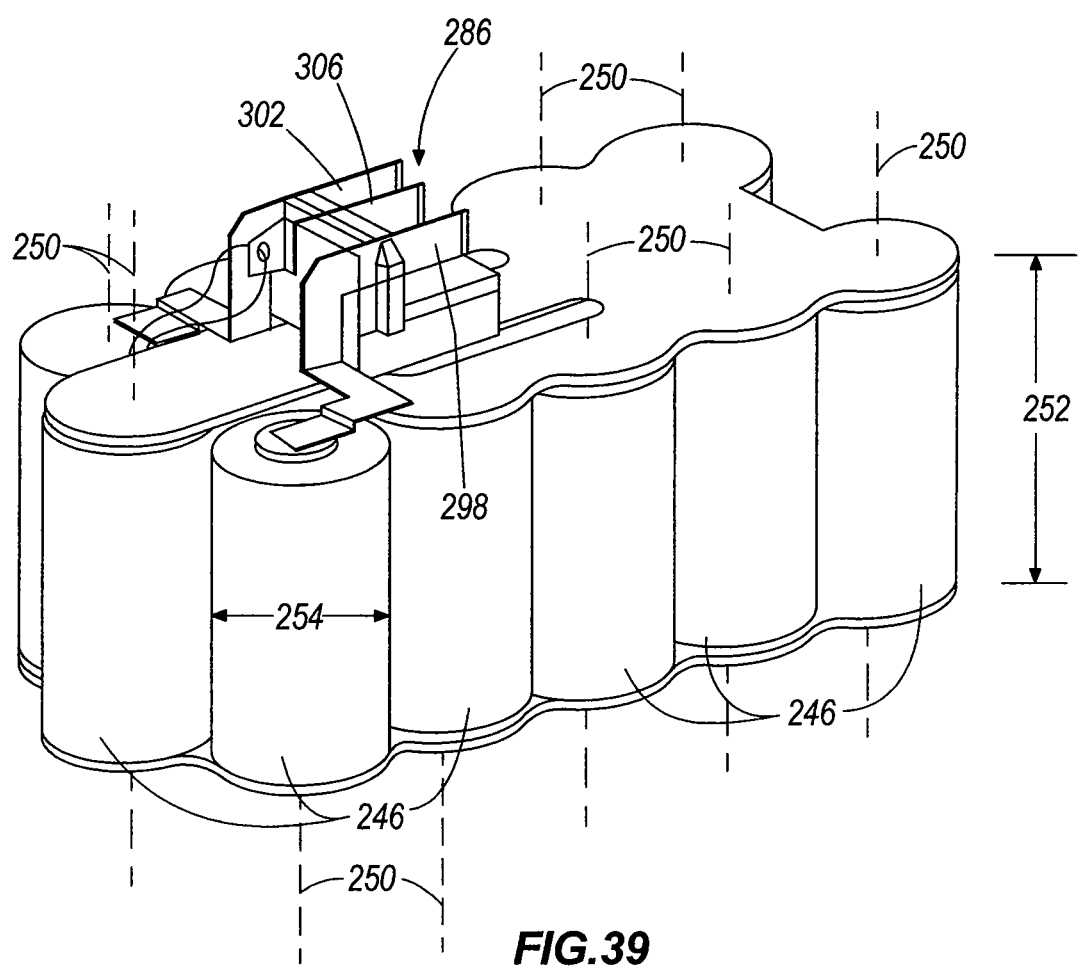
FIG. 39 is a perspective view of a portion of the battery pack shown in FIG. 36 and illustrating the battery cells and the battery terminal assembly.
Figure 40:
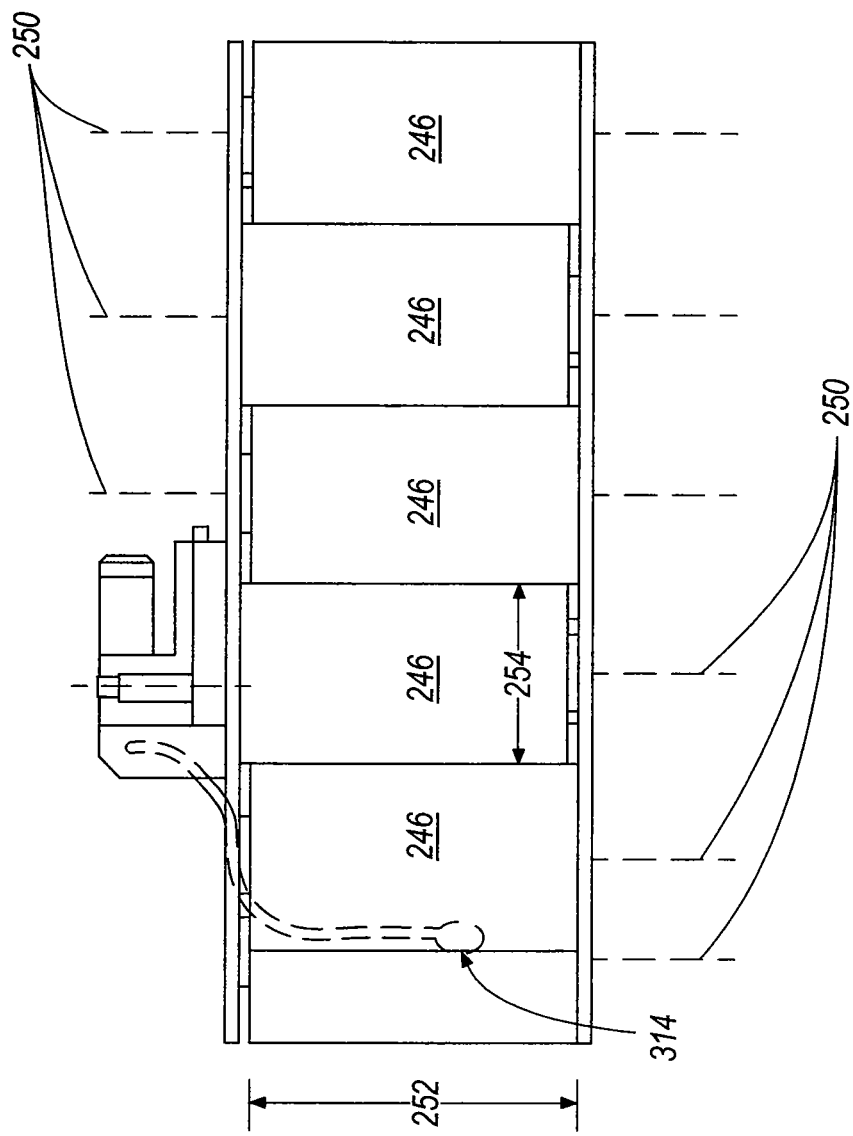
FIG. 40 is a right side view of the battery cells and the battery terminal assembly shown in FIG. 39.
Figure 41:
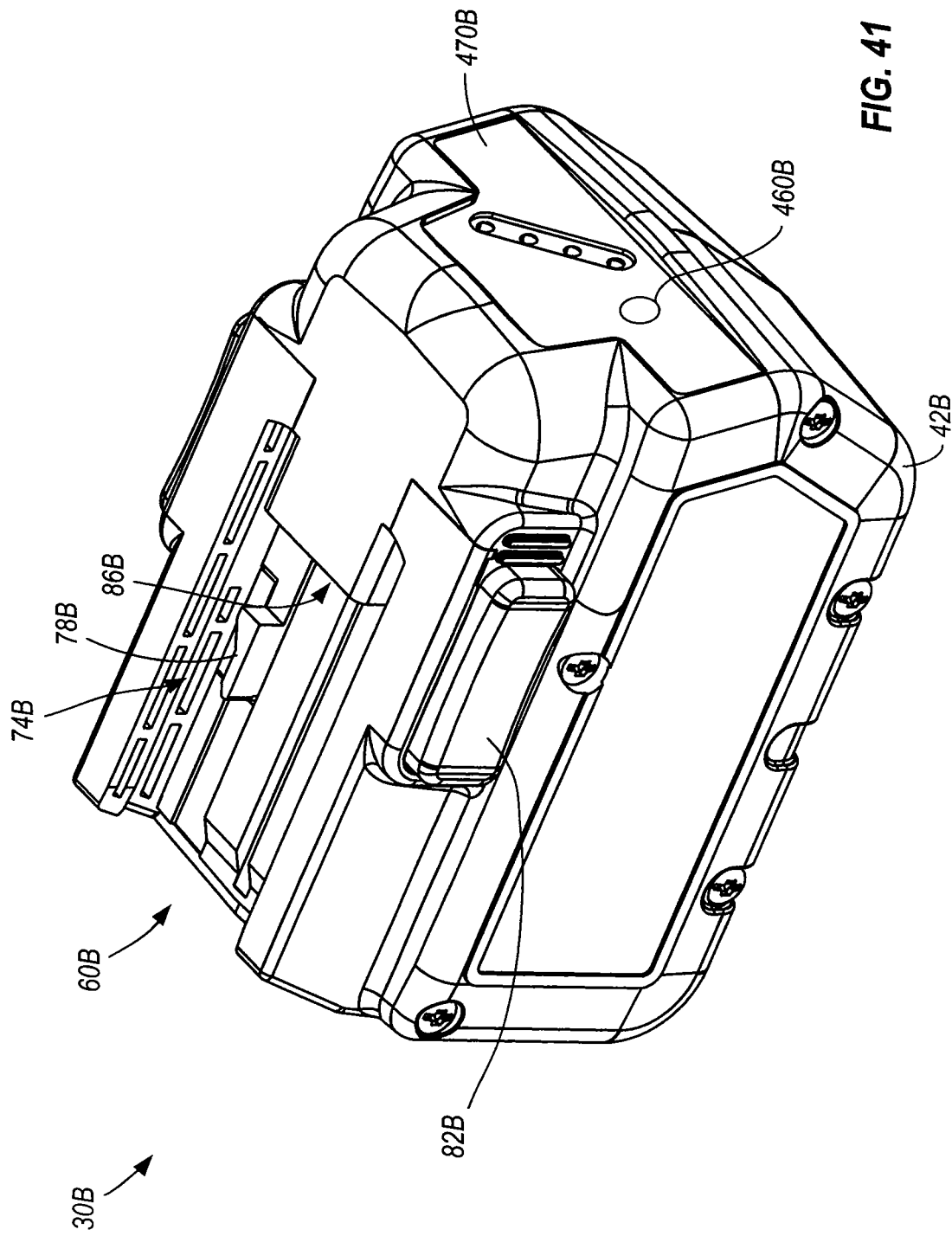
FIG. 41 is a front perspective view of another battery pack.
Figure 42:
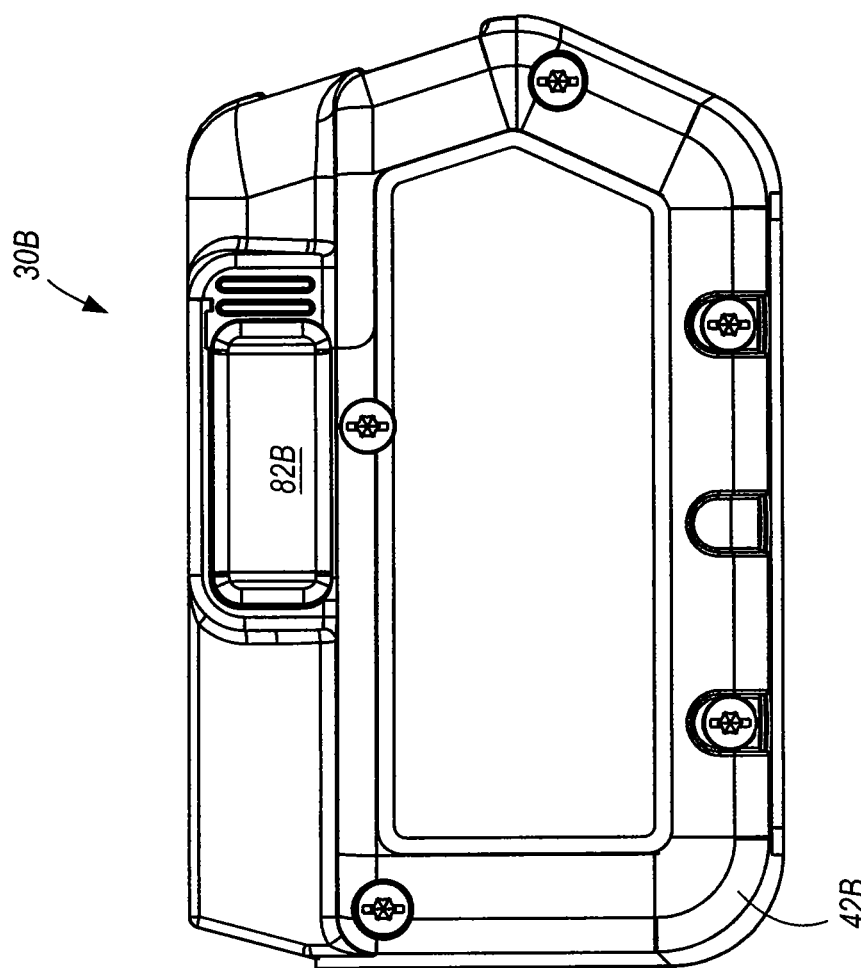
FIG. 42 is a right side view of the battery pack shown in FIG. 41.
Figure 43:
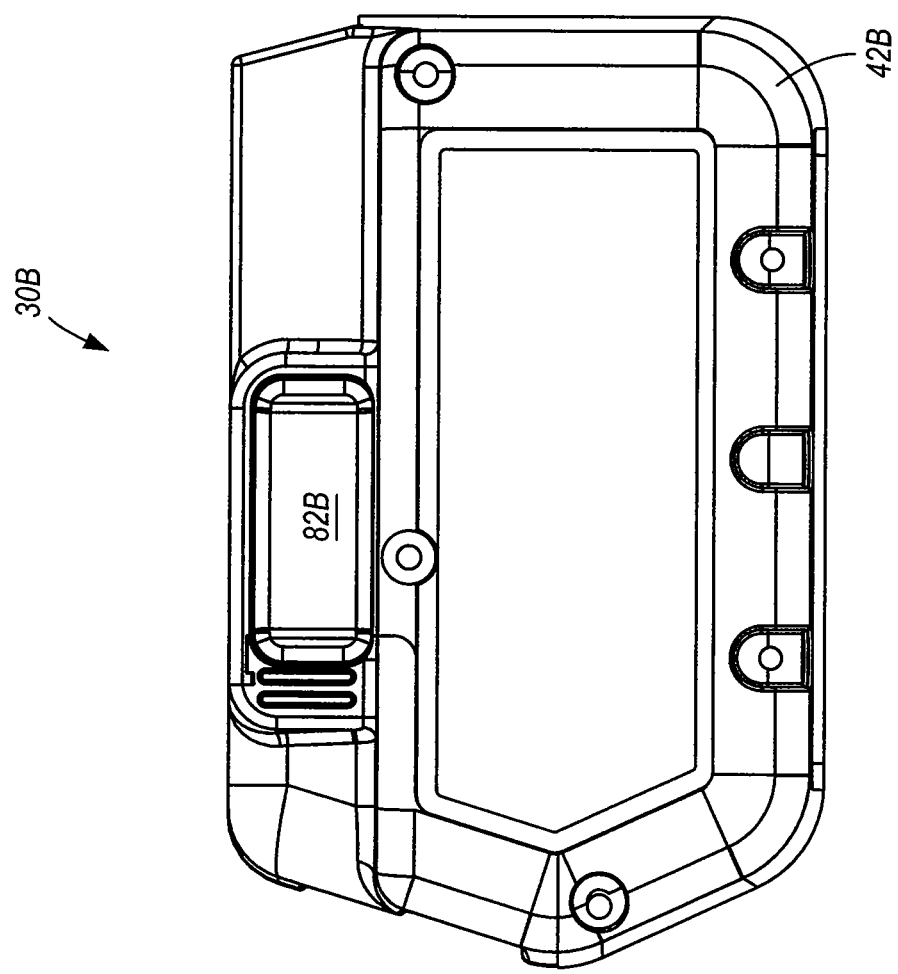
FIG. 43 is a left side view of the battery pack shown in FIG. 41.
Figure 44:
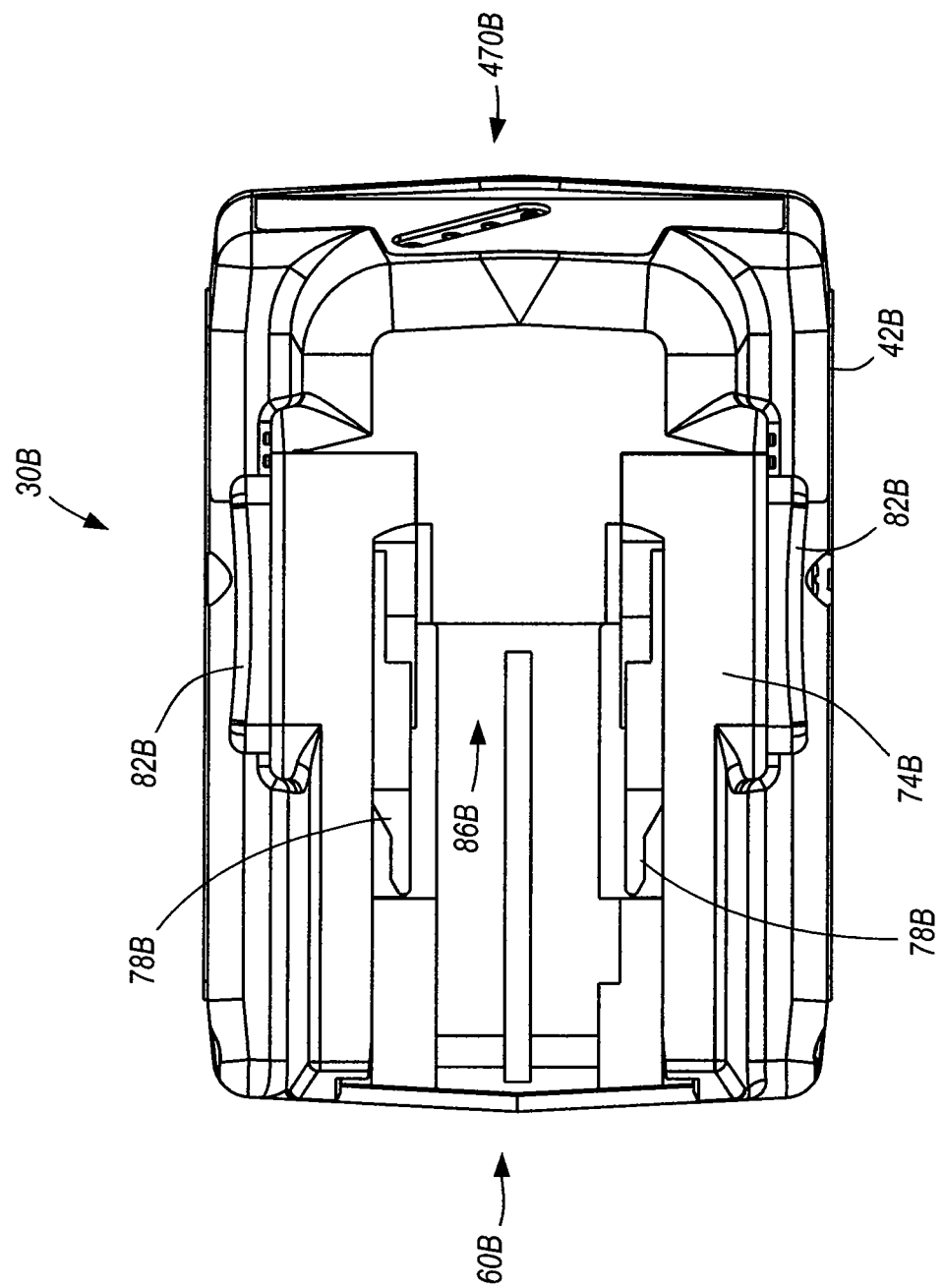
FIG. 44 is a top view of the battery pack shown in FIG. 41.
Figure 45:
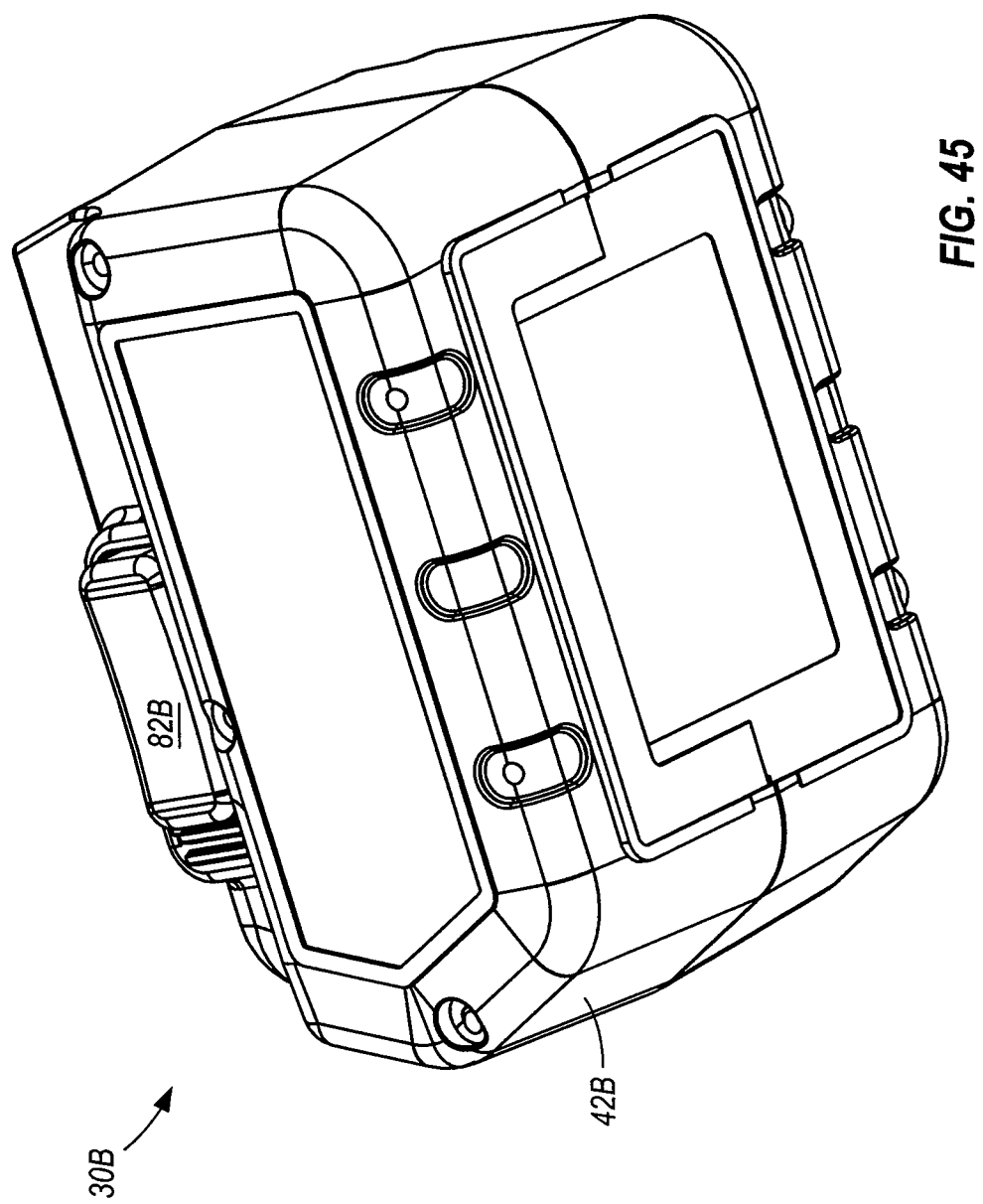
FIG. 45 is a bottom rear perspective view of the battery pack shown in FIG. 41.
Figure 46:
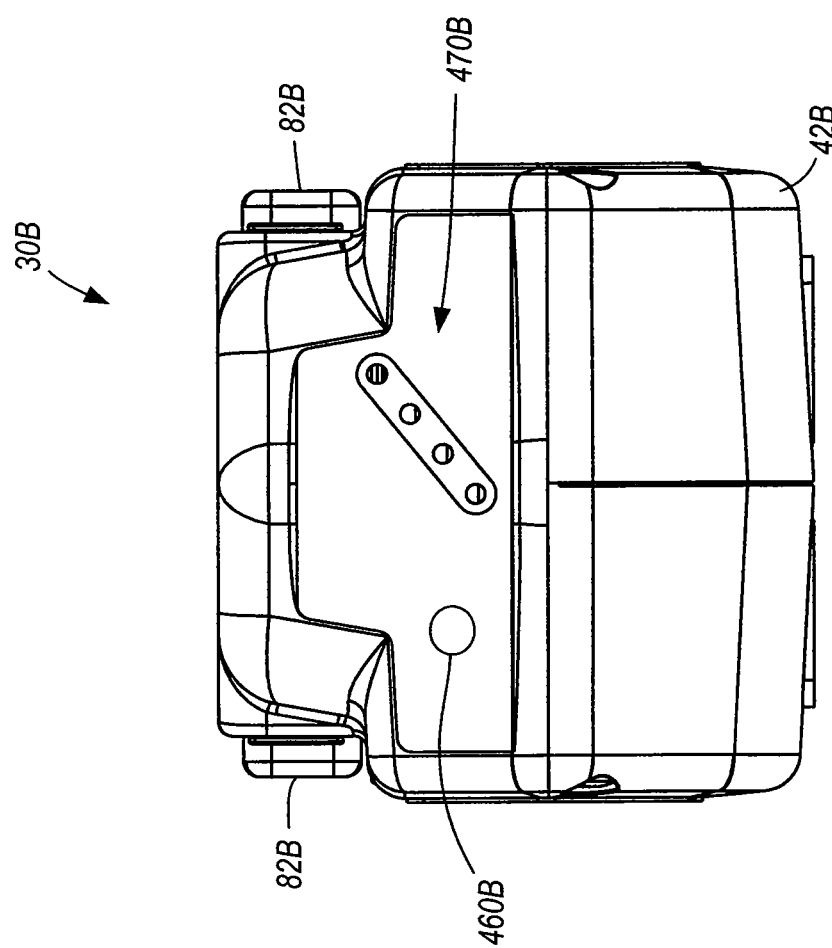
FIG. 46 is a front view of the battery pack shown in FIG. 41.
Figure 47:
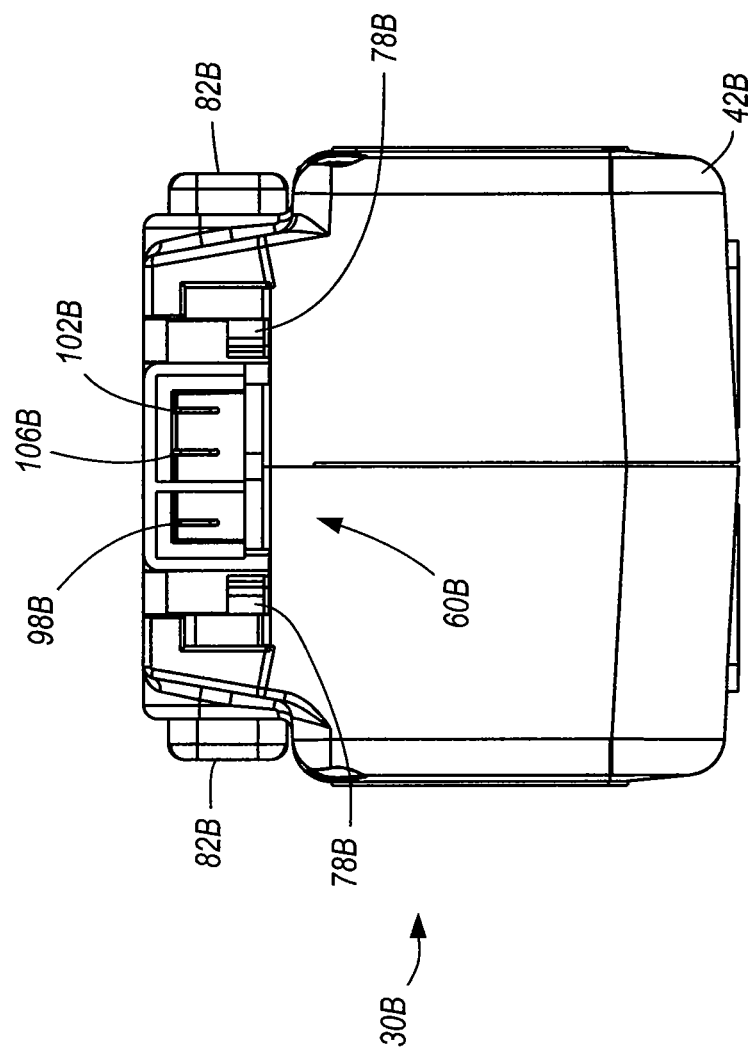
FIG. 47 is a rear view of the battery pack shown in FIG. 41.
Figure 48:
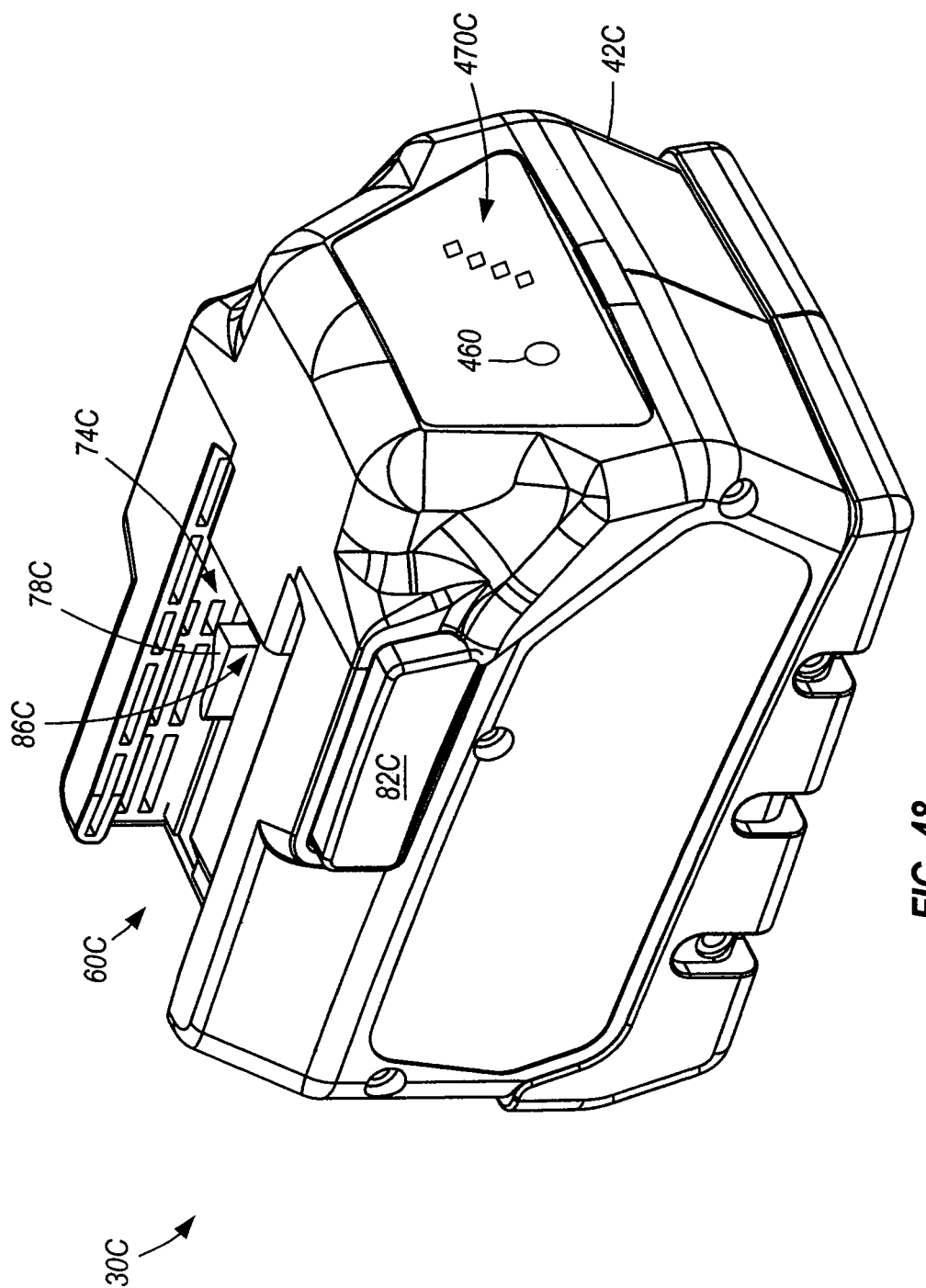
FIG. 48 is a front perspective view of a further battery pack.
Figure 49:
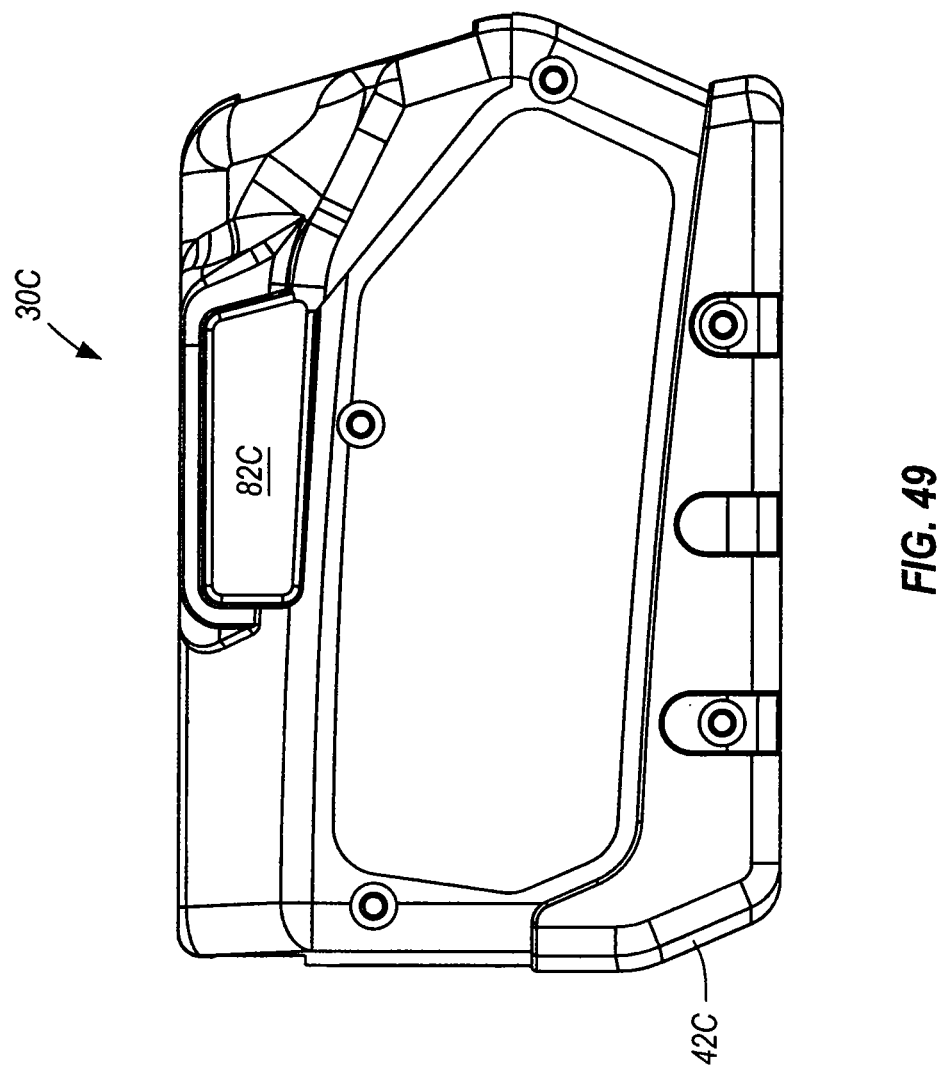
FIG. 49 is a right side view of the battery pack shown in FIG. 48.
Figure 50:
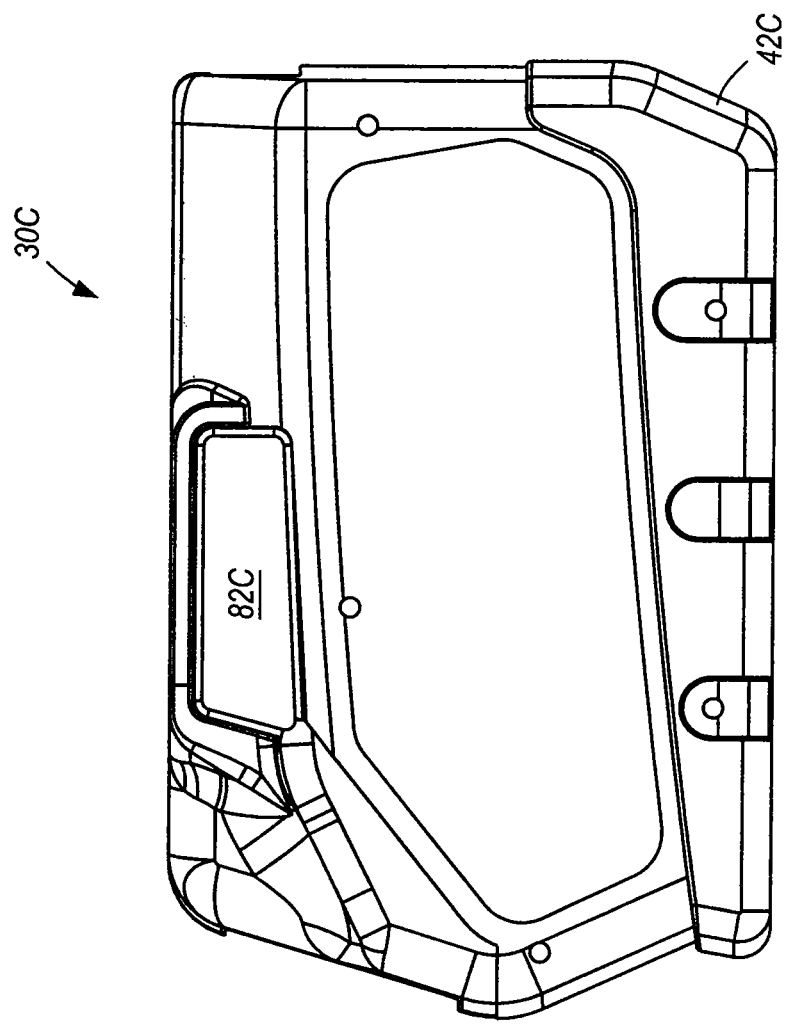
FIG. 50 is a left side view of the battery pack shown in FIG. 48.
Figure 51:
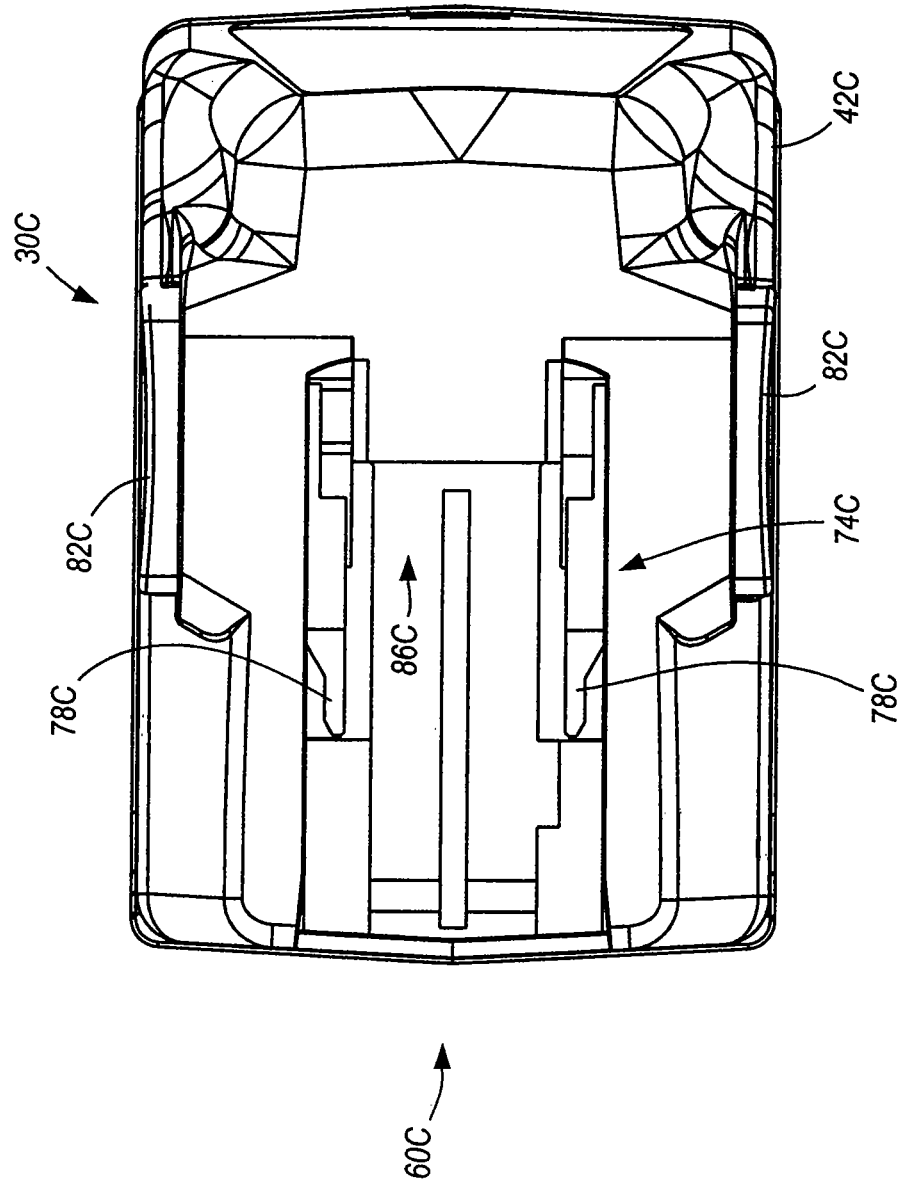
FIG. 51 is a top view of the battery pack shown in FIG. 48.
Figure 52:
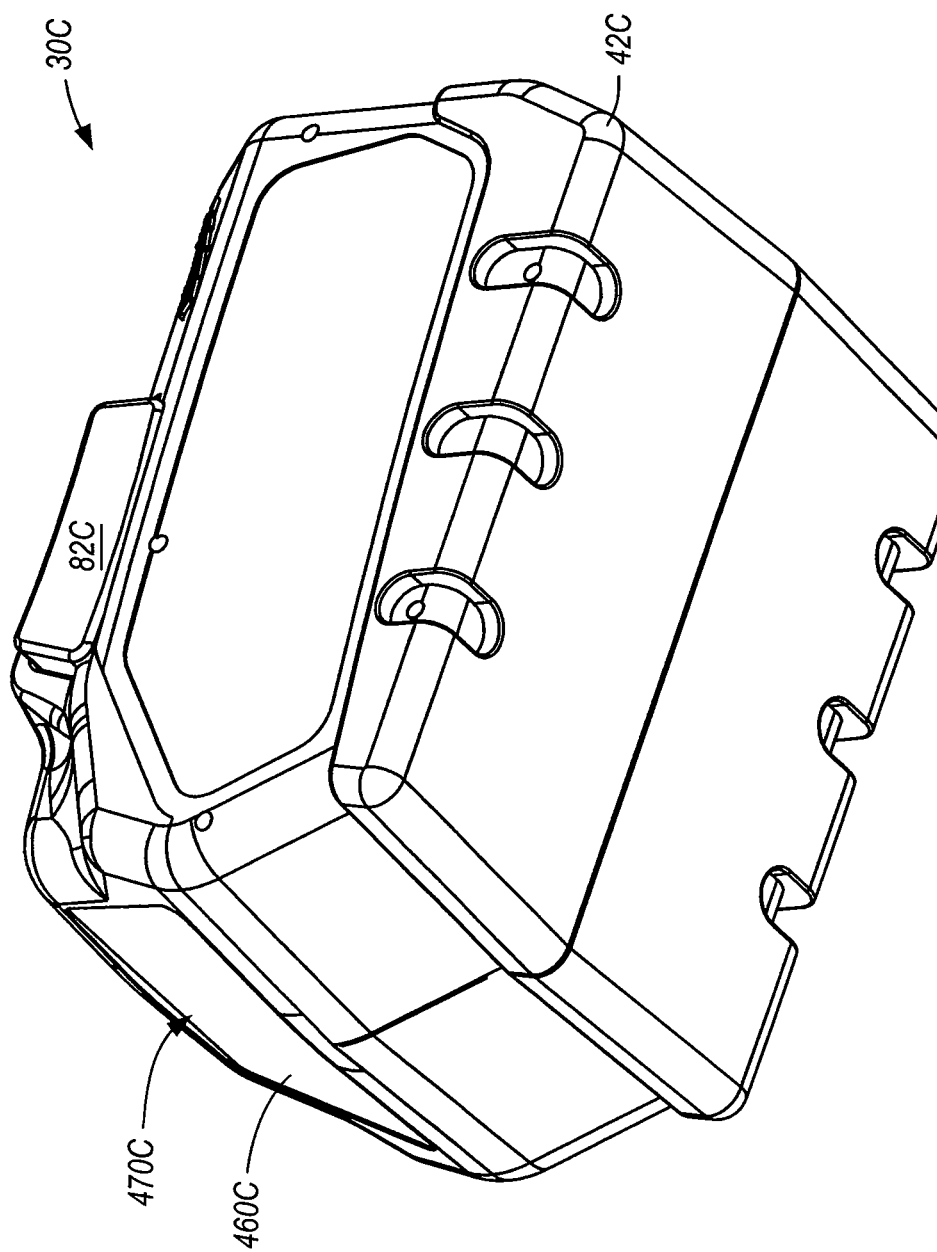
FIG. 52 is a bottom rear perspective view of the battery pack shown in FIG. 48.
Figure 53:
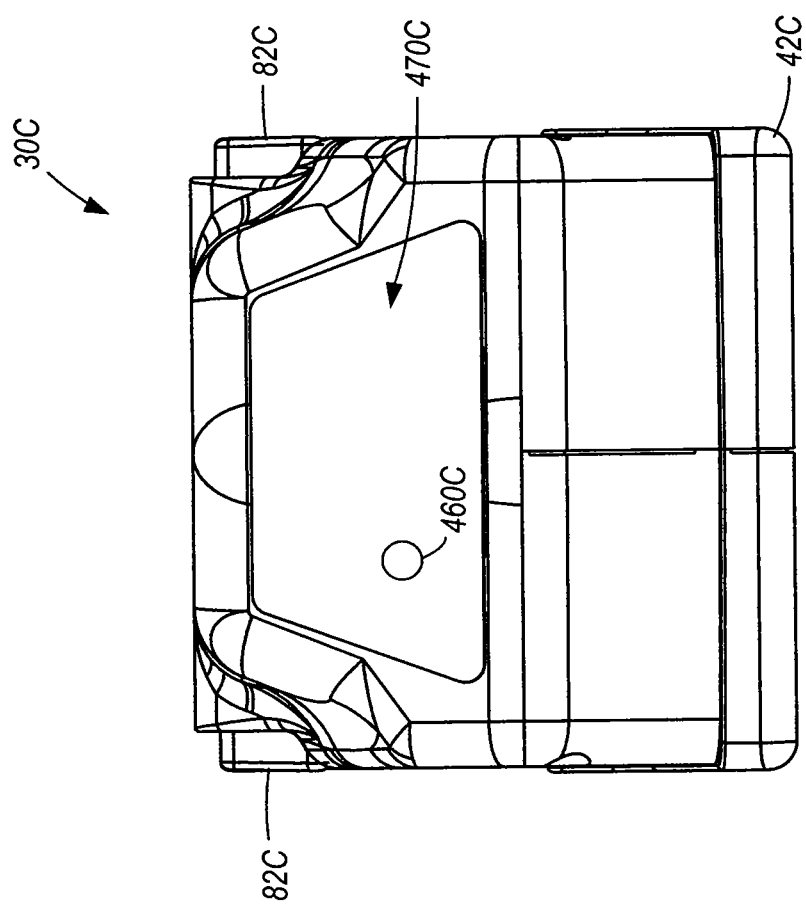
FIG. 53 is a front view of the battery pack shown in FIG. 48.
Figure 54:
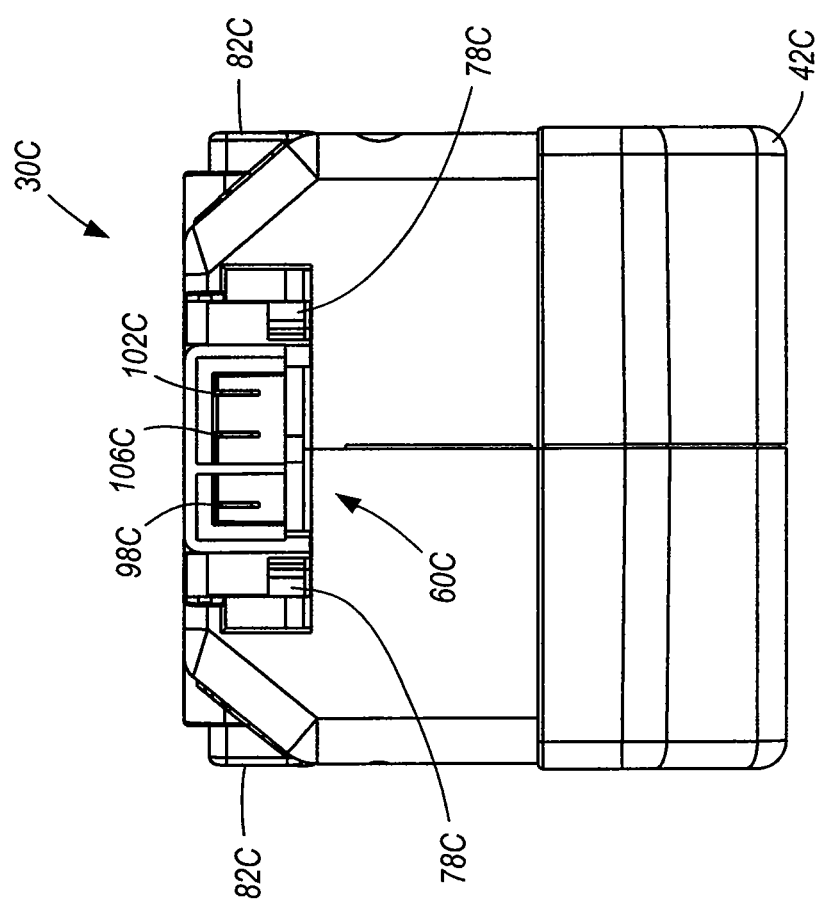
FIG. 54 is a rear view of the battery pack shown in FIG. 48.

As shown in FIGS. 32 and 35, the biasing member 83 includes a housing leg 84 engaging the housing 42 to force the biasing member 83 downwardly (in the left cross-sectional view of FIG. 35). The biasing member 83 also includes (see the right cross-sectional view of FIG. 35) an actuator leg 85 engaging the actuator 83 to draw and retain the actuator 82 (and the locking member 78) in the correct downward position (in the cross-sectional views of FIG. 35) during operation of the locking assembly 74 and of the battery pack 30.

Figure 20:
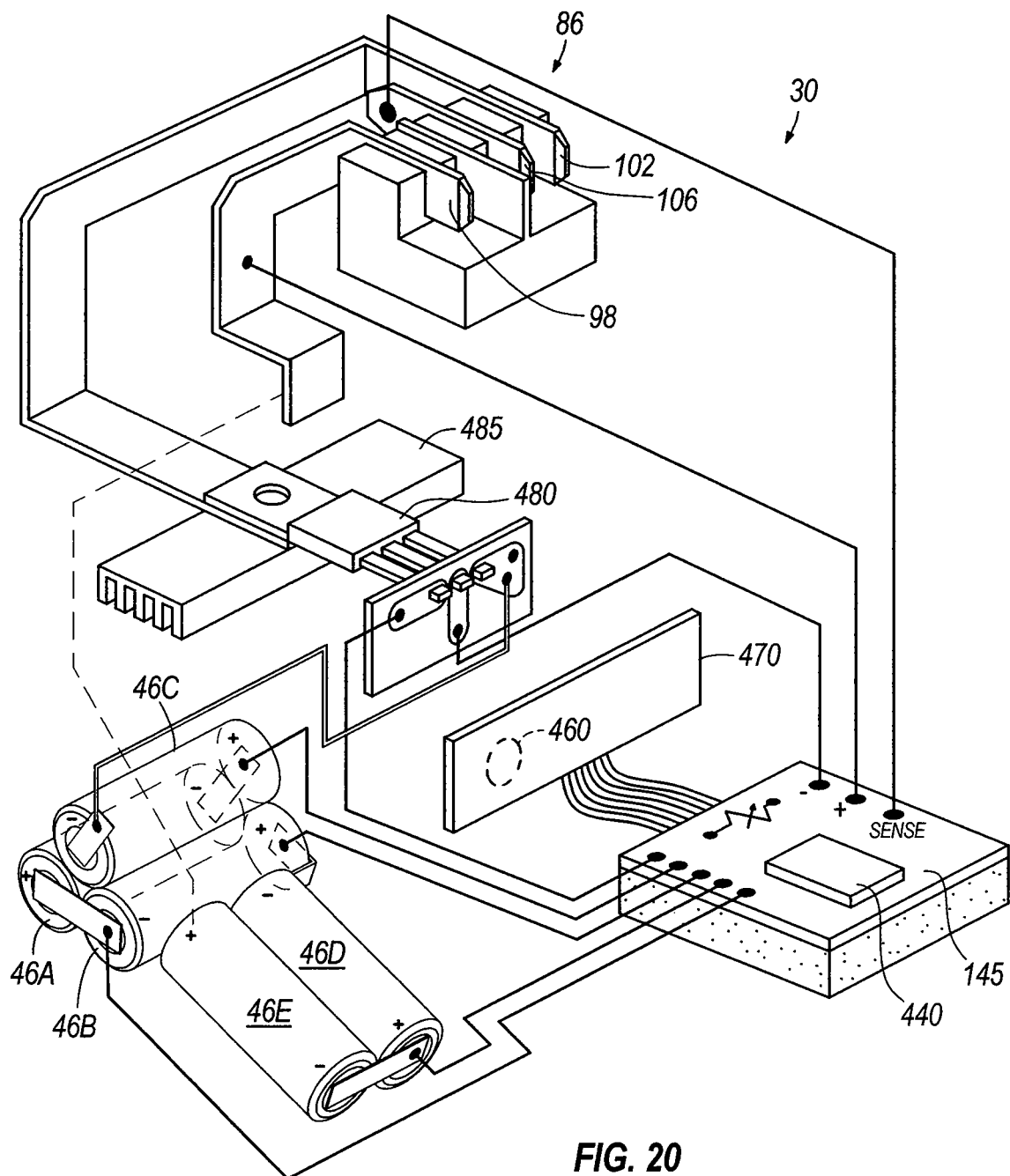
FIG. 20 is a schematic diagram of components of a battery pack, such as the battery pack shown in FIG. 1.
Figure 21:
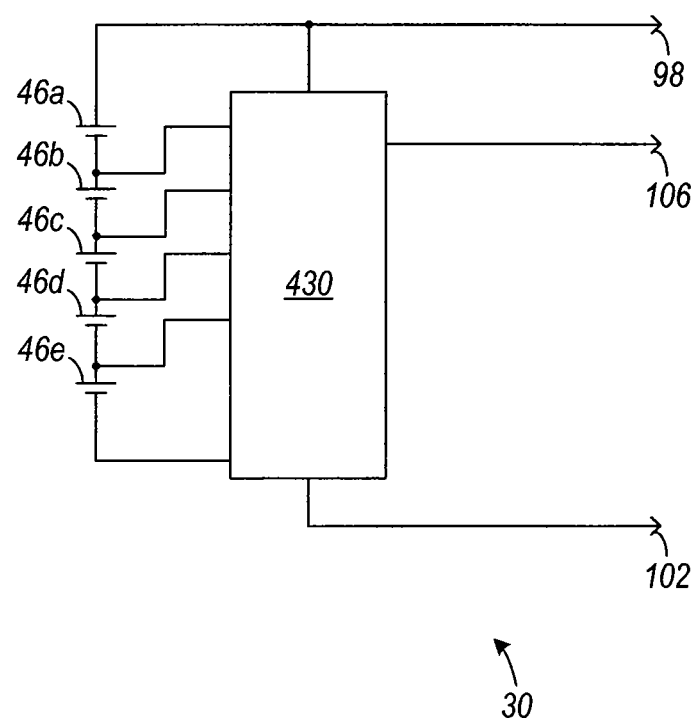
FIG. 21 is another schematic diagram of components of a battery pack.
Figure 22:
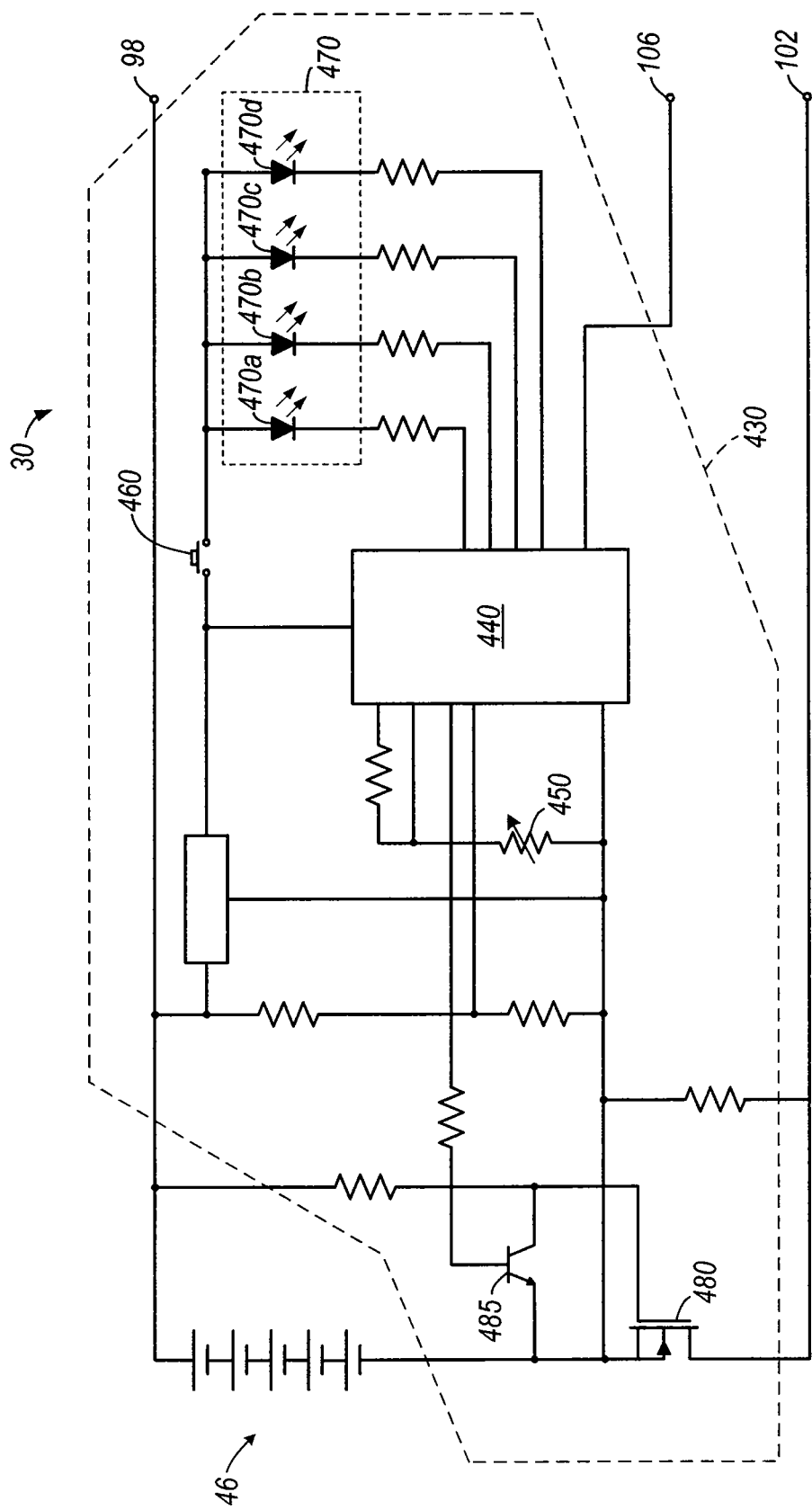
FIG. 22 is yet another schematic diagram of components of a battery pack.
Figure 23:
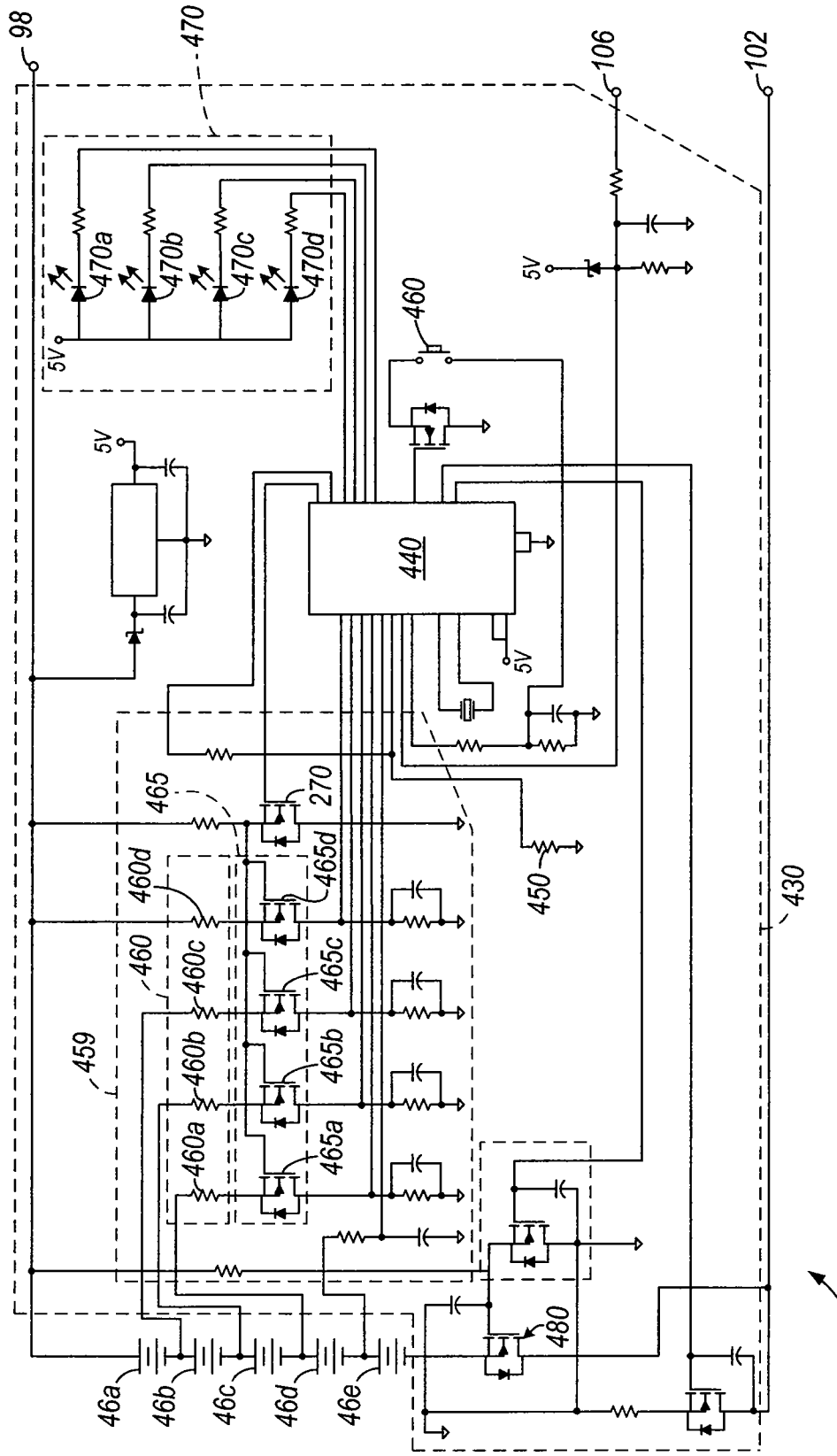
FIG. 23 is still another schematic diagram of components of a battery pack.
Figure 24:
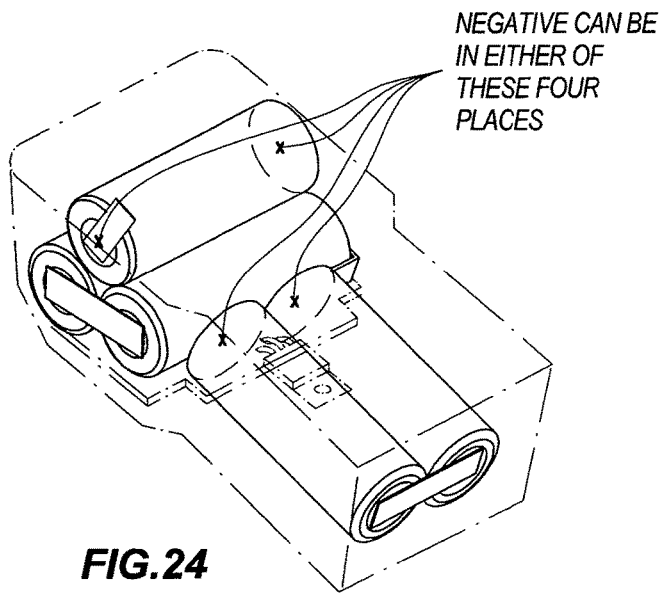
FIG. 24 is a perspective view of a portion of the battery pack shown in FIG. 1 with portions removed.
Figure 25:
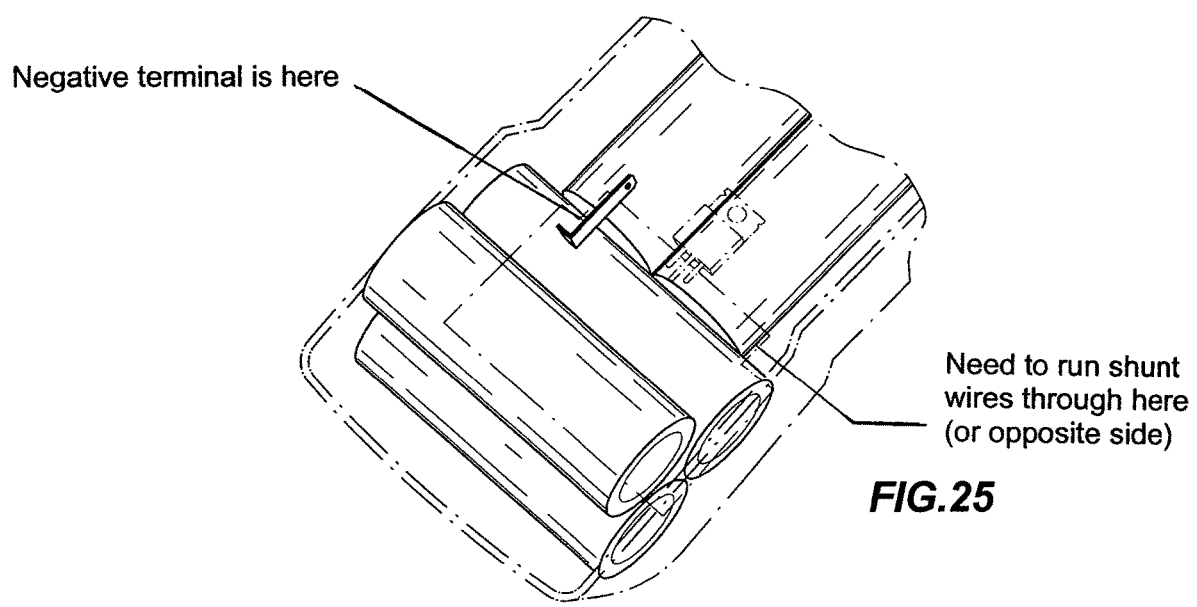
FIG. 25 is a perspective view of a portion of the battery pack shown in FIG. 1 with portions removed.
Figure 26:
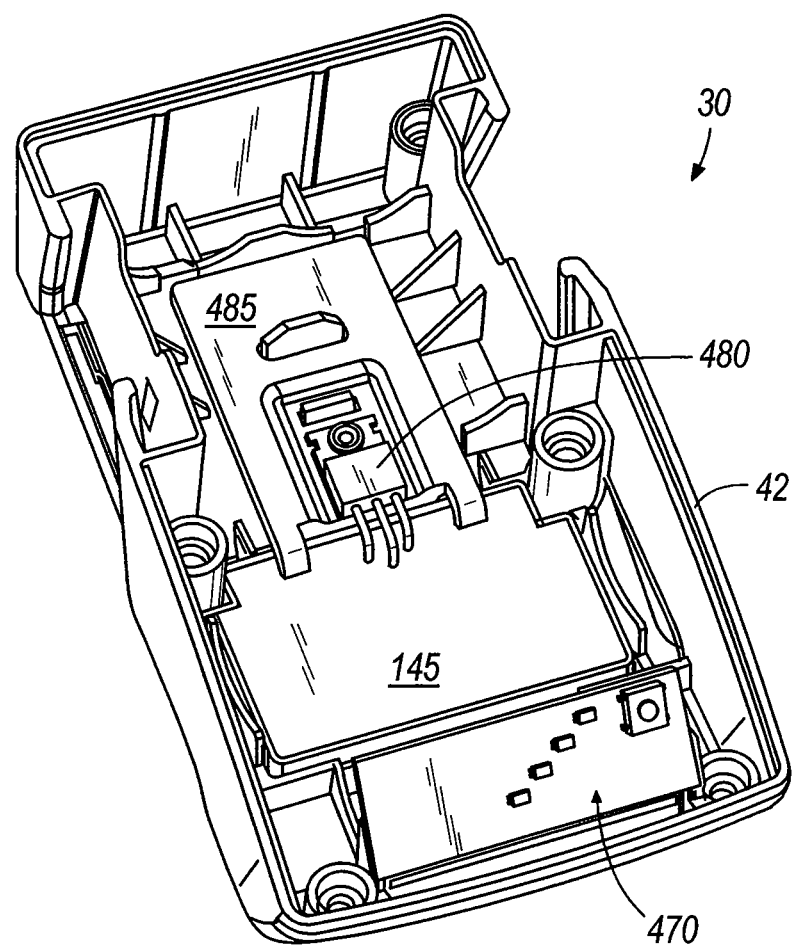
FIG. 26 is a perspective view of a portion of the battery pack shown in FIG. 1 with portions removed.
Figure 27:
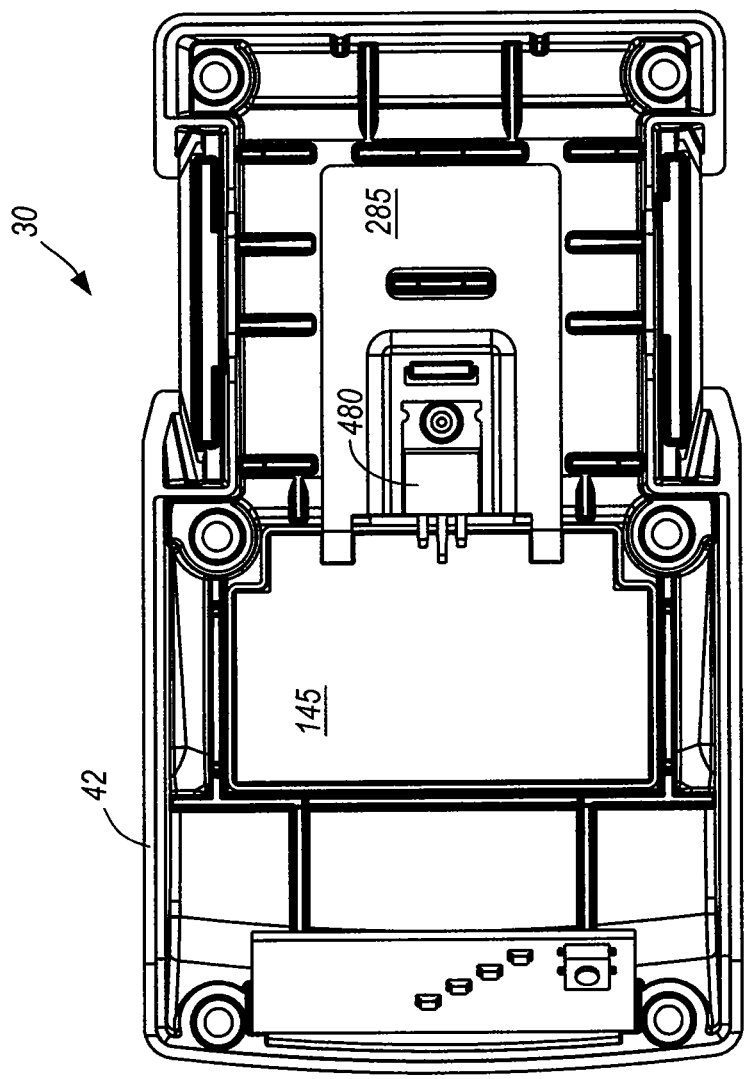
FIG. 27 is a top view of the portion of the battery pack shown in FIG. 26.
Figure 28C:
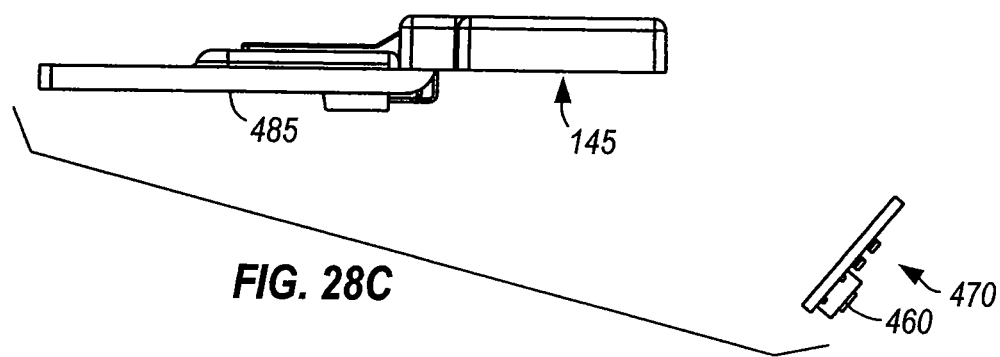
Figure 28D:
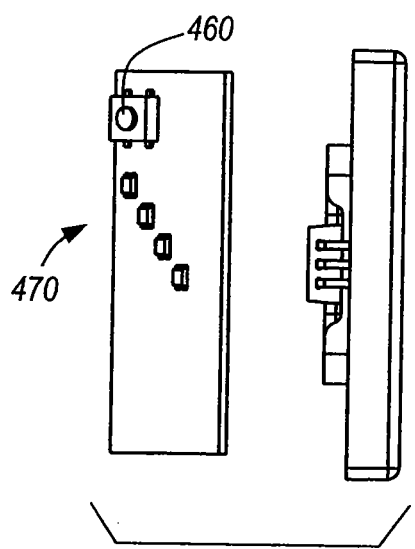
Figure 28E:
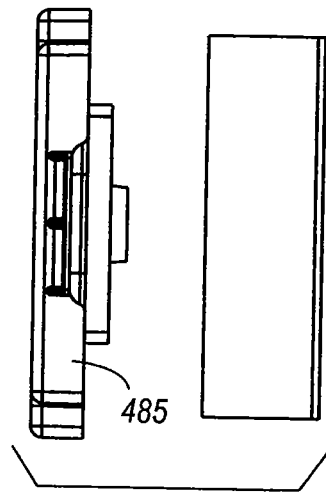
Figure 29:
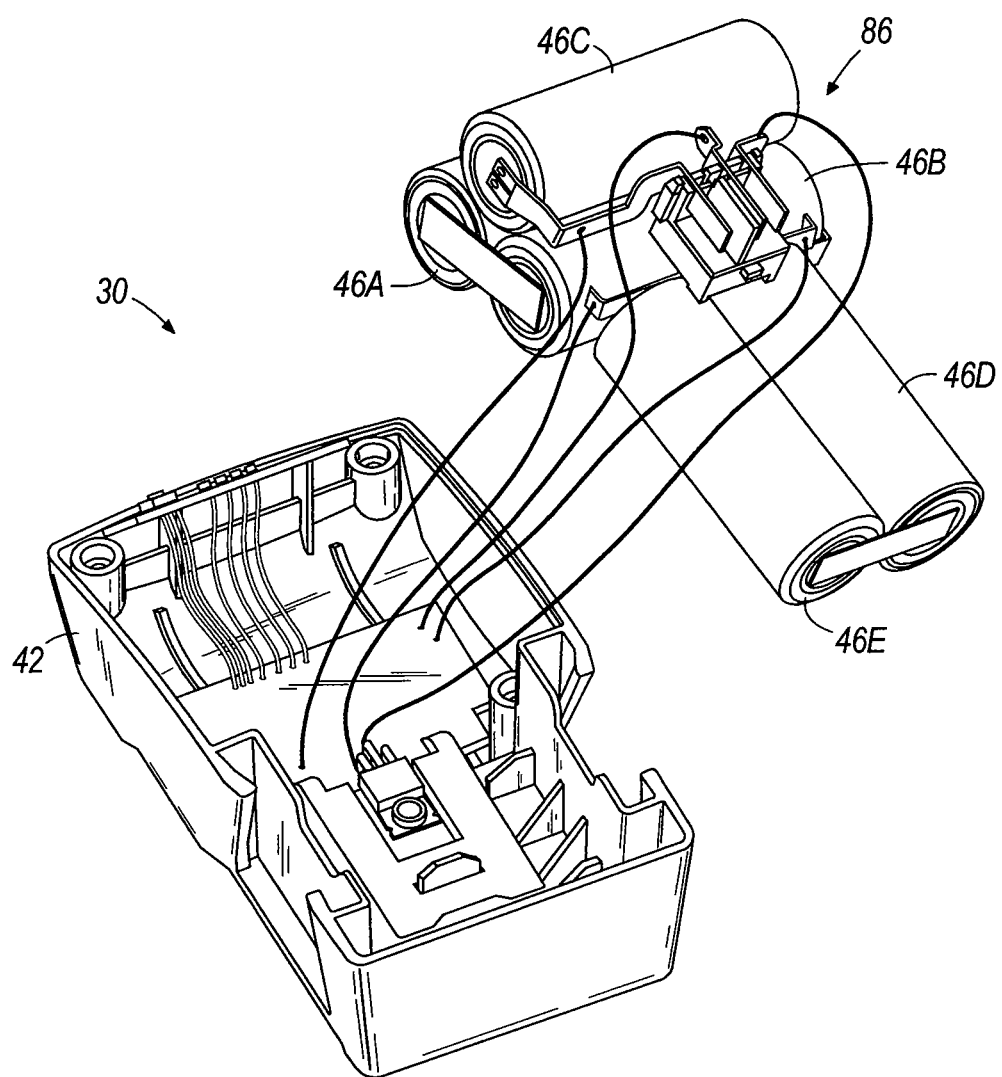
FIG. 29 is an exploded perspective view of a portion of the battery pack shown in FIG. 1 with portions removed.
Figure 30:
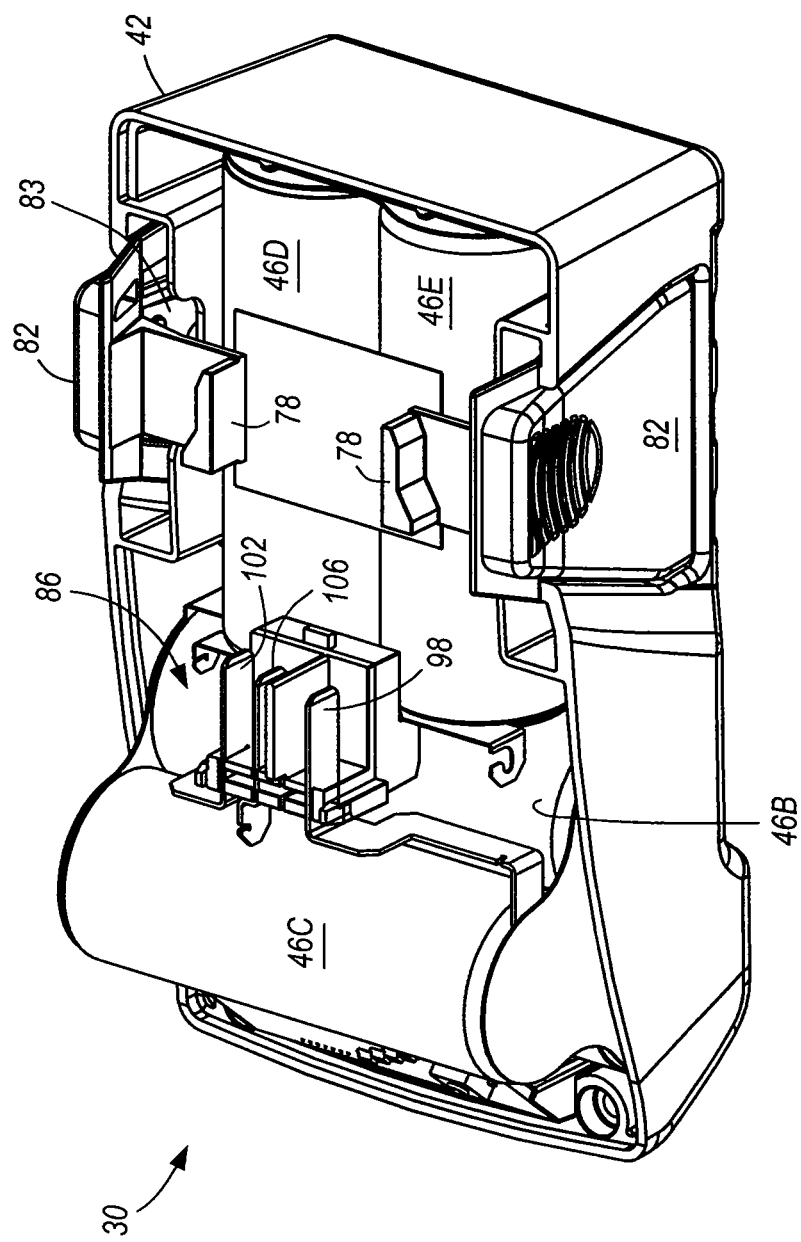
FIG. 30 is a rear perspective view of a portion of the battery pack shown in FIG. 1 with portions removed.
Figure 31:
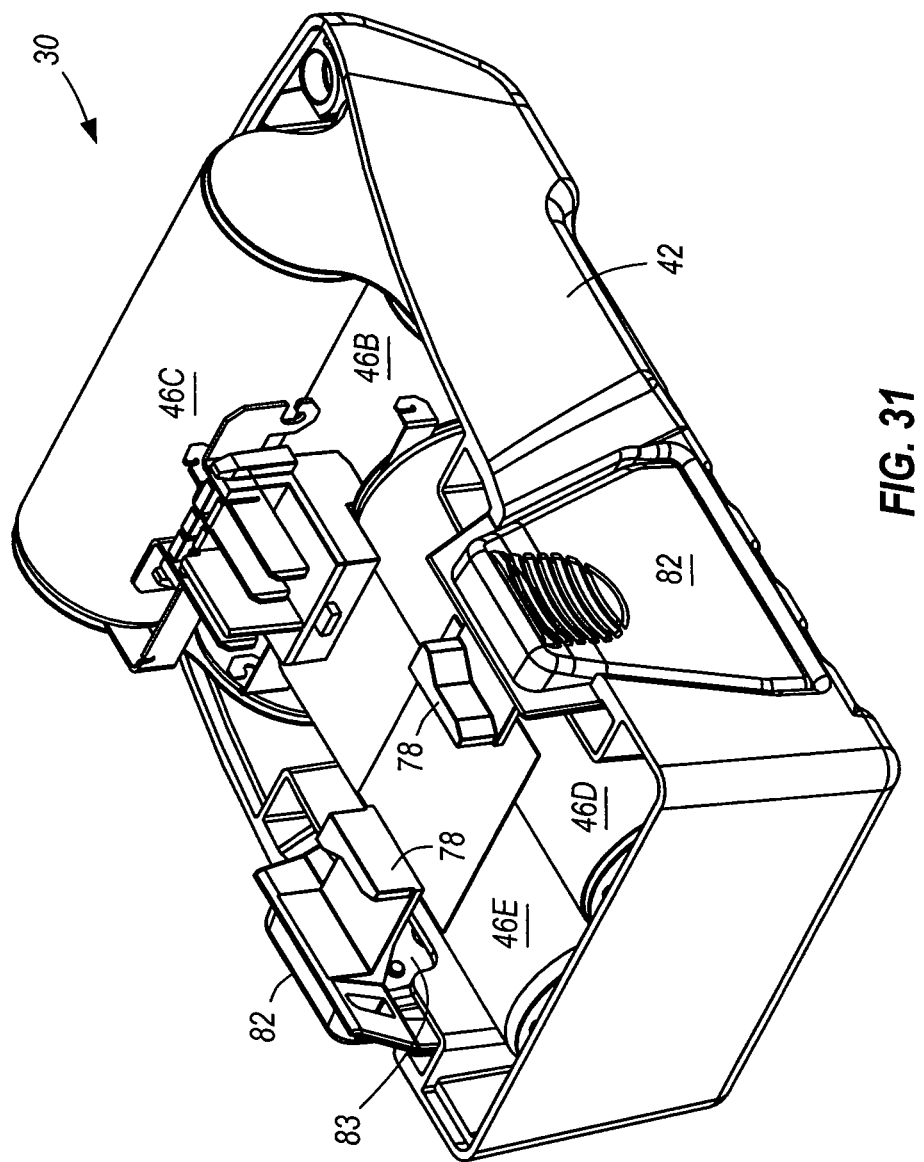
FIG. 31 is another rear perspective view of the portion of the battery pack shown in FIG. 30.

The battery pack 30 includes (see FIGS. 1-5, 7, 13-14 and 17-20) a terminal assembly 86 operable to electrically connect the battery cells 46 to a circuit in the electrical device. The terminal assembly 86 includes (see FIGS. 1-3) a positive battery terminal 98, a ground terminal 102, and a sense terminal 106. As schematically illustrated in FIG. 20, the terminals 98 and 102 are connected to the opposite ends of the cell or series of cells 46.

The sense terminal 106 can be connected to one or more electrical components, such as an identification component (i.e., a resistor) to communicate the identification of a characteristic of the battery pack 30, such as, for example, the chemistry of the battery cells 46, the nominal voltage of the battery pack 30, etc., or a temperature-sensing device or thermistor to communicate the temperature of the battery pack 30 and/or of the battery cell(s) 46. It should be understood that, in other constructions (not shown), the electrical components may be other types of electrical components and may communicate other characteristics or information about the battery pack 30 and/or of the battery cell(s) 46. It should also be understood that "communication" and "communicate", as used with respect to the electrical components, may also encompass the electrical components having or being in a condition or state which is sensed by a sensor or device capable of determining the condition or state of the electrical components.

In some constructions and in some aspects, the sense terminal 106 can be connected to a circuit 430, as shown in FIGS. 21-23 and 68-69. The circuit 430 can be electrically connected to one or more battery cells 46, and can be electrically connected to one or more battery terminals of the terminal block 86. In some constructions, the circuit 430 can include components to enhance the performance of the battery pack 30. In some constructions, the circuit 430 can include components to monitor battery characteristics, to provide voltage detection, to store battery characteristics, to display battery characteristics, to inform a user of certain battery characteristics, to suspend current within the battery 50, to detect temperature of the battery pack 30, battery cells 46, and the like, to transfer heat from and/or within the battery 30, and to provide balancing methods when an imbalance is detected within one or more battery cells 46. In some constructions and in some aspects, the circuit 430 includes a voltage detection circuit, a boosting circuit, a state of charge indicator, and the like. In some constructions, the circuit 430 can be coupled to a print circuit board (PCB) 145. In other constructions, the circuit 430 can be coupled to a flexible circuit 445, as discussed below. In some constructions, the flexible circuit 445 can wrap around one or more cells 46 or wrap around the interior of the housing 42, as discussed below.

In some constructions, the circuit 130 can also include a microprocessor 430. The microprocessor 430 can monitor various battery pack parameters (e.g., battery pack present state of charge, battery cell present state of charge, battery pack temperature, battery cell temperature, and the like), can store various battery pack parameters and characteristics (including battery pack nominal voltage, chemistry, and the like, in addition to the parameters), can control various electrical components within the circuit 130, and can conduct communication with other electrical devices, such as, for example, a power tool, a battery charger, and the like. In some constructions, the microprocessor 430 can monitor each battery cell's present state of charge and can identify when an imbalance occurs (e.g., the present state of charge for a battery cell exceeds the average cell state of charge by a certain amount or drops below the average cell state of charge by a certain amount).

In some constructions and in some aspects, the circuit 430 can include a voltage detection circuit 459. In some constructions, the voltage detection circuit 459 can include a plurality of resistors 460 forming resistor divider networks. As shown in the illustrated construction, the plurality of resistors 460 can include resistors 460a-d. The plurality of resistors 460 can be electrically connected to one or more battery cells 46a-e and to a plurality of transistors 465. In the illustrated construction, the plurality of transistors 465 can include transistors 465a-d. In some constructions, the number of resistors included in the plurality of resistors 460 can equal the number of transistors included in the plurality of transistors 465.

In some constructions, voltage characteristics of the battery pack 30 and/or of the battery cells 46 can be read by the microprocessor 440 through the plurality of resistors 460 when the microprocessor 440 is in the active mode. In some constructions, the microprocessor 440 can initiate a voltage-read event by turning off transistor(s) 470 (i.e., transistor 470 becomes non-conducting). When the transistor(s) 470 is non-conducting, the transistors 465a-d become conducting and voltage measurements regarding the battery pack 30 and/or battery cells 46 can be made by the microprocessor 440. Including the plurality of transistors 465 in the battery pack 30 can reduce the parasitic current draw from the battery pack 30, because the transistors 465 are only conducting periodically.

In some constructions, the microprocessor 440 can monitor the voltage of each battery cell 46 and balance the cell 46 if an imbalance occurs. As previously discussed, the battery pack 30 can include the plurality of resistors 460 for providing voltage measurements of the battery cells 46. The plurality of resistors 460 are arranged such that the microprocessor 440 can measure the voltage of each battery cell 46a-e approximately at the same time. In some constructions, the microprocessor 440 detects an imbalance within the battery pack 30 when one or more cells 46 reach approximately 1 V.

In some constructions and in some aspects, the battery pack 30 may re-balance the cells 46 when an imbalance has been detected via a balancing circuit 459. In some constructions, the battery pack 30 re-balances the battery cells 46 when the battery pack 30 is in a discharging operation or act or when the battery pack 30 is not providing a discharge current or receiving a charge current. In some constructions, the balancing circuit 459 can include the plurality of resistors 460 and the plurality of transistors 465. In some constructions, the microprocessor 440 disables the battery 30 (e.g. interrupts battery operation, prevents battery operation, etc.) via the switch 180 when a balanced ratio R between cells 46 is no longer included within an acceptable range. After the battery pack 30 is disabled, the microprocessor 440 determines which cell(s) 46 is imbalanced (the "low voltage cell").

In some constructions, the microprocessor 440 activates or turns on the respective transistors, such as, for example, transistors 465a-d, that are electrically connected to those cells 46 that are not low in present state of charge (i.e., cells having a higher present state of charge than the low voltage cell). The microprocessor 440 begins a controlled discharge of the high present state of charge cells 46. For example, the microprocessor will control the small discharge current that will flow from the balanced cells 46 through the respective transistors. The microprocessor 440 will continue to make voltage measurements of the cells 46 throughout the controlled discharging process. The microprocessor 440 will end the controlled discharge process when the present state of charge of the higher state of charge cells 46 is reduced to be approximately equal to the previously low voltage cell.

Components of the circuit 430 and of the battery pack 30, such as, for example, a FET 480, a heat sink 485, a thermistor 450, a fuel gauge 170 (including one or more light-emitting diodes 470a-d), a push-button 460 for activating the fuel gauge 470, a microprocessor 440, and the like, are illustrated in more detail in FIGS. 20-29. For some constructions and for some aspects, these and other additional independent features and structure of the battery pack 30 and other operations of the battery pack 30 are described in more detail in U.S. patent application Ser. No. 10/720, 027, filed Nov. 20, 2003, and Ser. No. 11/138,070, filed May 24, 2005.

Figure 1:
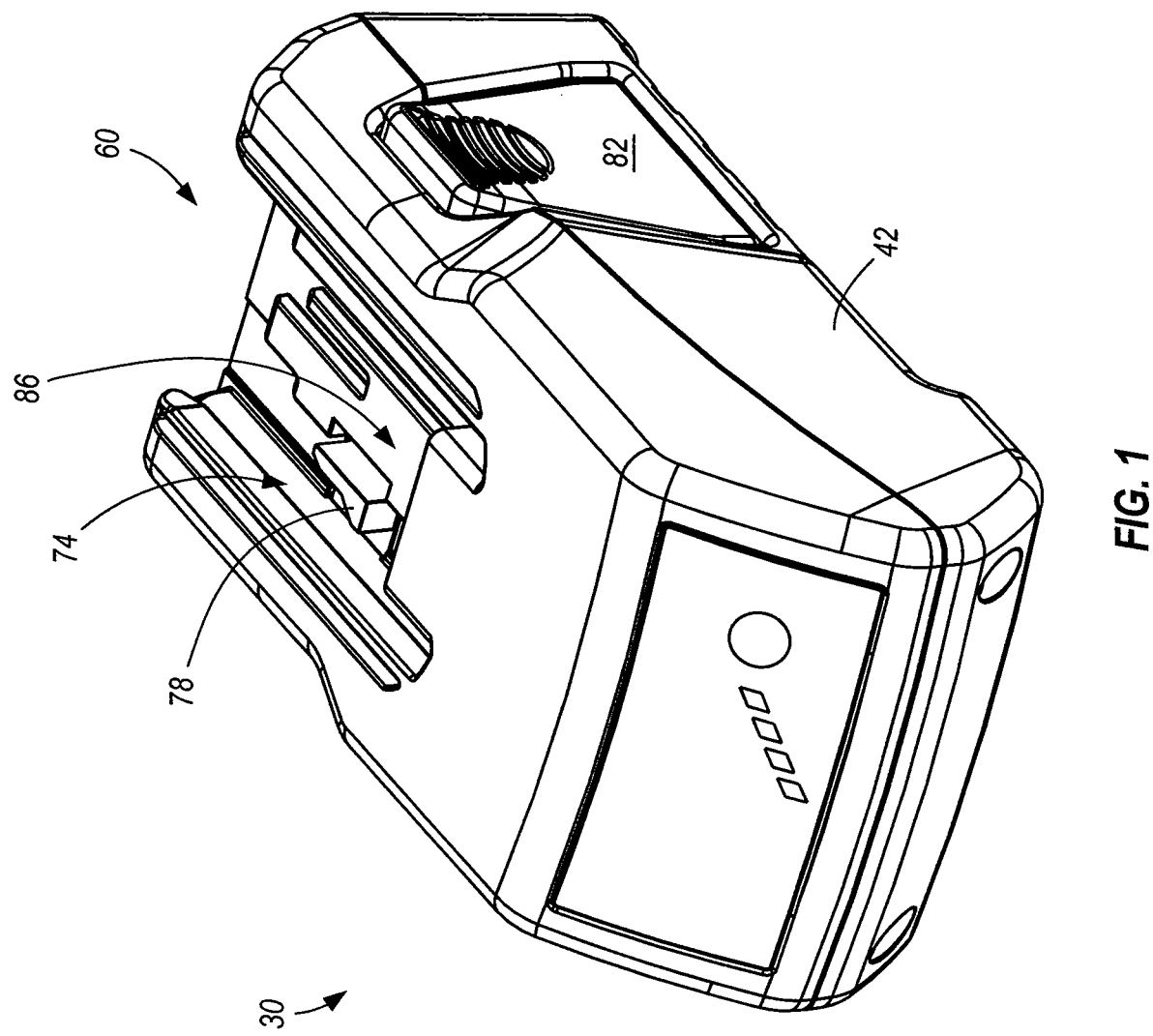
FIG. 1 is a front perspective view of a battery.
Figure 2:
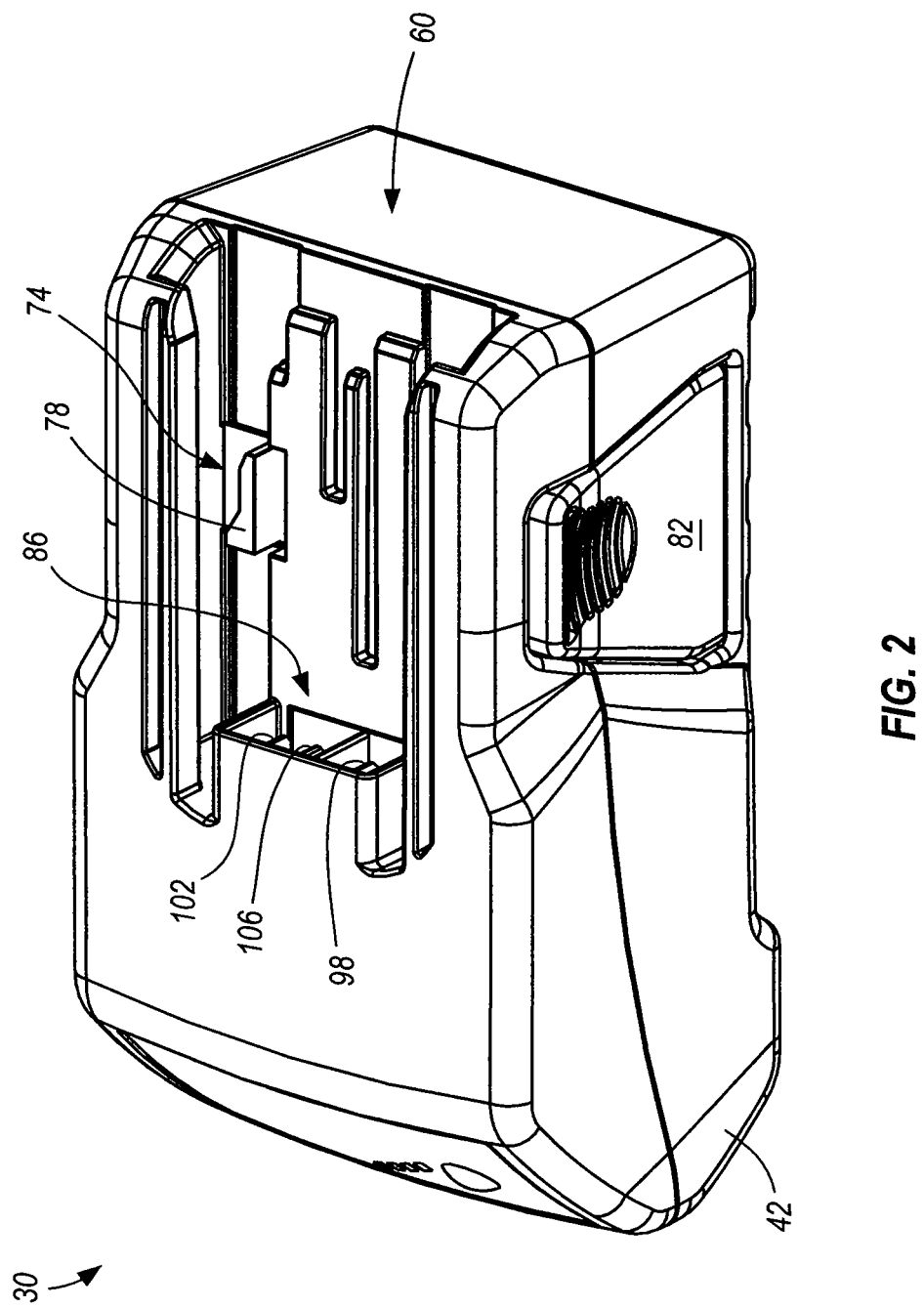
FIG. 2 is a top rear perspective view of the battery pack shown in FIG. 1.
Figure 3:
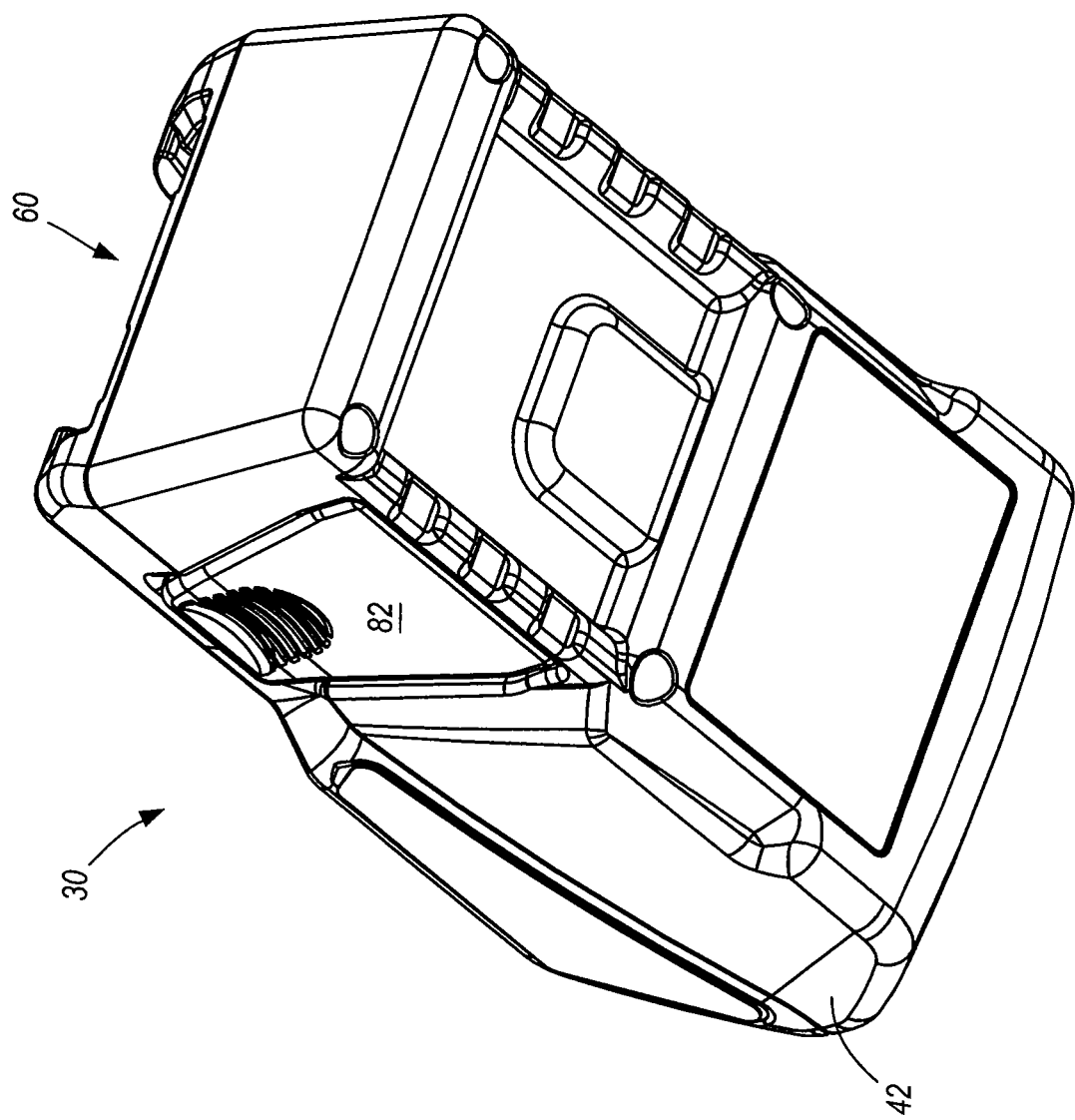
FIG. 3 is a bottom rear perspective view of the battery pack shown in FIG. 1.
Figure 4:
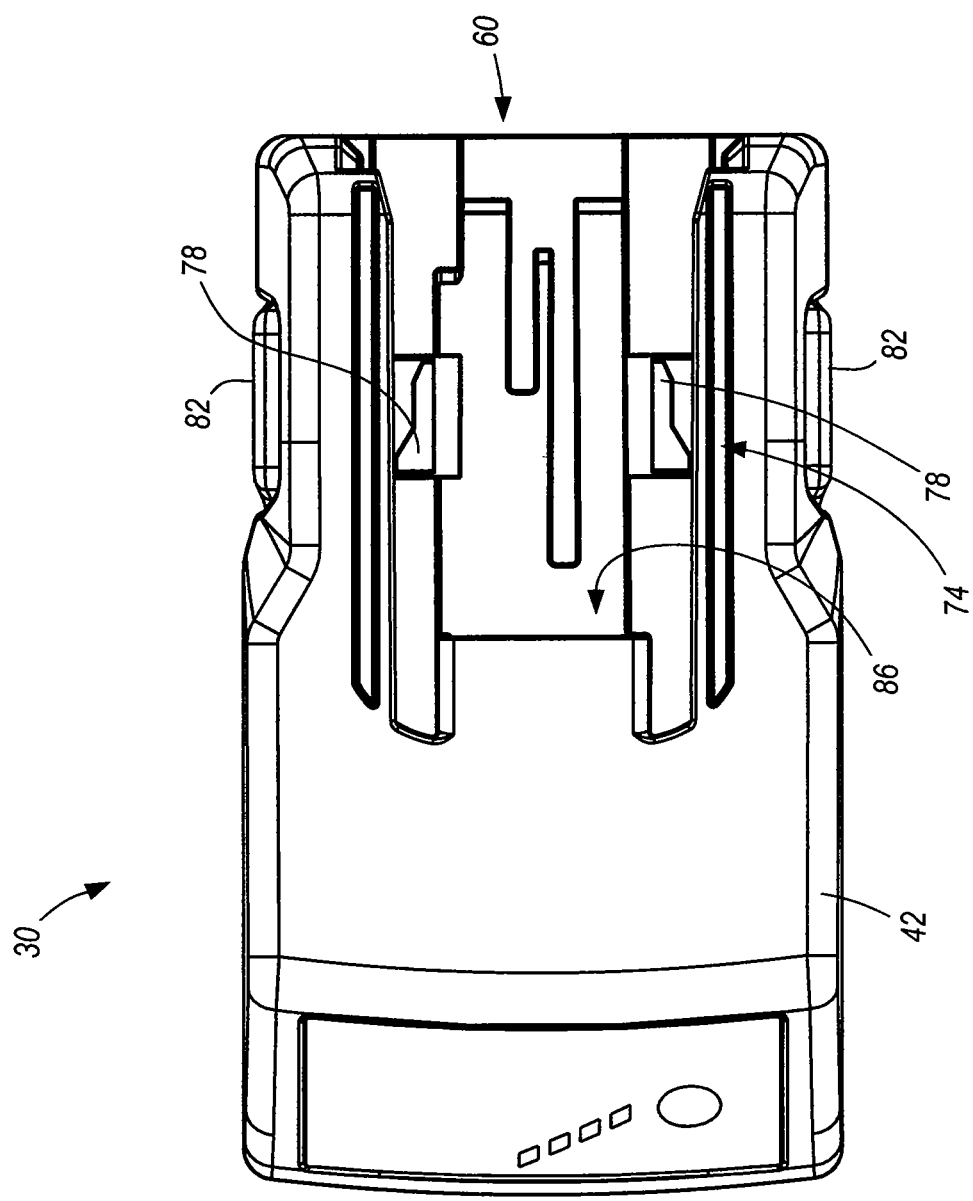
FIG. 4 is a top view of the battery pack shown in FIG. 1.
Figure 5:
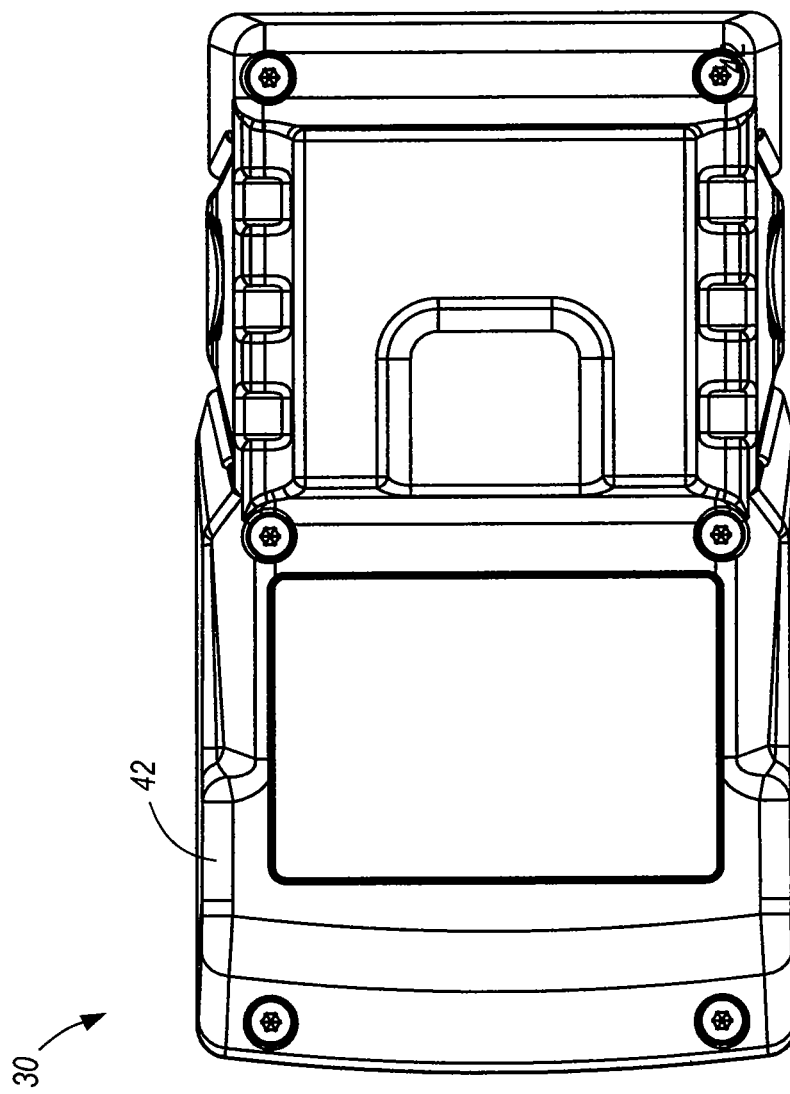
FIG. 5 is a bottom view of the battery pack shown in FIG. 1.
Figure 6:
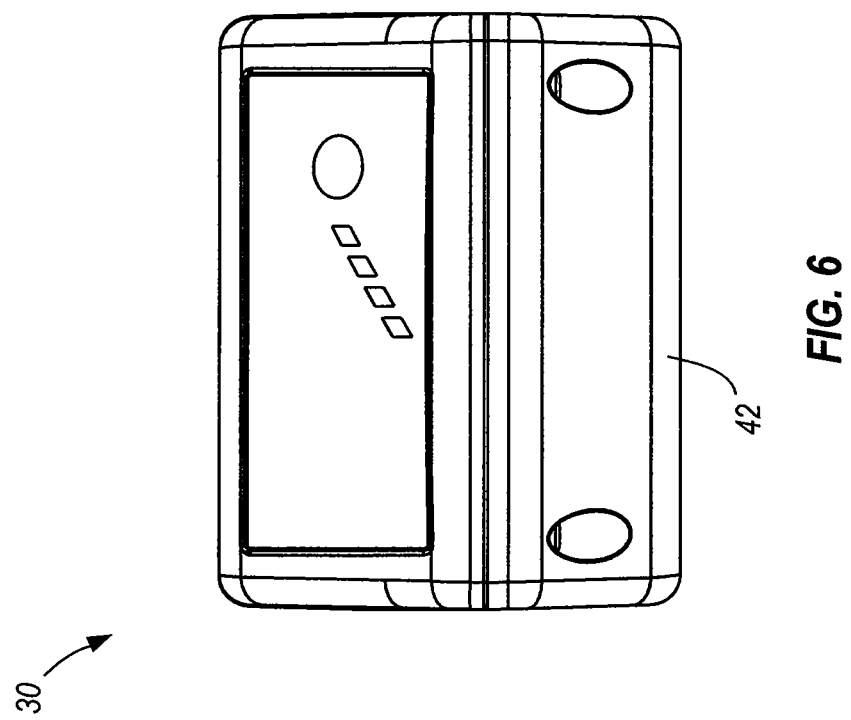
FIG. 6 is a front view of the battery pack shown in FIG. 1.
Figure 7:
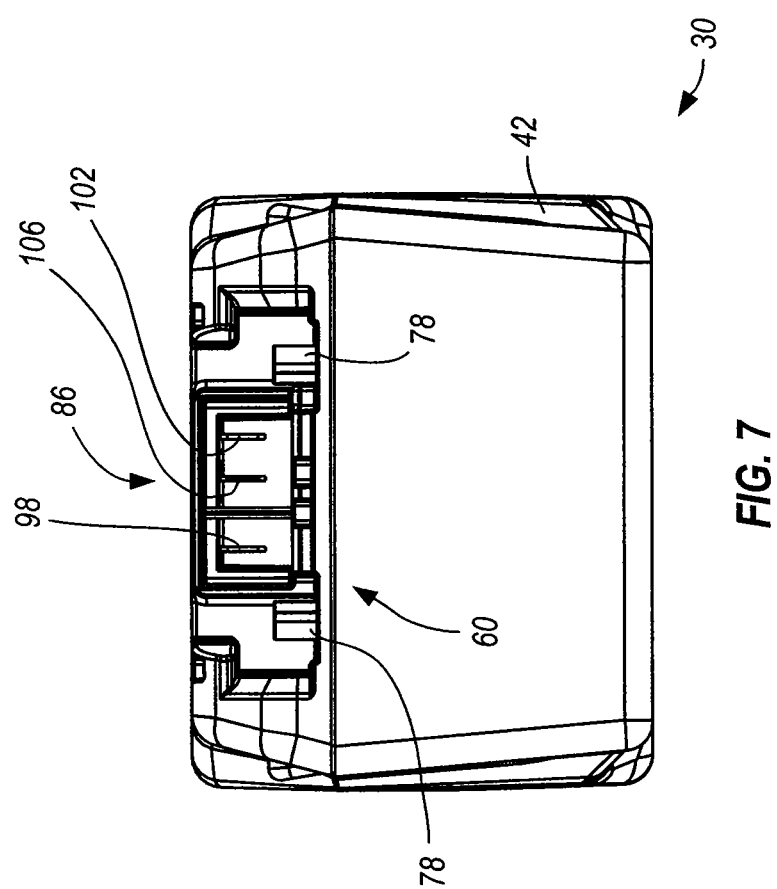
FIG. 7 is a rear view of the battery pack shown in FIG. 1.
Figure 8:
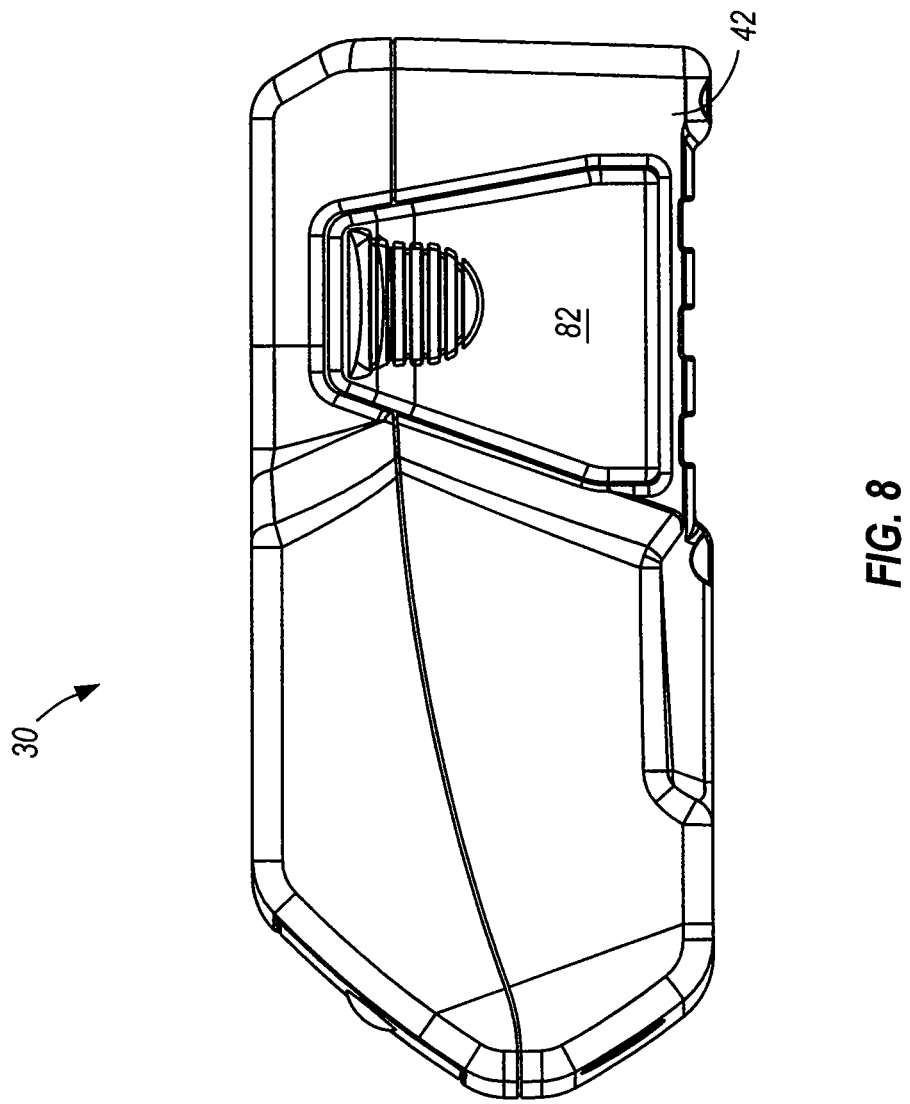
FIG. 8 is a right side view of the battery pack shown in FIG. 1.
Figure 9:
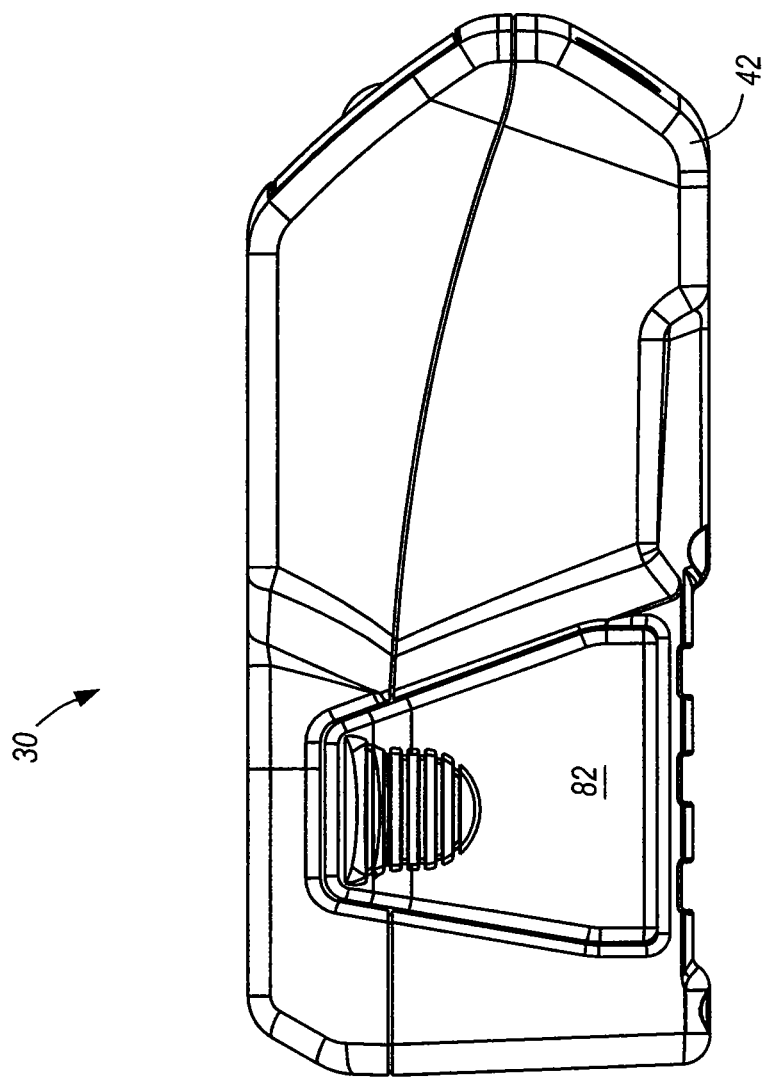
FIG. 9 is a left side view of the battery pack shown in FIG. 1.
Figure 12:
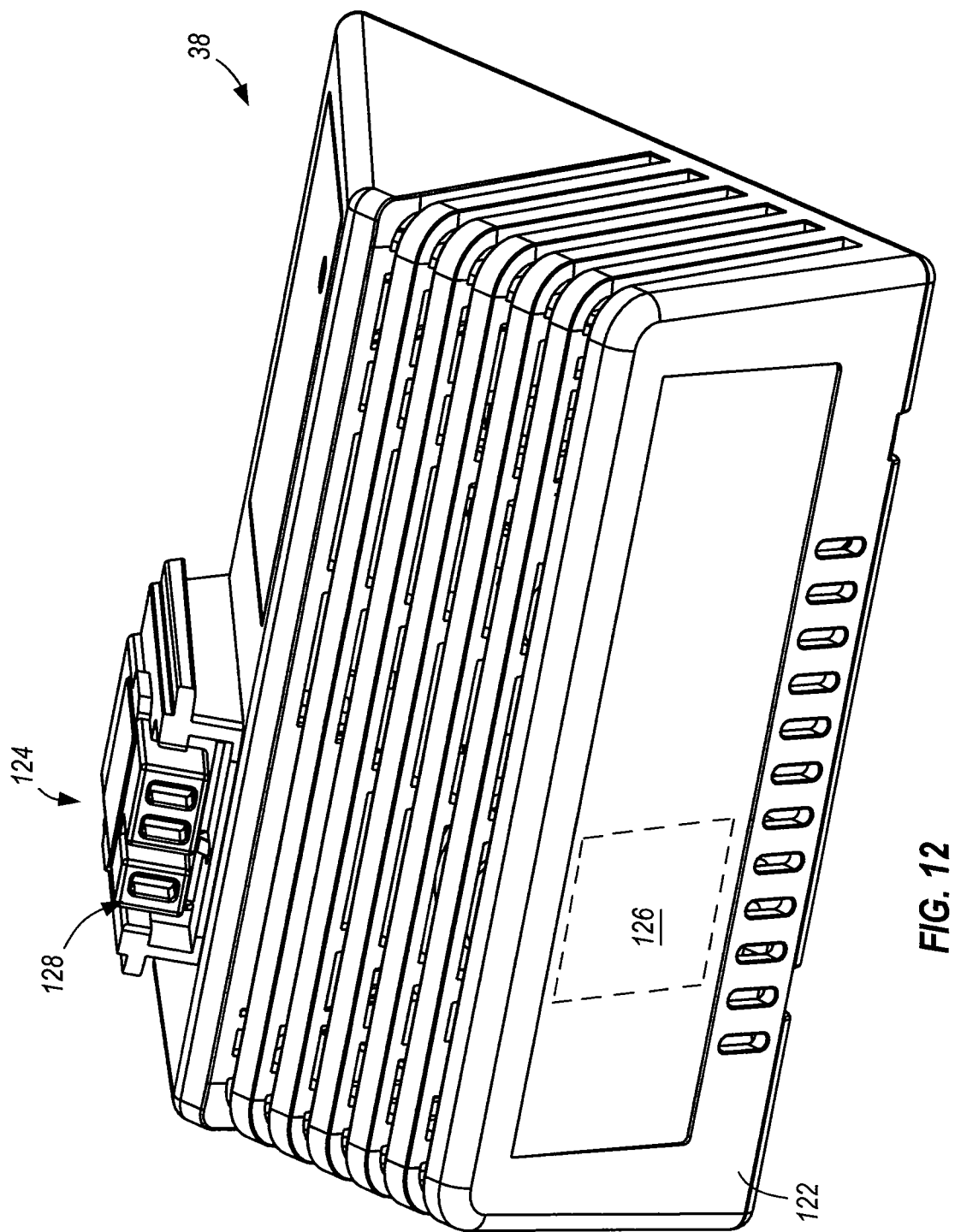
FIG. 12 is a perspective view of an electrical device, such as a battery charger, for use with the battery pack shown in FIG. 1.
Figure 13:
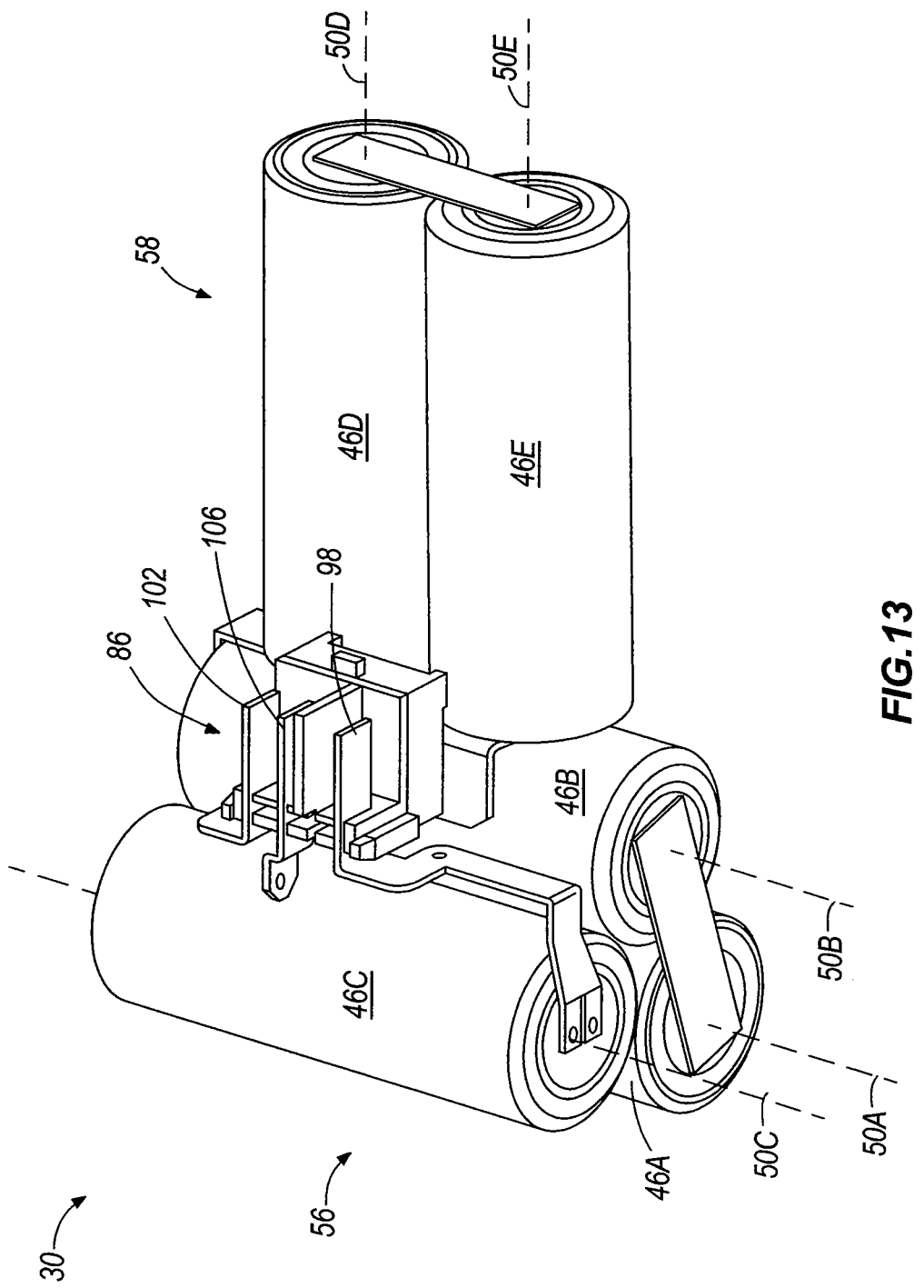
FIG. 13 is a perspective view of a portion of the battery pack shown in FIG. 1 and illustrating the battery cells and the battery terminal assembly.
Figure 14:
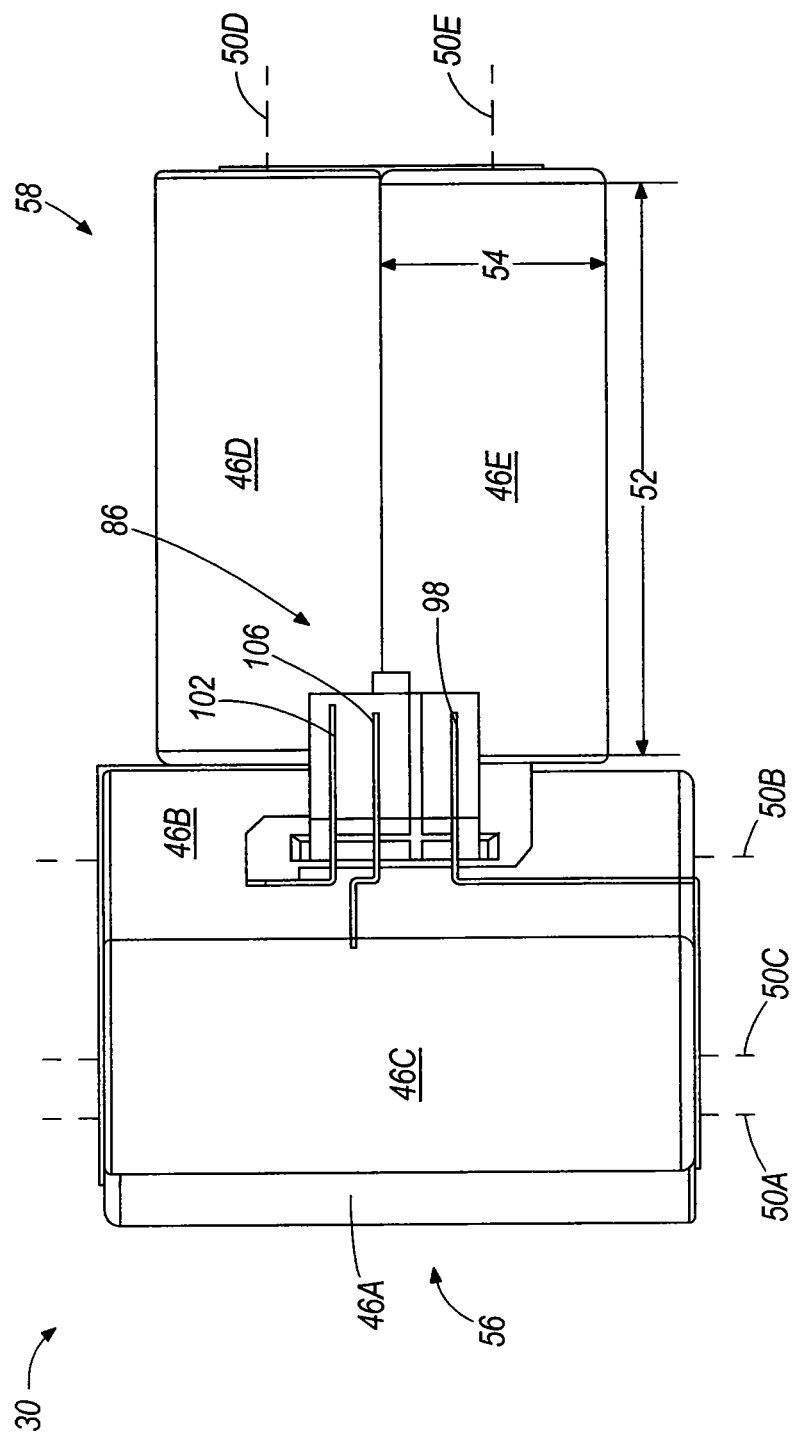
FIG. 14 is a top view of the battery cells and the battery terminal assembly shown in FIG. 13.
Figure 15:
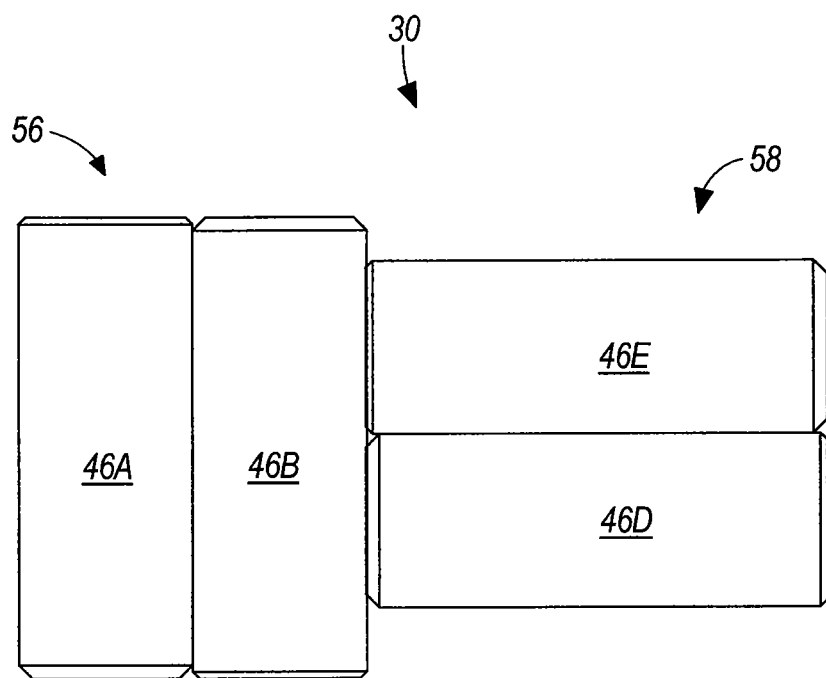
FIG. 15 is a bottom view of the battery cells and the battery terminal assembly shown in FIG. 13.
Figure 16:
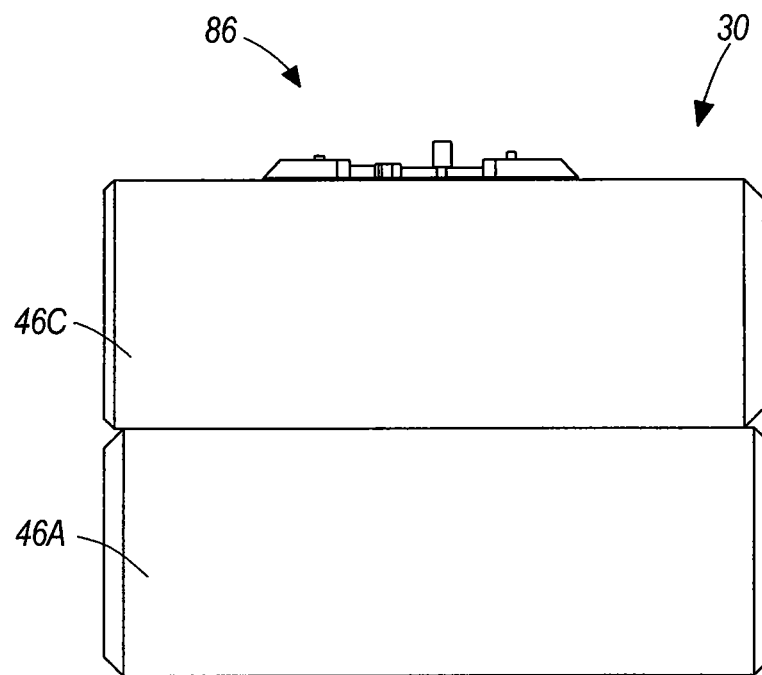
FIG. 16 is a front view of the battery cells and the battery terminal assembly shown in FIG. 13.
Figure 17:
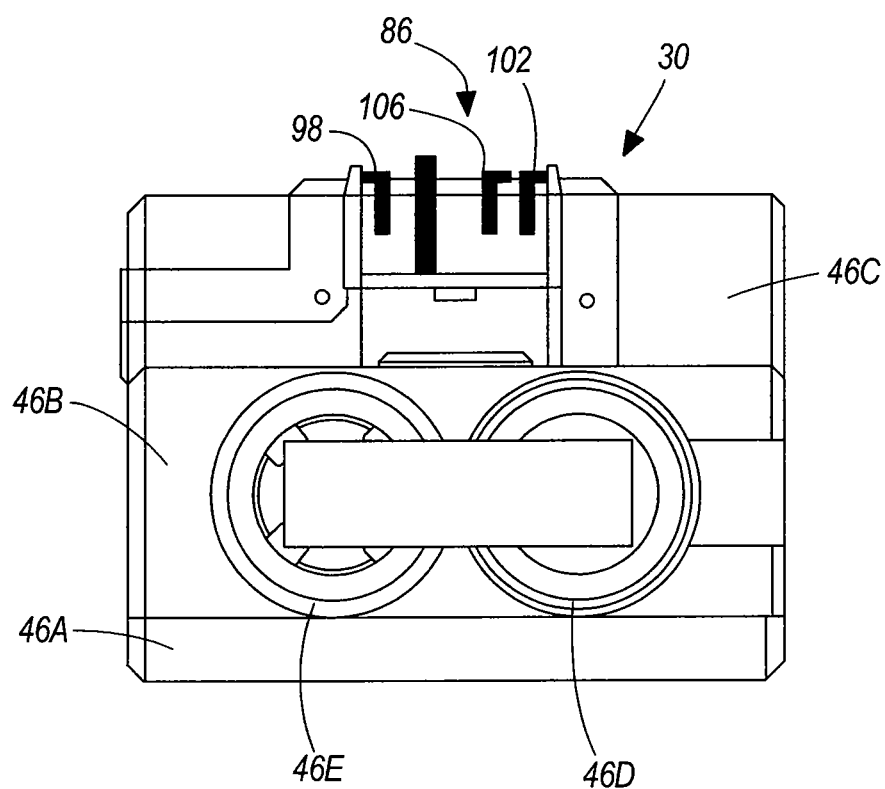
FIG. 17 is a rear view of the battery cells and the battery terminal assembly shown in FIG. 13.
Figure 18:
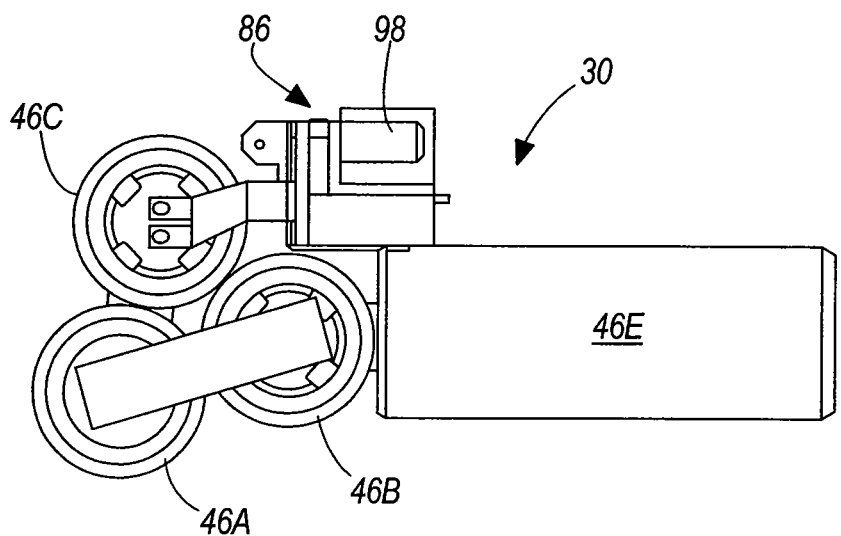
FIG. 18 is a right side view of the battery cells and the battery terminal assembly shown in FIG. 13.
Figure 19:
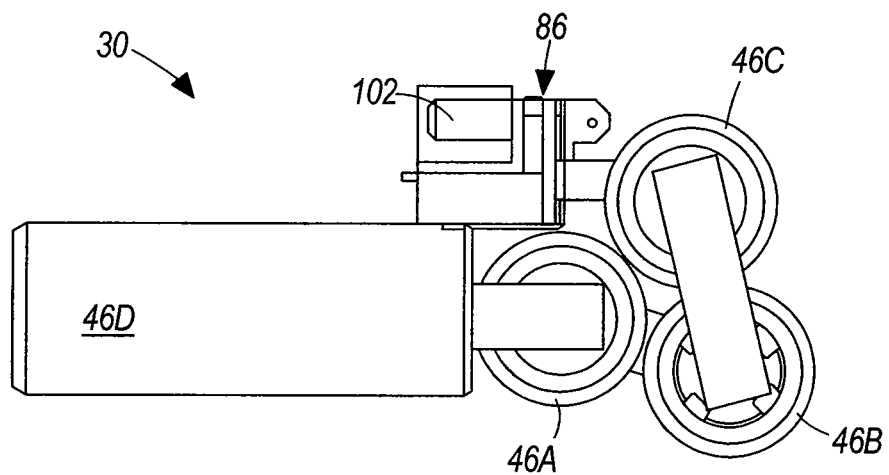
FIG. 19 is a left side view of the battery cells and the battery terminal assembly shown in FIG. 13.

As shown in FIG. 8, the battery charger 38 is connectable to the battery pack 30 and is operable to charge the battery pack 30. The battery charger 38 includes a charger housing 122 providing a support portion 124, on which the battery pack 30 is supported, and a charging circuit 126 (schematically illustrated in FIG. 12) is supported by the housing 122 and connectable to a power source (not shown). The charging circuit 126 is connectable by a charger terminal assembly 128 to the terminal assembly 86 of the battery pack 30 and is operable to transfer power to the battery pack 30 to charge the battery cell(s) 46.

In some constructions and in some aspects, the charging circuit 126 operates to charge the battery pack 30 in a manner similar to that described in U.S. Pat. No. 6,456,035, issued Sep. 24, 2002, and U.S. Pat. No. 6,222,343 on Apr. 24, 2001, which are hereby incorporated by reference.

For some constructions and for some aspects, additional independent features, structure and operation of the battery charger 38 are described in more detail in U.S. patent application Ser. No. 10/720,027, filed Nov. 20, 2003, Ser. No. 10/719,680, filed Nov. 20, 2003, Ser. No. 11/138,070, filed on May 24, 2005, and Ser. No. 11/139,020, filed on May 24, 2005.

Figure 11B:
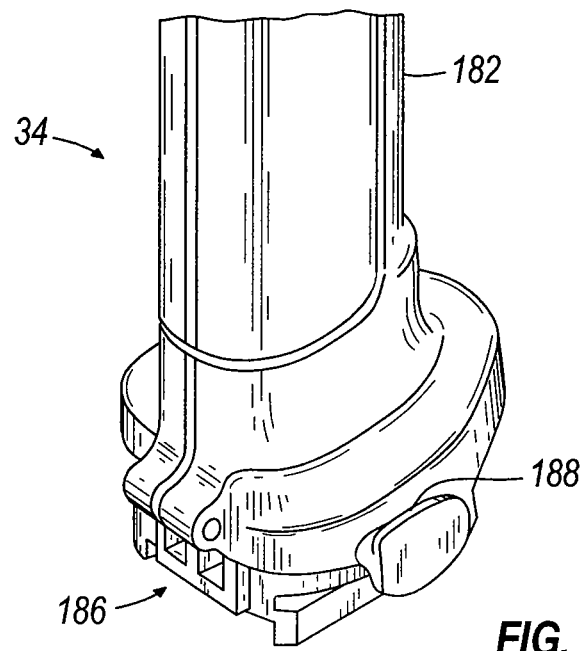
FIG. 11B is a perspective view of the support portion of the power tool shown in FIG. 11A.

The battery pack 30 is connectable to electrical equipment, such as, for example, the power tool 34 (shown in FIG. 11A), to power the power tool 34. The power tool 34 includes a housing 182 supporting an electric motor 184 (schematically illustrated) which is electrically connected to the battery pack 30 by (see FIG. 11B) a power tool terminal assembly 186 so that the motor 184 is selectively powered by the battery pack 30. The housing 182 provides (see FIG. 11B) a support portion 186 on which the battery pack 30 is supported. The support portion 186 has a generally T-shaped cross section which is complementary to the C-shaped cross section of the support portion 60 of the battery pack 30. The support portion 186 also defines locking recesses 188 (one shown) in which the locking members 78 are engageable to lock the battery pack 30 to the power tool 34.

Figure 10:
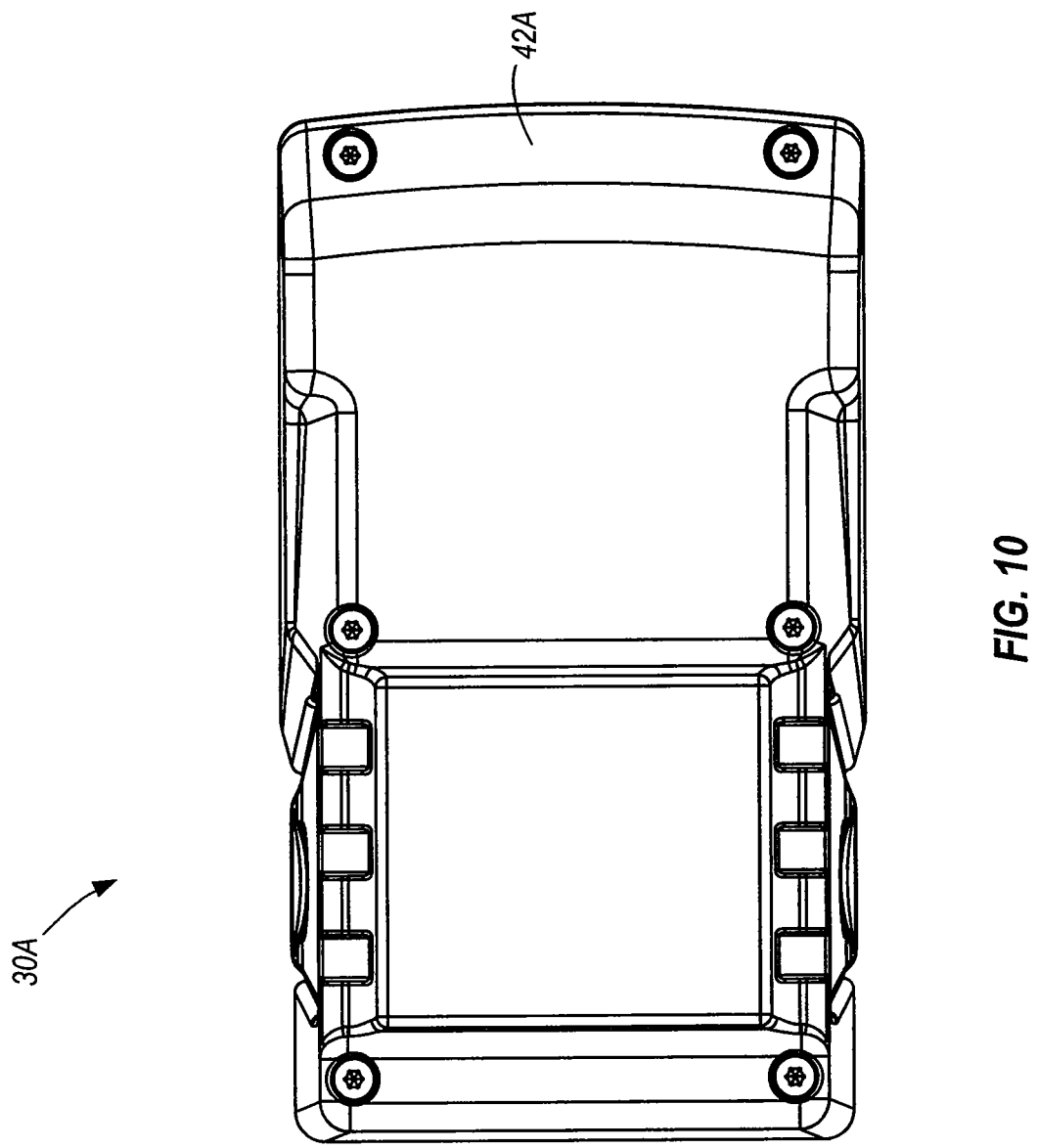
FIG. 10 is a bottom view of an alternate construction of a battery pack embodying aspects of the present invention.

An alternative construction of a battery pack 30A embodying aspects of the invention is illustrated in FIG. 10. Common elements are identified by the same reference number "A".

As stated previously, the battery pack 30 can include more or fewer battery cells 46 than the embodiment shown, and can have a higher or lower nominal voltage than in the constructions shown and described. For example, one such construction of a battery pack 30B having a higher nominal voltage is shown in FIGS. 41-47. Common elements are identified by the same reference number "B". A further construction of a battery pack 30C is shown in FIGS. 48-54. Common elements are identified by the same reference number "C".

Unless specified otherwise, hereinafter, battery pack 30 can refer to the various constructions of battery pack 30 (e.g., battery pack 30, battery pack 30A, battery pack 30B, and battery pack 30C). Also, unless specified otherwise, battery pack 30B can refer to both battery pack 30B and battery pack 30C.

Figure 55:
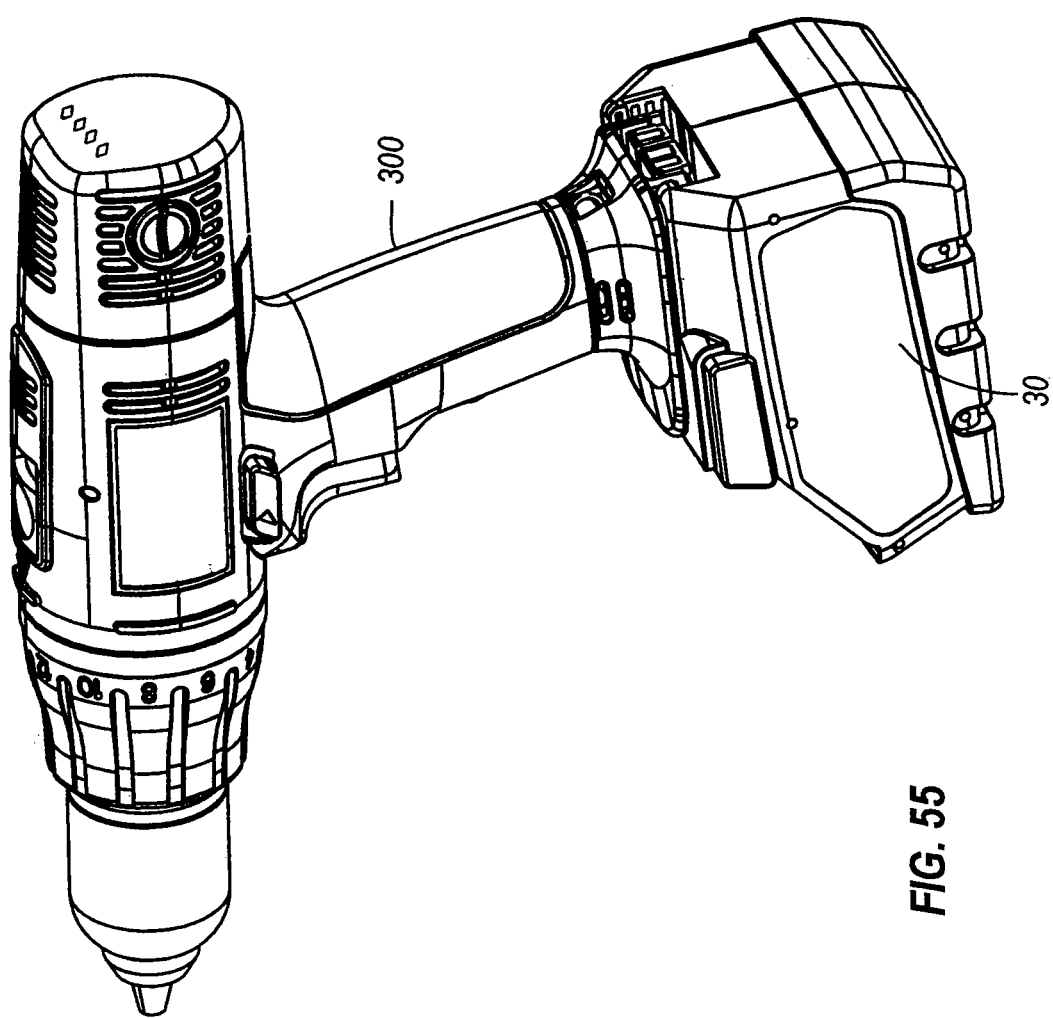
FIG. 55 is a perspective view of a battery pack in use with a first electrical device, such as a power tool.
Figure 56:
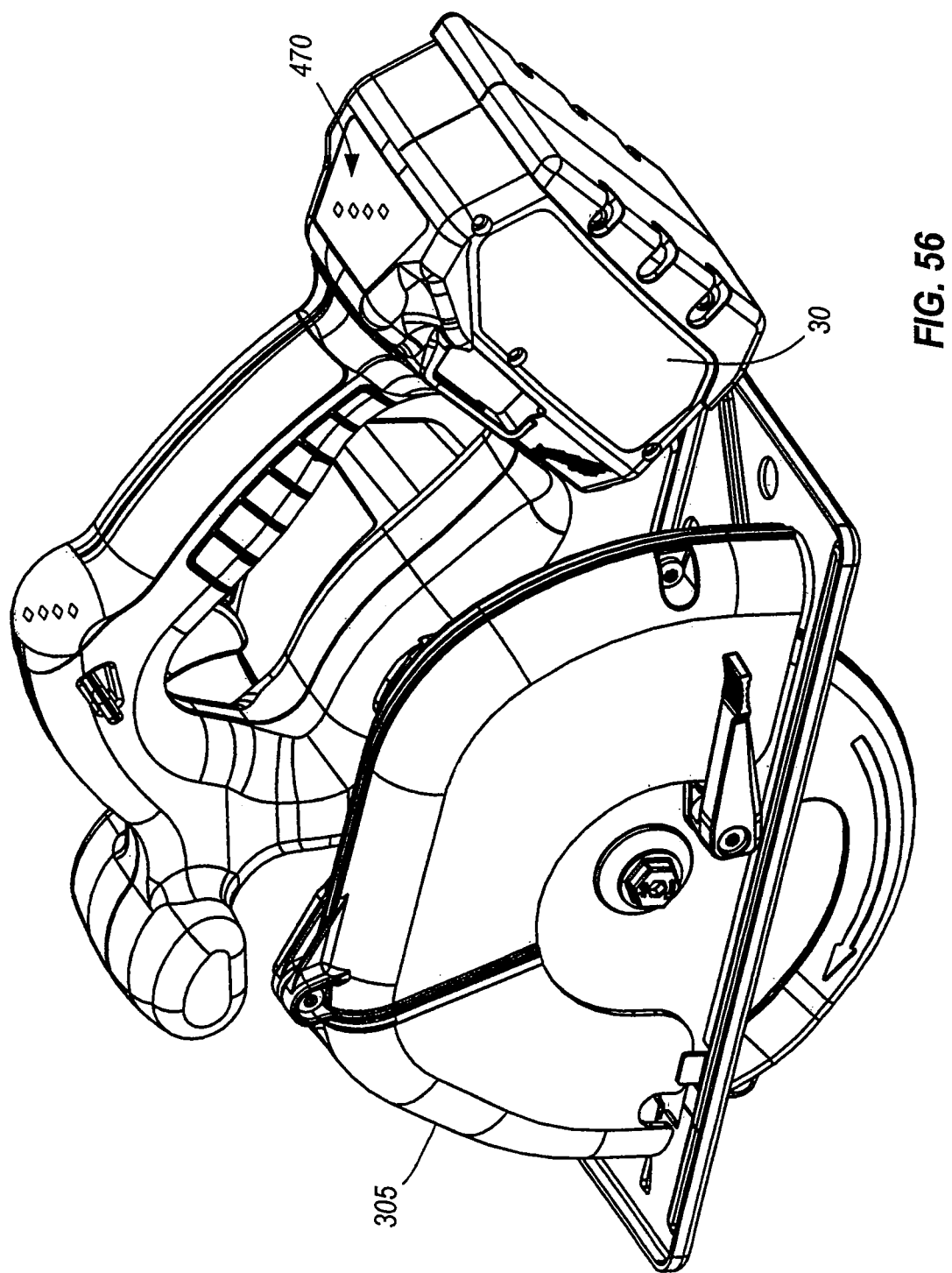
FIG. 56 is a perspective view of a battery pack in use with a second electrical device, such as a power tool.

In some constructions, the battery pack 30 can be configured for transferring power to and receiving power from various electrical devices, such as, for example, various power tools, battery chargers, and the like. In other constructions, the battery pack 30 can be configured for transferring power to various high-power electrical devices, such as, for example: various power tools and including electrically powered tools used in manufacturing and assembly; lawn and garden equipment and including tools used in agricultural applications; portable lighting, signaling devices, and flashlights; motorized vehicles including electrically powered scooters, mopeds, motorized carts, and the like; vacuum cleaners and other electrically powered household and commercial applications, tools, and devices; electrically powered toys; remote-controlled airplanes, automobiles, and other vehicles as well as auxiliary motors and the like. In some constructions, such as, for example, the constructions illustrated in FIGS. 55 and 56, the battery pack 30 can supply power to various power tools, such as, a driver drill 300, a circular saw 305, band saw (not shown), grinder (not shown) and the like. In some constructions, the battery pack 30 can power various power tools (including a driver drill 300 and a circular saw 305) having high discharge current rates. For example, the battery pack 30 can supply an average discharge current that is equal to or greater than approximately 20 A, and can have an ampere-hour capacity of approximately 3.0 A-h. In other constructions, the battery pack 30 can supply an average discharge current that is equal to or greater than approximately 10 A. In further constructions, the battery pack 30 can supply an average discharge current that is equal to or greater than approximately 15 A. In still further constructions, the battery pack 30 can have a different ampere-hour capacity, such as, for example, approximately 2.5 A-h or approximately 2.8 A-h for battery cells 46 arranged in series or approximately 1.3 A-h or approximately 1.5 A-h for battery cells 46 arranged in parallel.

Figure 57:
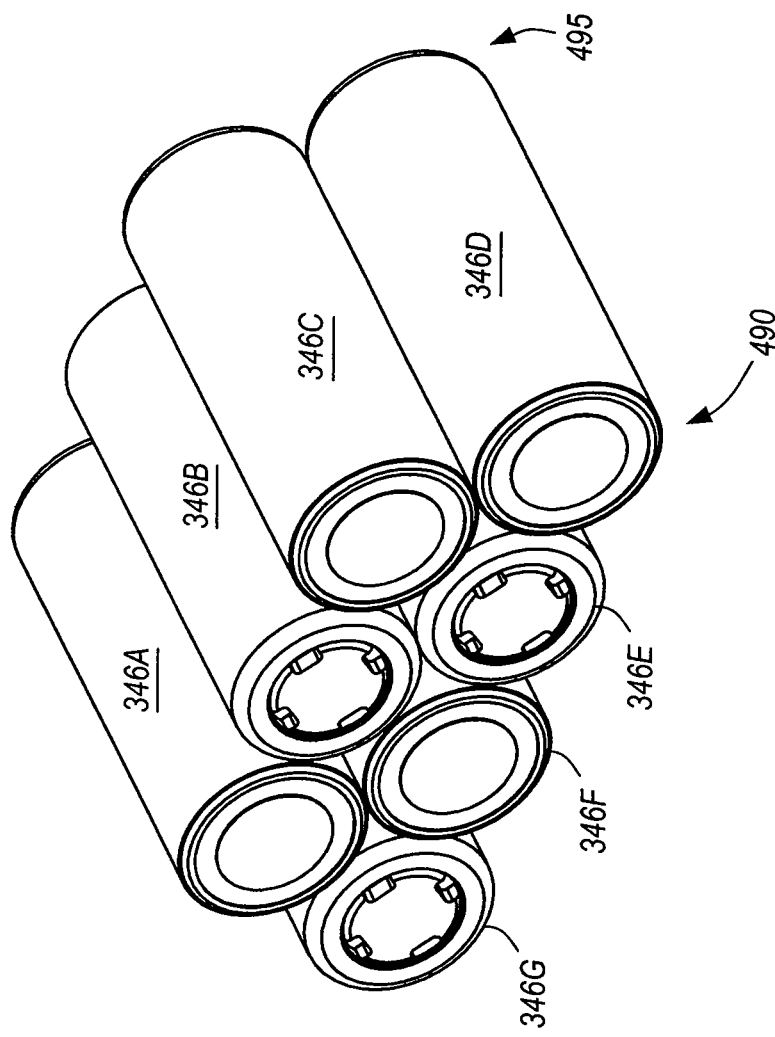
FIG. 57 is a perspective view of a portion of a battery pack and illustrating the battery cells.
Figure 58:
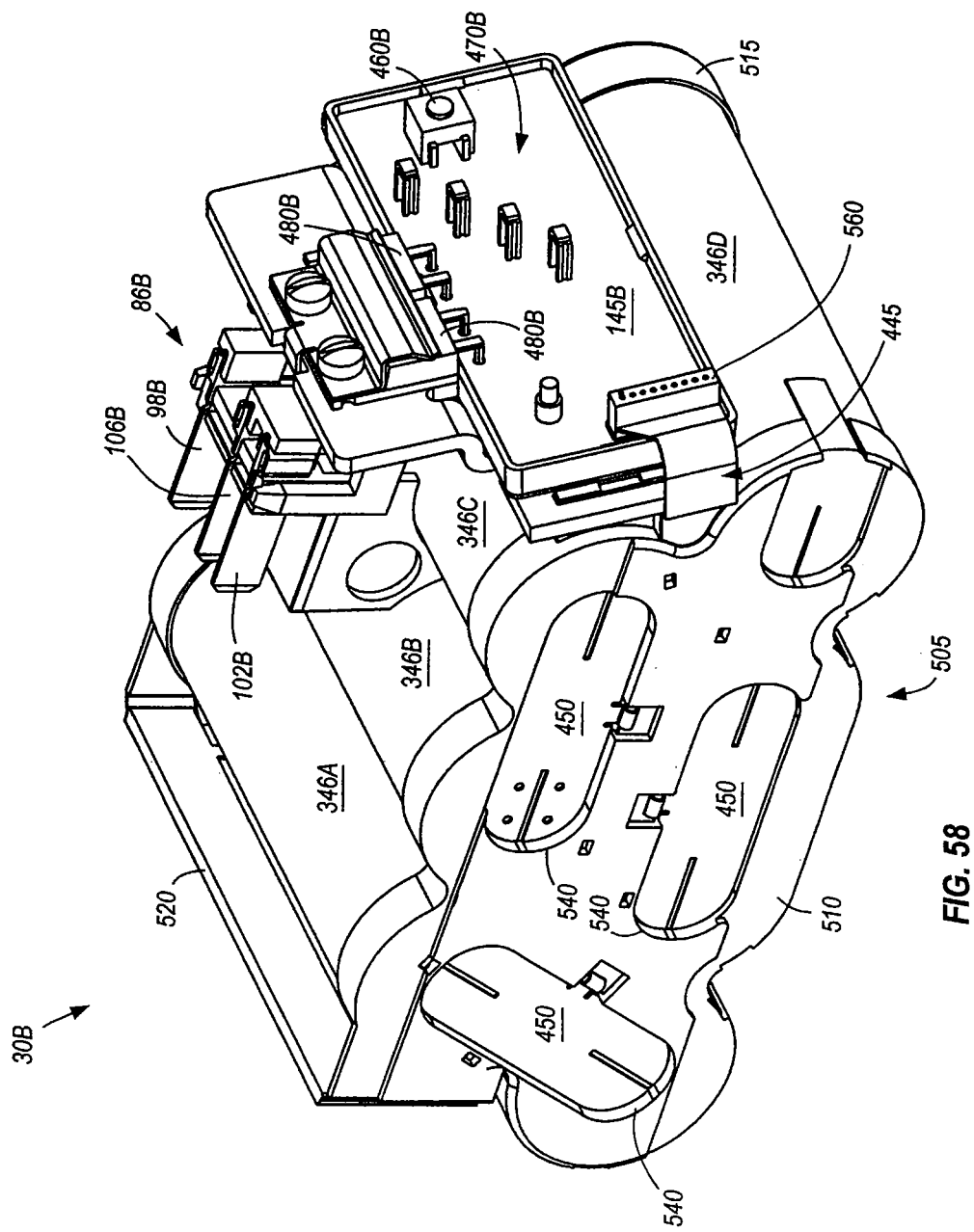
FIG. 58 is a perspective view of a portion of a battery pack and illustrating the battery cells, terminals, end caps and circuitry.
Figure 59:
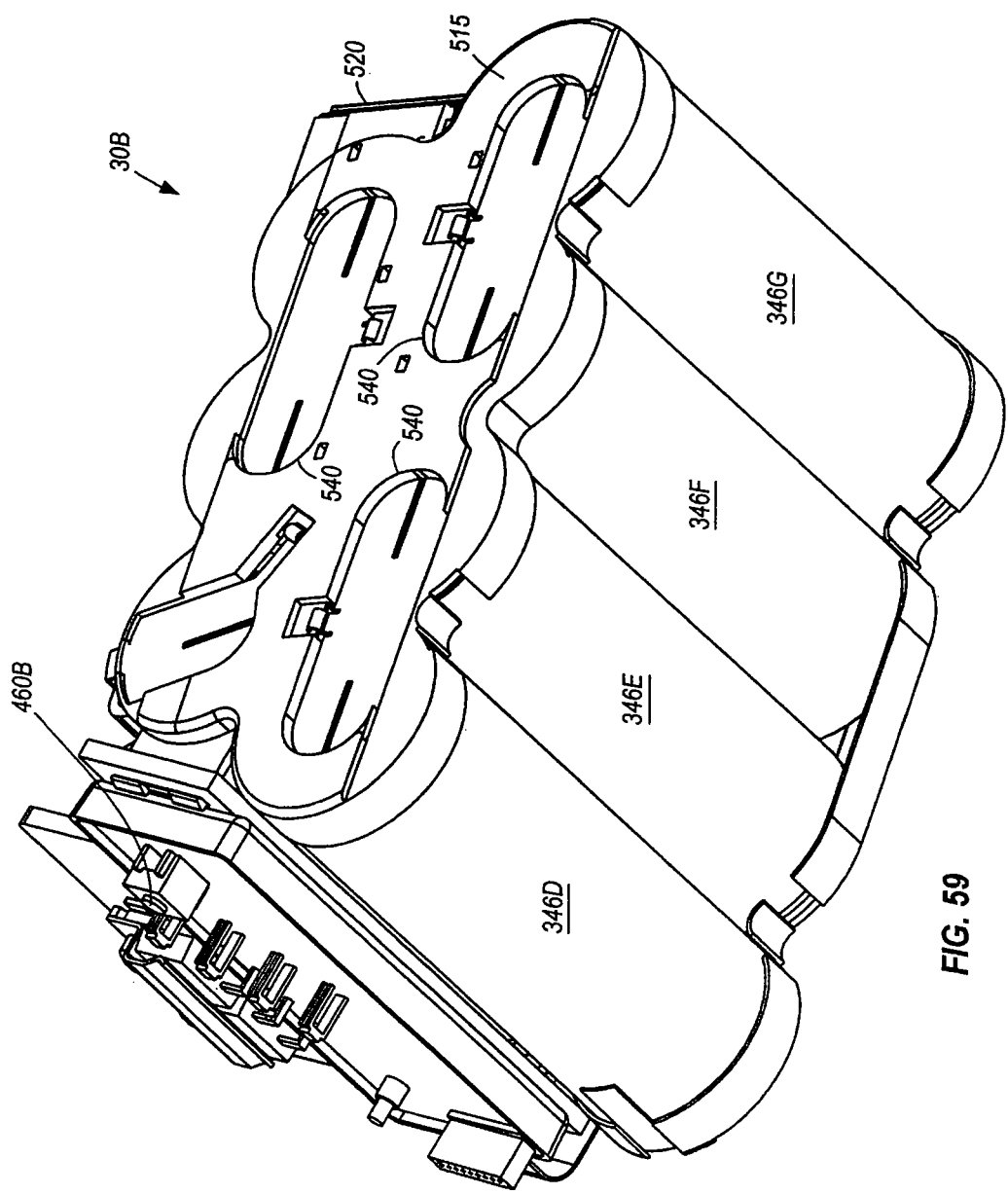
FIG. 59 is a rear perspective view of the portion of the battery pack shown in FIG. 58.
Figure 60:
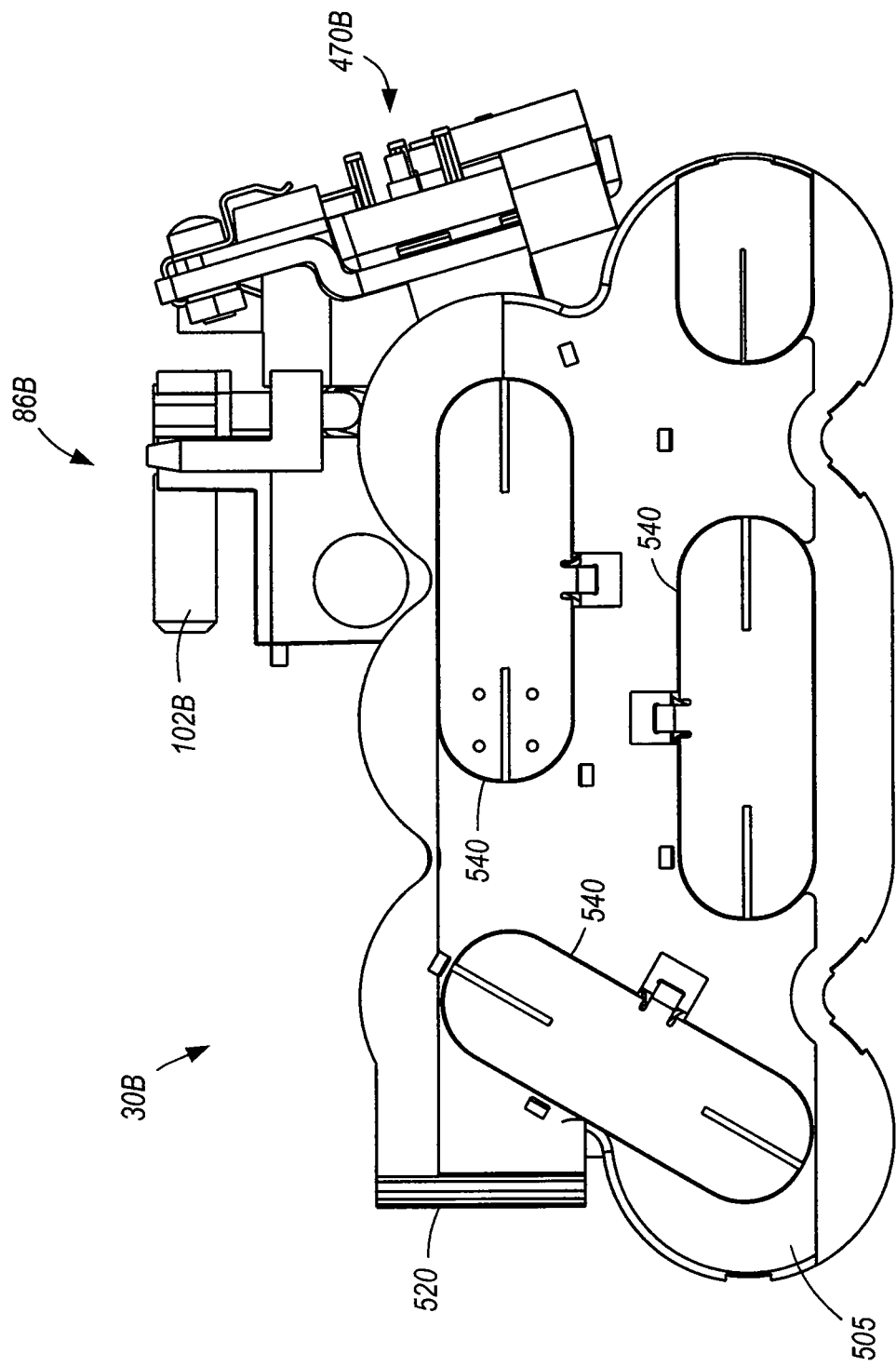
FIG. 60 is a right side view of the portion of the battery pack shown in FIG. 58.
Figure 61:
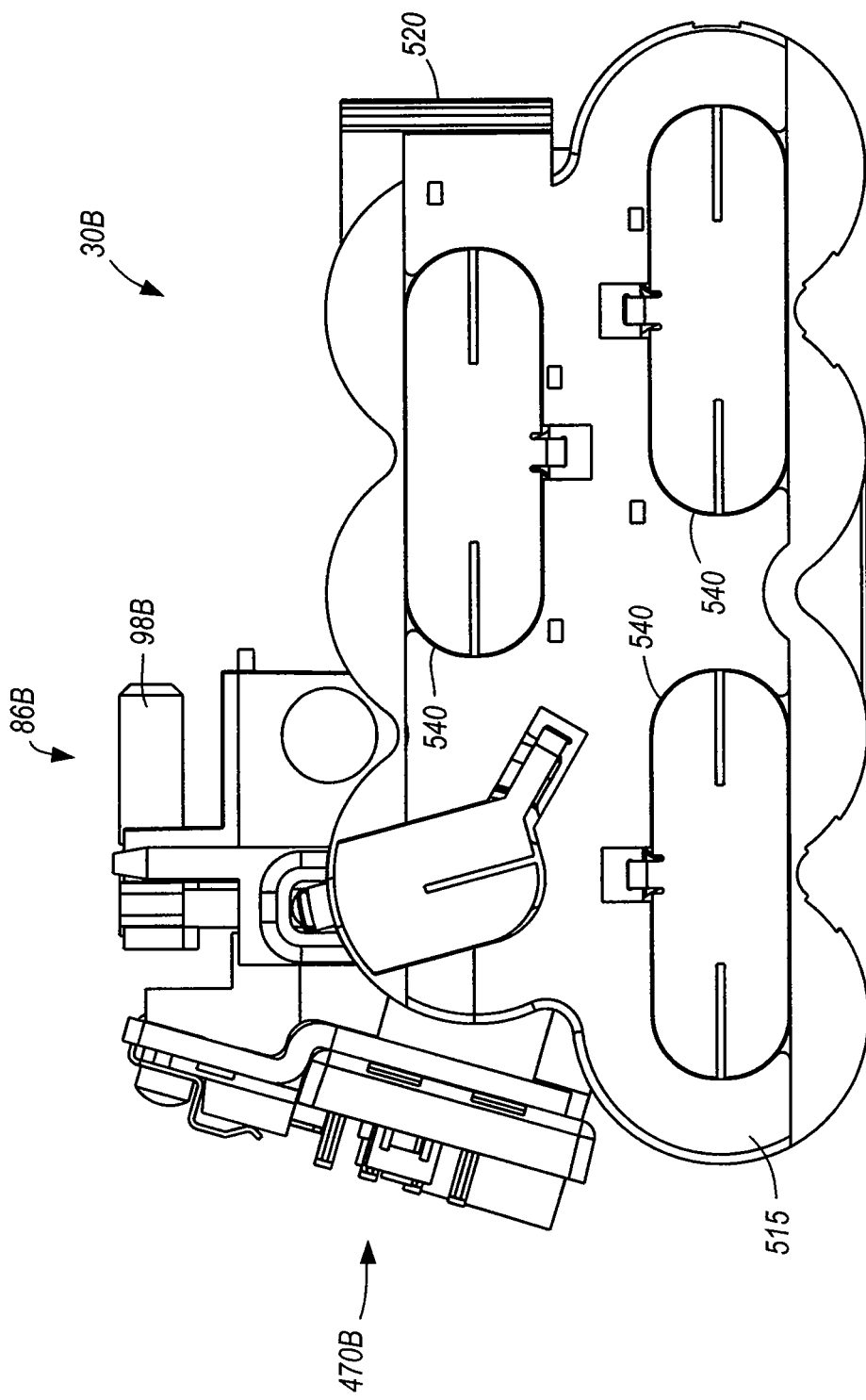
FIG. 61 is a left side view of the portion of the battery pack shown in FIG. 58.
Figure 62:
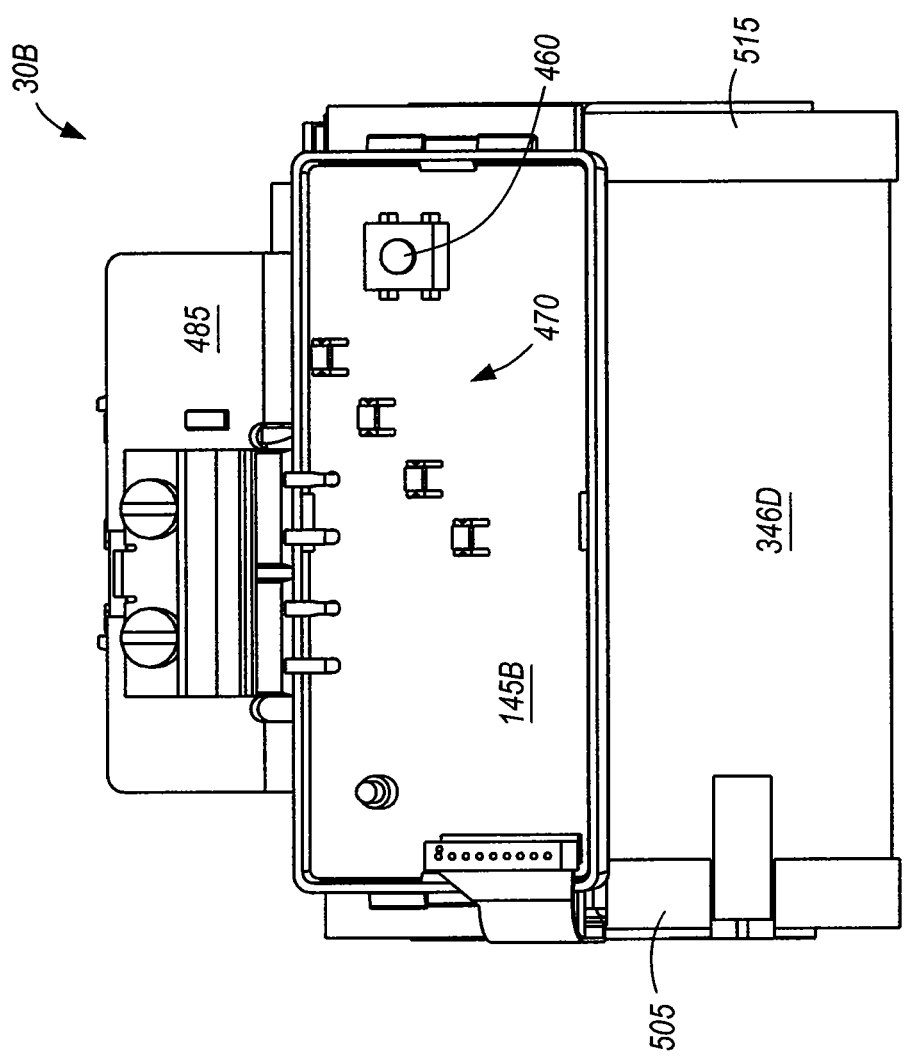
FIG. 62 is a front view of the portion of the battery pack shown in FIG. 58.
Figure 63:
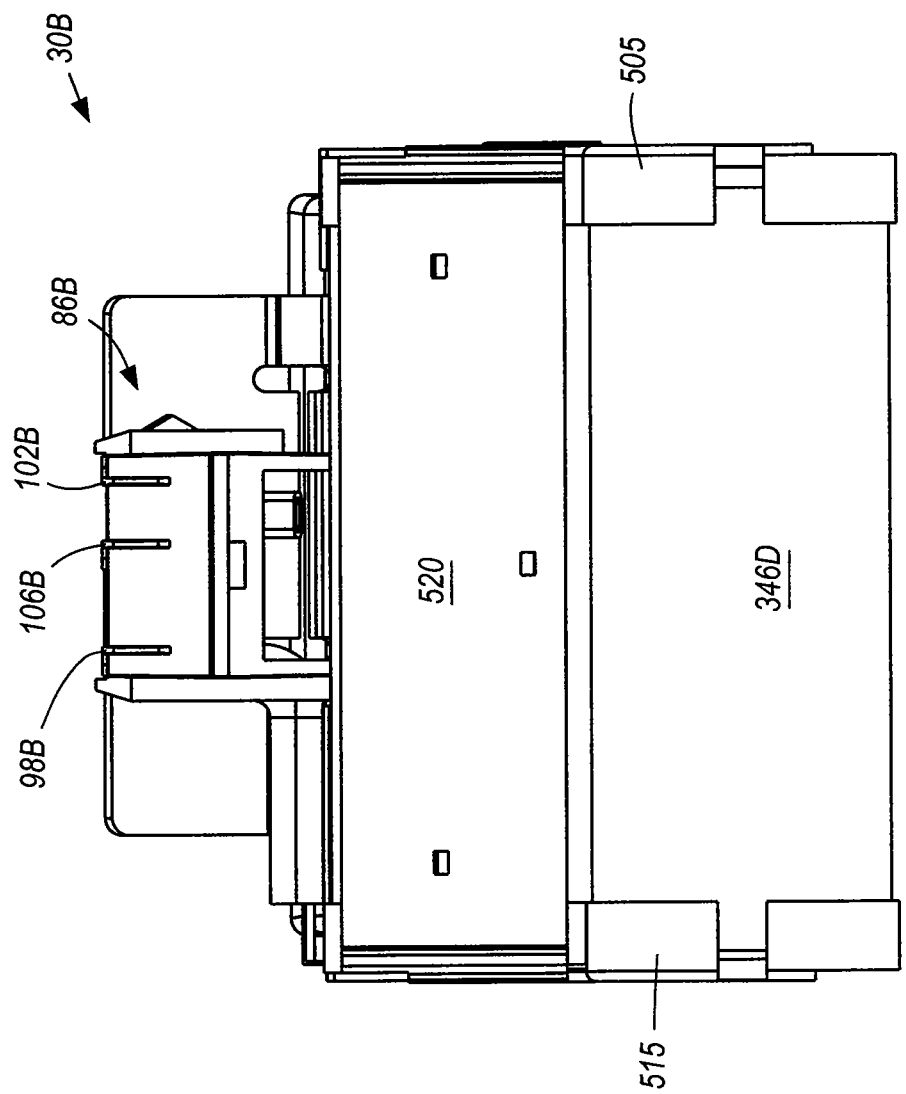
FIG. 63 is a rear view of the portion of the battery pack shown in FIG. 58.
Figure 64:
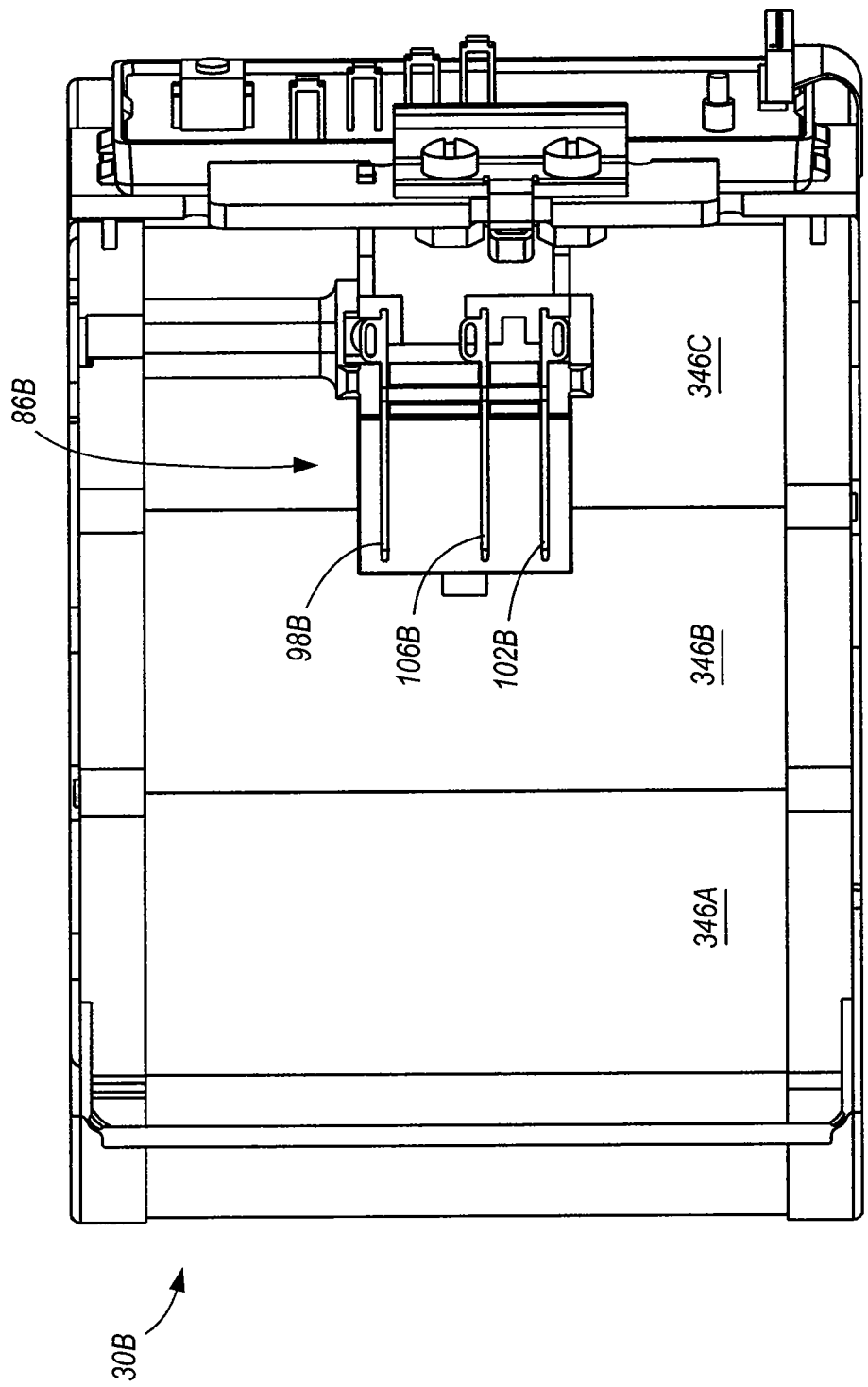
FIG. 64 is a top view of the portion of the battery pack shown in FIG. 58.
Figure 65:
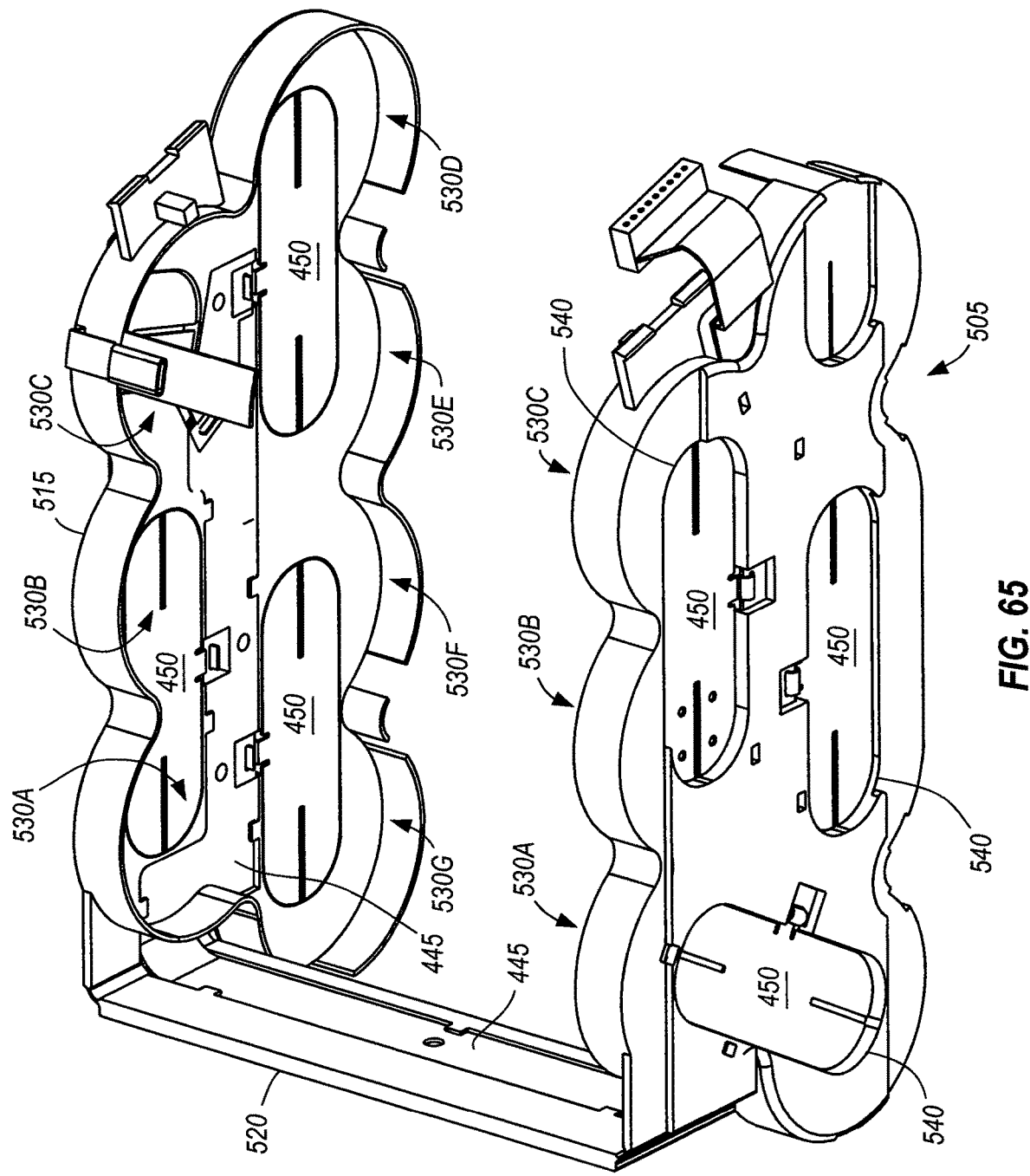
FIG. 65 is a perspective view of a portion of a battery pack and illustrating the end caps.

In some constructions, the battery pack 30, such as battery pack 30B, can include seven battery cells 346*a-g* (shown in FIG. 57). In some constructions, the battery cells 346*a-g* can be similar to battery cells 46*a-e* included in the battery pack 30. In some constructions, the battery cells 346*a-g* can differ from battery cells 46*a-e* in weight, size, nominal voltage, chemistry, and the like. For example, in one construction, the battery cells 346*a-g* can have a cell chemistry of Li-ion, such as, for example, Li—Mn spinel, Li—Mn nickel, or Li—Co. In some constructions, each cell 346*a-g* can have a nominal voltage of approximately 3.6 V. In other constructions, each cell 346*a-g* can have a nominal voltage of approximately 4 V, and in further constructions, each cell 346*a-g* can have a nominal voltage of approximately 4.2 V. In some constructions, the battery pack 30B can include seven battery cells 346*a-g*, and can have a nominal voltage of approximately 28 V. In other constructions, the battery pack 30B can include seven battery cells 346*a-g*, and can have a nominal voltage of approximately 25 V.

The battery cells 346*a-g* can also be electrically connected in any suitable manner, such as, for example, in a serial arrangement, a parallel arrangement, a partial serial arrangement (e.g., some of the battery cells 346*a-g* are connected in a serial arrangement), a partial parallel arrangement (e.g., some of the battery cells 346*a-g* are connected in a parallel arrangement), a combination of a serial, parallel, partial serial or partial parallel arrangement. In one construction, the battery cells 346*a-g* are electrically connected in a serial arrangement. The battery cells 346*a-g* can be electrically connected via conductive straps 450. For example, a conductive strap 450 can connect the negative end of the first battery cell 346*a* to the positive end of the second battery cell 346*b*. Also, another conductive strap 450 can connected the negative end of the second battery cell 346*b* to the positive end of the third battery cell 346*c*.

As shown in FIGS. 58-65, the battery pack 30, such as battery pack 30B, can also include an end cap arrangement 505. In some constructions, the end cap arrangement can be used for spacing the battery cells 346. The end cap arrangement 505 includes a first end cap 510 and a second end cap 515. The first and second end caps 510 and 515 can be connected by a connecting portion 520. In some constructions, the connecting portion 520 can be a hinge. In some constructions, the end cap arrangement 505 does not include the connecting portion 520. Each end cap 510 and 515 can partially define one or more cavities 530 (shown in FIG. 65). The end of a battery cell 346 can be positioned within a cavity 530. In the illustrated construction, the first end cap 510 and the second end cap 520 each include seven cavities 530*a-g* for positioning seven battery cells 346*a-g*, respectively.

In the illustrated construction, the first end cap 510 is positioned at a first end 490 (shown in FIG. 57) of the arrangement of battery cells 346, and the second end cap 515 is positioned at the second end 495 of the arrangement of battery cells 346. As mentioned previously, each end of each battery cell 346*a-g* can be positioned within the respective cavities 530*a-g* of the first and second end cap 510 and 515. Each end cap 510 and 515 can define the cavities 530*a-g* in order to create gaps or spaces between the battery cells 346 when the battery cells 346 are positioned within the cavities 530. This can allow for greater heat dissipation within the battery pack 30B by allowing air to circulate through the gaps and spaces between the cells 346.

In some constructions, the first end cap 510 and the second end cap 515 can further define apertures 450. The apertures 450 can receive the conductive straps 450 for electrically connecting one battery cell 346 to another battery cell 346.

In some constructions and in some aspects, the end cap arrangement 505 can also include a flexible circuit 445. In some constructions, the flexible circuit 445 can be integral with either the first end cap 510, the second end cap 515, the connecting portion 520, or a combination. In other constructions, the end cap arrangement 505 can define one or more areas for supporting the flexible circuit. In further constructions, the flexible circuit 445 can be secured to the end cap arrangement 505. As shown in the illustrated construction, the flexible circuit 445 can partially wrap around the battery cells 346.

In the construction shown, the end cap arrangement 505 can include a connector 560 for electrically connecting the flexible circuit 445 to the PCB 145B. In this construction, the PCB 145B and the flexible circuit 445 each can include a portion of the circuit 430 included in the battery pack 30B.

Figure 66:
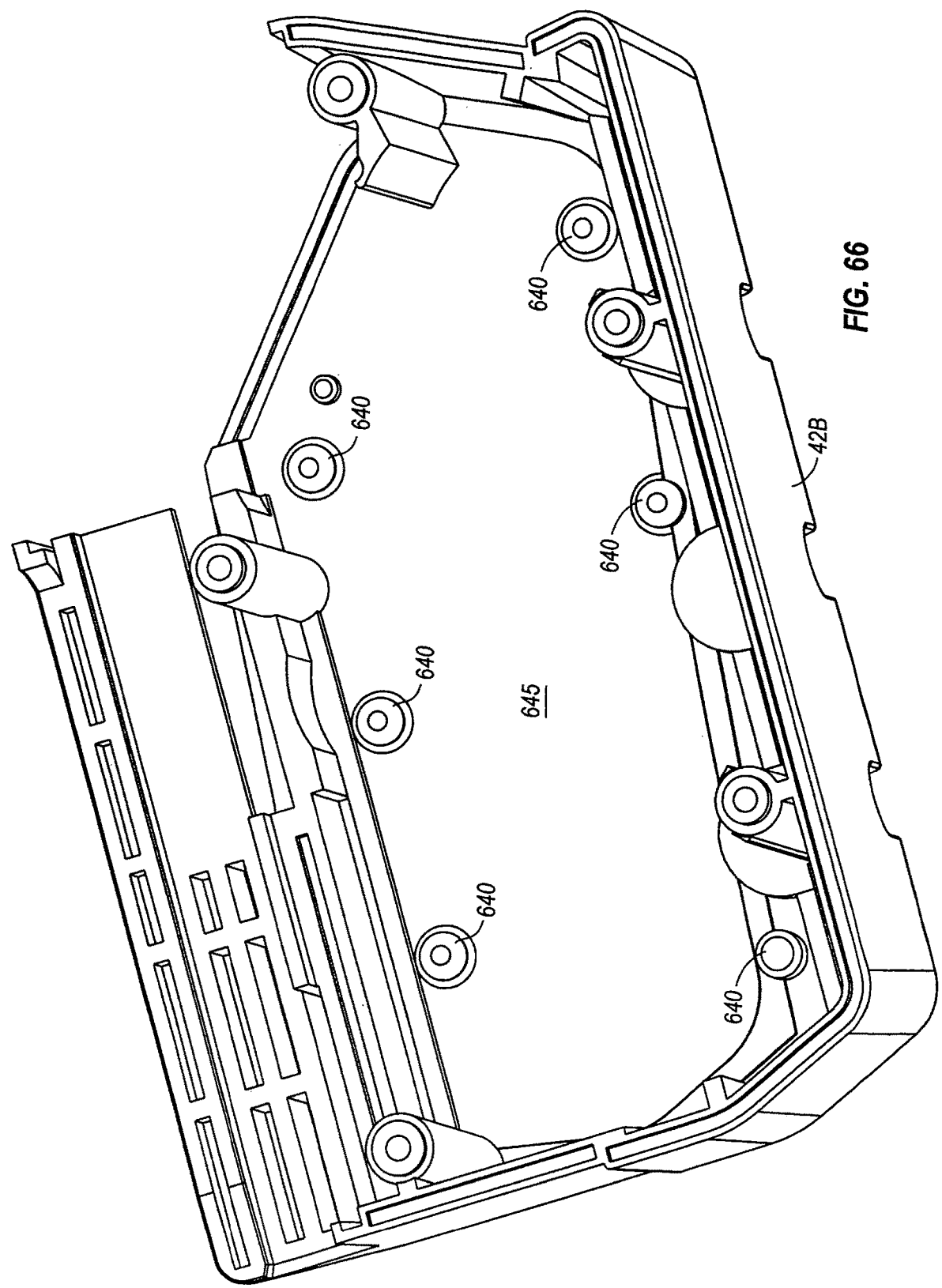
FIG. 66 is a partial side perspective view of a portion of the housing of a battery pack.
Figure 67:
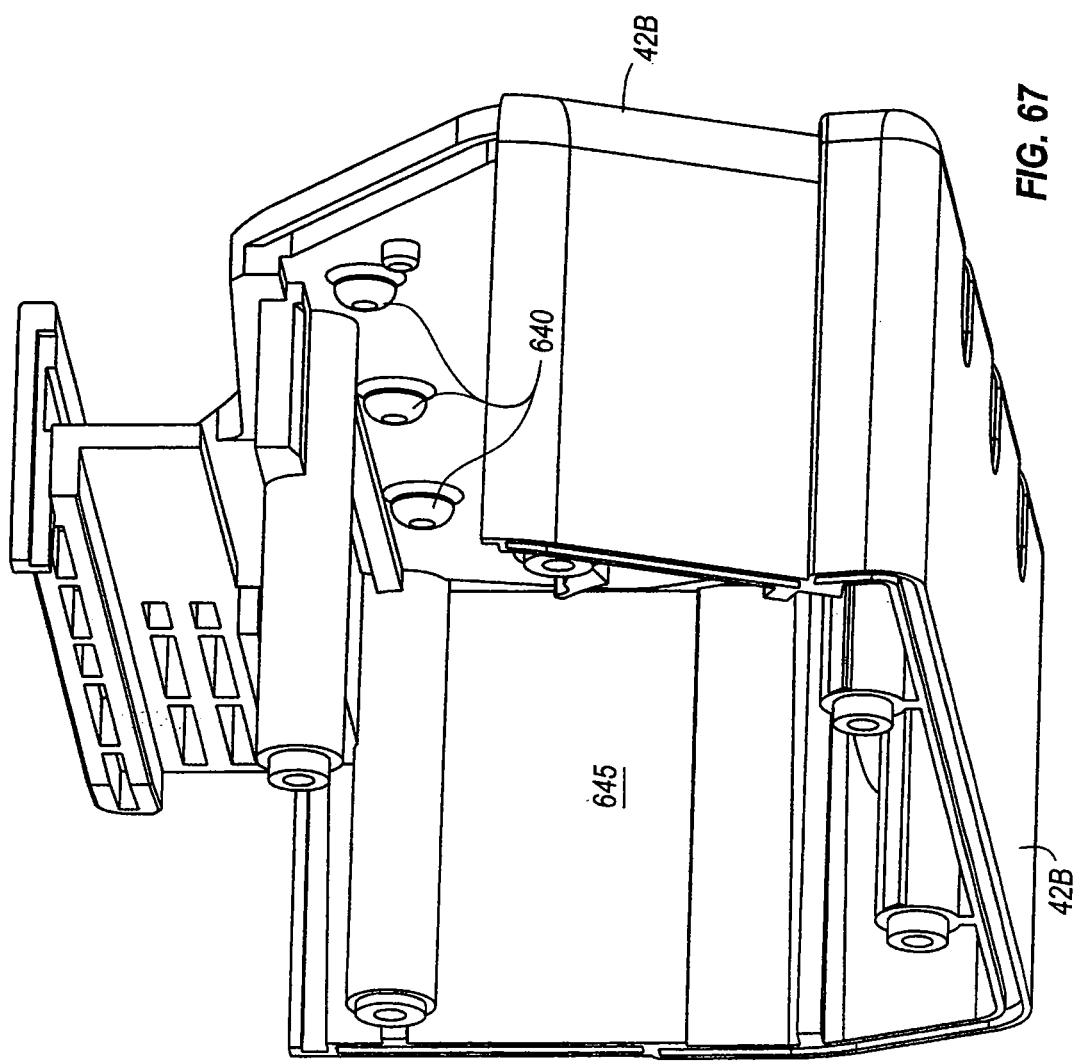
FIG. 67 is a partial front perspective view of the portion of the housing shown in FIG. 66.
Figure 68:
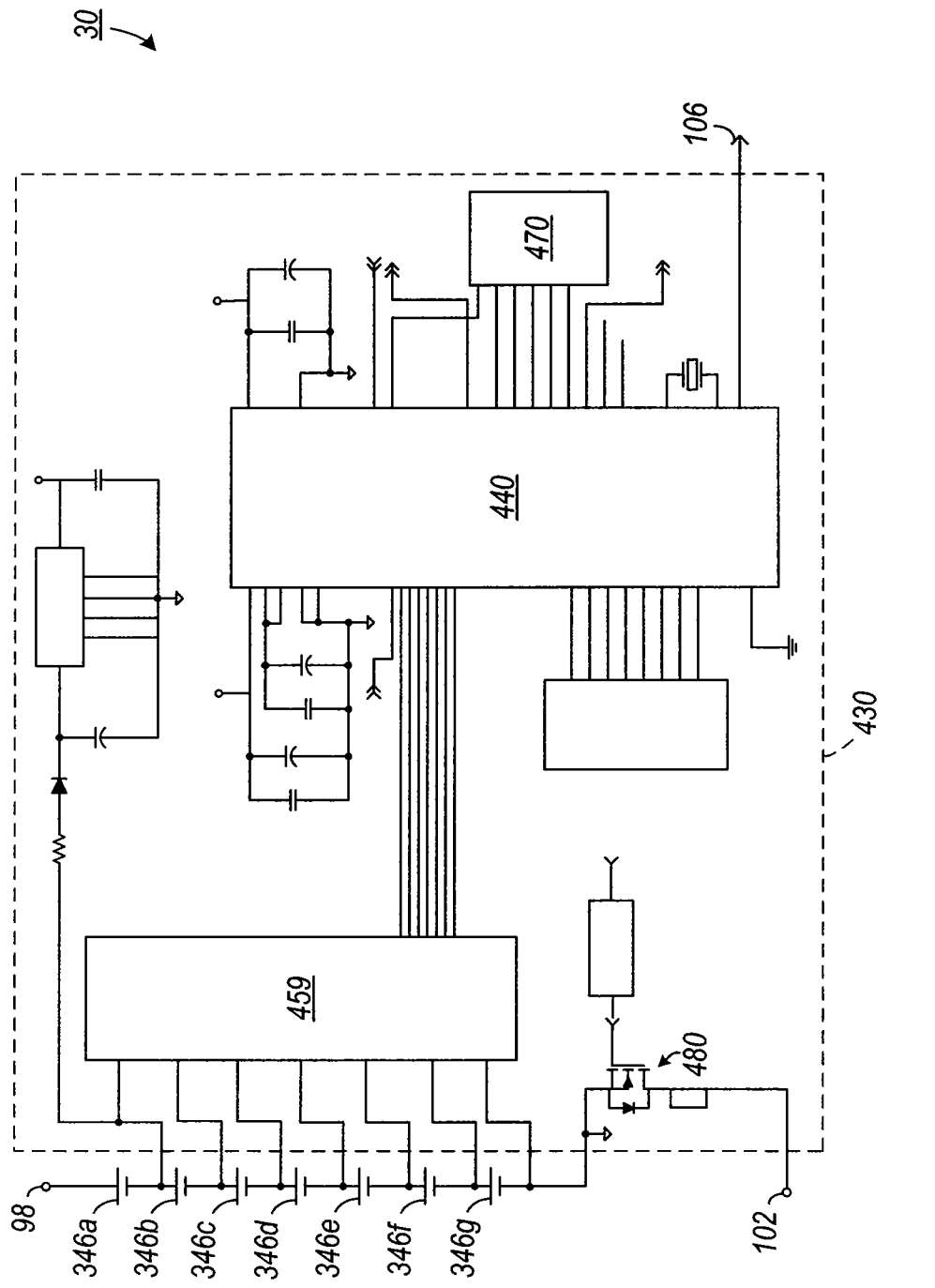
FIGS. 68-69 are still further schematic diagrams of components of a battery pack.
Figure 69:
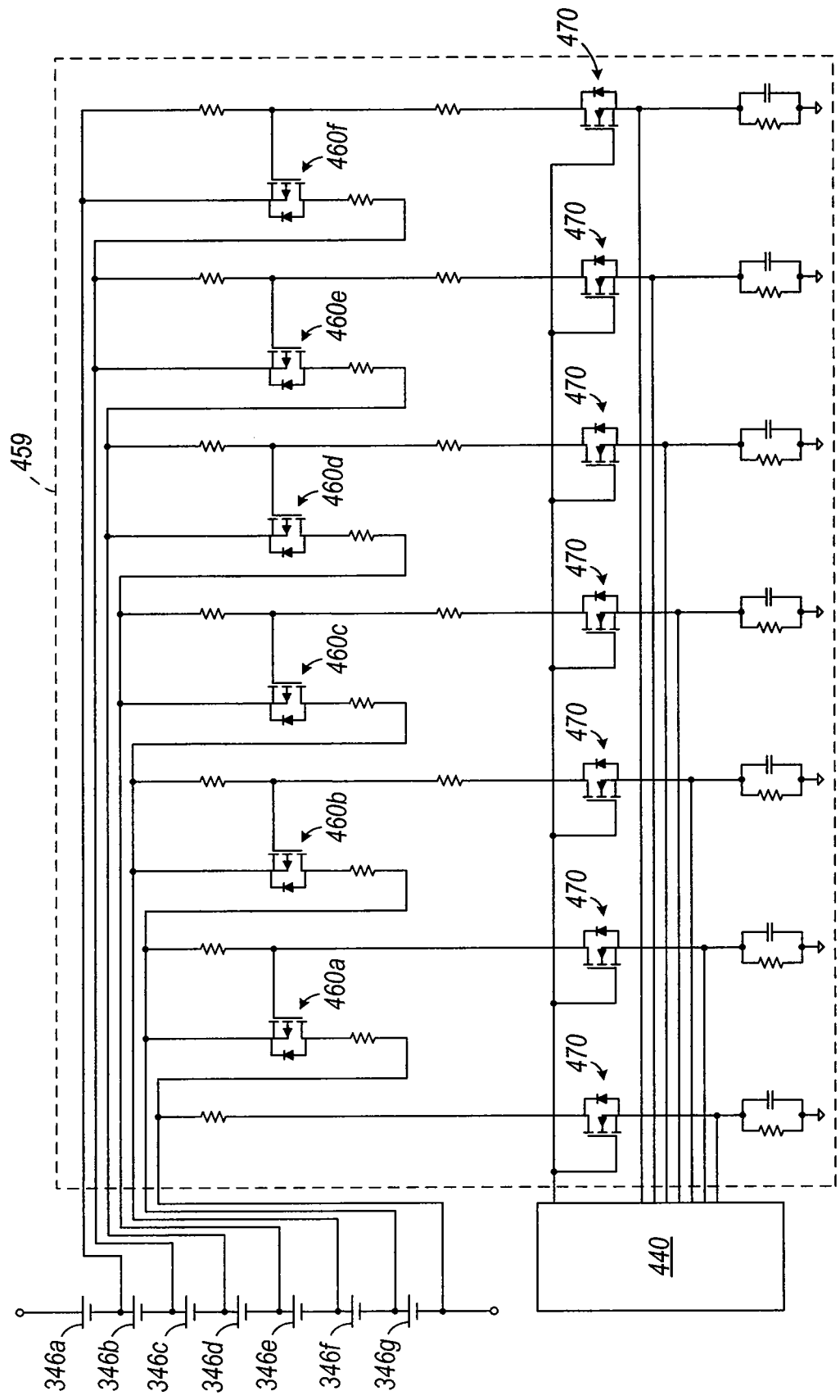

In some constructions and in some aspects, the battery pack 30 can include cushion members or "bumpers" 640. As shown in FIGS. 66 and 67, the interior face 645 of the battery housing 42B can include one or more cushion members 640. In some constructions, the cushion members 640 can be integral with the housing 42B. In other constructions, the cushion members 640 can be attached or secured to the interior face 645 of the housing 42B. In further constructions, the cushion members 640 can be connected to one or more battery cells 346 or to the end cap arrangement 505 partially surrounding the battery cells 346. In some constructions, the cushion members 645 can absorb energy during impact and protect the battery cells 346 during impact by limiting the amount of energy transferred to the cells 346. The cushion members 645 can include any thermoplastic rubber such as, for example, polypropylene RPT 100 FRHI (e.g., flame retardant-high impact).

Figure 72:
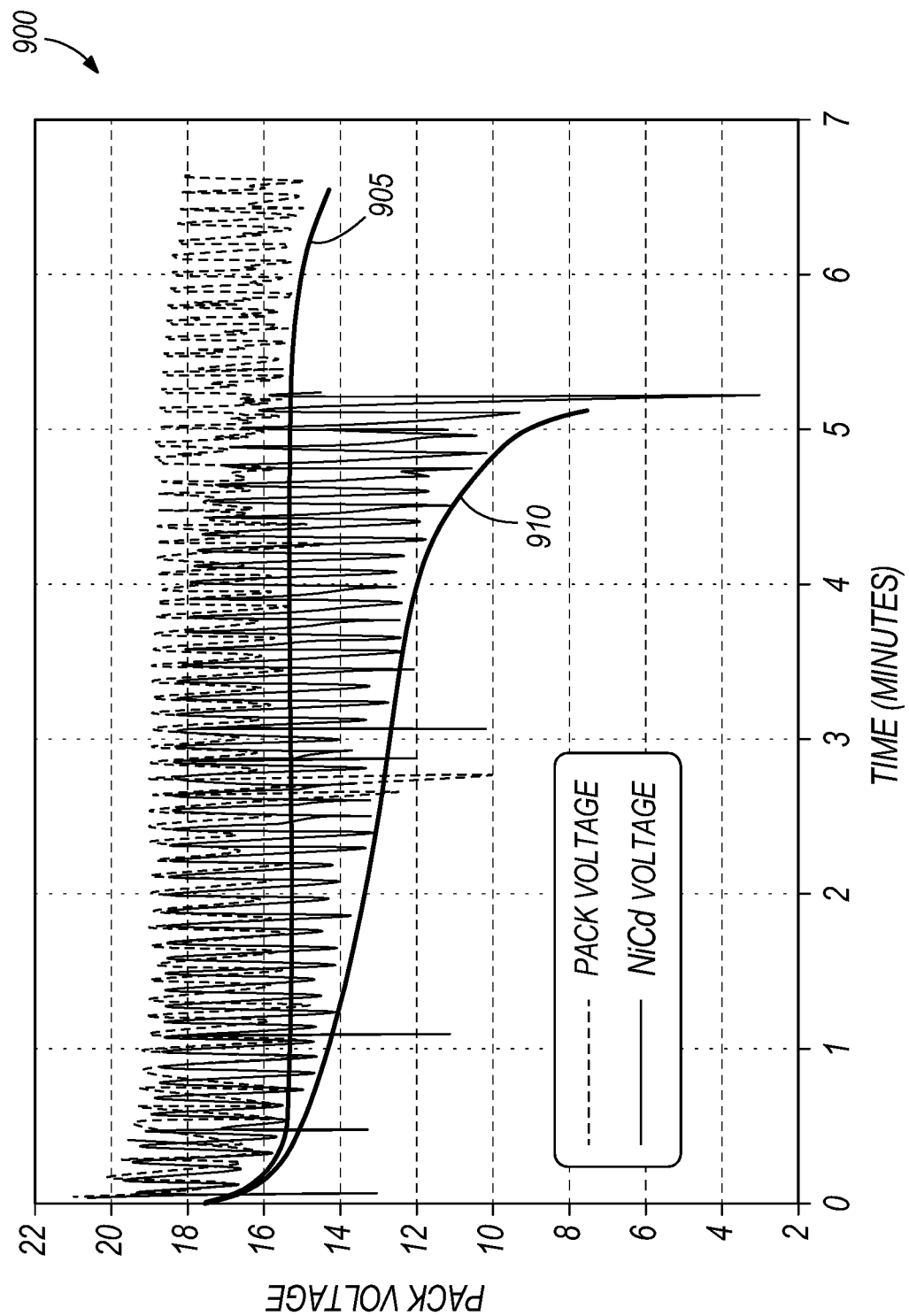
FIG. 72 is a graph illustrating the performance of two battery packs during discharge.

FIG. 72 depicts a graph 900 illustrating the performance of two battery packs during a cutting test. The test includes continuous cross cutting of 2"×21" pine with a cordless circular saw. In this construction, a first battery pack (not shown) includes five (5) Li—Mn Spinel battery cells, each having a 4.0 V nominal voltage and a 3 Ah capacity. Also in this construction, a second battery pack (not shown) includes fifteen (15) NiCd battery cells, each having a 1.2 V nominal voltage and a 2.4 Ah capacity. In this construction, the first battery pack is capable of approximately 40% more work and weighs approximately 35% less than the second battery pack. The graph 900 illustrates the pack voltage for each battery pack. The first curve 905 illustrates the voltage for the first battery pack. The second curve 910 illustrates the voltage for the second battery pack. As shown from the graph 900, the voltage 905 of the first battery pack remains steady and flat longer than the voltage 910 of the second battery pack. Thus, the first battery pack, which includes Li-ion cells, is able to maintain its voltage during discharge, as opposed to the second battery pack, which includes NiCd cells.

One or more independent features or independent advantages of the invention will be set forth in the claims.

What is claimed is:

1. An electrical combination comprising:
   a power tool including power tool terminals;
   a battery pack configured to be interfaced with the power tool, the battery pack including
      a battery pack housing,
      at least three terminals including a positive terminal, a negative terminal, and a sense terminal, the at least three terminals configured to be interfaced with corresponding terminals of the power tool, and
      a plurality of rechargeable battery cells arranged within and supported by the housing, each of the battery cells having a respective state of charge, power being transferable between the battery cells and the power tool;
   a balancing circuit configured to detect a charge imbalance among the battery cells based on a plurality of voltages of the plurality of rechargeable battery cells detected at substantially the same time; and
   a control circuit configured to initiate a controlled discharging process to discharge at least one of the battery cells whose present state of charge is high relative to a present state of charge of another of the battery cells, the control circuit including a microprocessor.

2. The electrical combination of claim 1, wherein the microprocessor is configured to detect voltages of the battery cells throughout the controlled discharging process.

3. The electrical combination of claim 1, wherein the microprocessor is configured to end the controlled discharging process when a present state of charge of the at least one of the battery cells is approximately equal to a present state of charge of the other of the battery cells.

4. The electrical combination of claim 1, wherein the balancing circuit includes a plurality of resistors or a plurality of transistors.

5. The electrical combination of claim 1, wherein the control circuit is further configured to identify a battery cell among the plurality of battery cells that is imbalanced.

6. The electrical combination of claim 5, wherein the identified battery cell is a low voltage cell.

7. The electrical combination of claim 1, wherein the battery pack is configured to balance the battery cells when the battery pack is in a discharging operation.

8. The electrical combination of claim 1, wherein the microprocessor is configured to disable the battery pack via a switch when a balanced ratio between the battery cells falls outside a predetermined range.

9. The electrical combination of claim 8, wherein the microprocessor is configured to interrupt operation of the battery pack when the balanced ratio between the battery cells falls outside the predetermined range.

10. A method of operating a battery pack configured to be interfaced with a power tool including power tool terminals, the battery pack including a battery pack housing, at least three terminals including a positive terminal, a negative terminal, and a sense terminal, the at least three terminals configured to be interfaced with corresponding terminals of the power tool, and a plurality of rechargeable battery cells arranged within and supported by the housing, each of the battery cells having a respective state of charge, power being transferable between the battery cells and the power tool, the method comprising:
    detecting, with a balancing circuit, a charge imbalance among the battery cells based on a plurality of voltages of the plurality of rechargeable battery cells detected at substantially the same time; and
    initiating, with a control circuit, a controlled discharging process to discharge at least one of the battery cells whose present state of charge is high relative to a present state of charge of another of the battery cells, the control circuit including a microprocessor.

11. The method of claim 10, further comprising detecting, with the microprocessor, voltages of the battery cells throughout the controlled discharging process.

12. The method of claim 10, further comprising ending, with the microcontroller, the controlled discharging process when a present state of charge of the at least one of the battery cells is approximately equal to a present state of charge of the other of the battery cells.

13. The method of claim 10, wherein the balancing circuit includes a plurality of resistors or a plurality of transistors.

14. The method of claim 10, further comprising identifying, with the control circuit, a battery cell among the plurality of battery cells that is imbalanced.

15. The method of claim 14, wherein the identified battery cell is a low voltage cell.

16. The method of claim 10, further comprising balancing the battery cells when the battery pack is in a discharging operation.

17. The method of claim 10, further comprising disabling, with the microprocessor, the battery pack via a switch when a balanced ratio between the battery cells falls outside a predetermined range.

18. The method of claim 17, further comprising interrupting, with the microprocessor, operation of the battery pack when the balanced ratio between the battery cells falls outside the predetermined range.

* * * * *